(12) United States Patent
Hwang

(10) Patent No.: US 7,889,188 B2
(45) Date of Patent: Feb. 15, 2011

(54) FLAT PANEL DISPLAY AND METHOD OF CONTROLLING PICTURE QUALITY THEREOF

(75) Inventor: Jong Hee Hwang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 860 days.

(21) Appl. No.: 11/819,751

(22) Filed: Jun. 28, 2007

(65) Prior Publication Data

US 2008/0036797 A1 Feb. 14, 2008

(30) Foreign Application Priority Data

Jun. 29, 2006 (KR) ...................... 10-2006-0059330

(51) Int. Cl.
*G09G 5/00* (2006.01)
(52) U.S. Cl. ...................... 345/204; 345/63; 345/72; 345/77; 345/78; 345/89; 345/83; 345/690; 349/192; 348/246
(58) Field of Classification Search ........... 345/87–103, 345/204, 205, 690, 698, 60, 63, 72, 76–78, 345/82–83; 348/180, 184, 185, 246–247; 349/192; 382/141, 149
See application file for complete search history.

(56) References Cited

U.S. PATENT DOCUMENTS

| | | | | |
|---|---|---|---|---|
| 7,786,971 B2 * | 8/2010 | Chung et al. | ................. | 345/98 |
| 7,791,572 B2 * | 9/2010 | Hwang | ................. | 345/87 |
| 2005/0219390 A1 * | 10/2005 | Tajima et al. | ................. | 348/246 |
| 2006/0092329 A1 * | 5/2006 | Noji | ................. | 348/607 |
| 2006/0244476 A1 * | 11/2006 | Zhang et al. | ................. | 324/770 |
| 2007/0165119 A1 * | 7/2007 | Ikeda | ................. | 348/246 |
| 2007/0182441 A1 * | 8/2007 | Hwang | ................. | 324/770 |
| 2007/0182914 A1 * | 8/2007 | Hwang | ................. | 349/192 |
| 2007/0229420 A1 * | 10/2007 | Hwang | ................. | 345/87 |
| 2008/0001869 A1 * | 1/2008 | Chung et al. | ................. | 345/87 |
| 2008/0068324 A1 * | 3/2008 | Chung et al. | ................. | 345/98 |

FOREIGN PATENT DOCUMENTS

| | | | |
|---|---|---|---|
| JP | 2003-066924 | * | 8/2001 |
| JP | 2004-198875 | * | 7/2004 |
| JP | 2004-279482 | * | 10/2004 |
| JP | 2005348176 | * | 12/2005 |

* cited by examiner

*Primary Examiner*—Lun-Yi Lao
(74) *Attorney, Agent, or Firm*—Morgan, Lewis & Bockius LLP

(57) ABSTRACT

This invention relates to a flat panel display device that is adaptive for perfectly compensating a panel defect by performing an electrical compensation on pixels in a panel defect location, and a method of controlling a picture quality thereof. A flat panel display device according to an embodiment of the present invention includes a display panel which has a non-defect area and a panel defect area; a memory which stores a first compensation, a second compensation data, a third compensation data, a fourth compensation data, and a fifth compensation data; a compensation part; and a driver for driving the display panel in use of the data modulated by the compensation part.

42 Claims, 75 Drawing Sheets

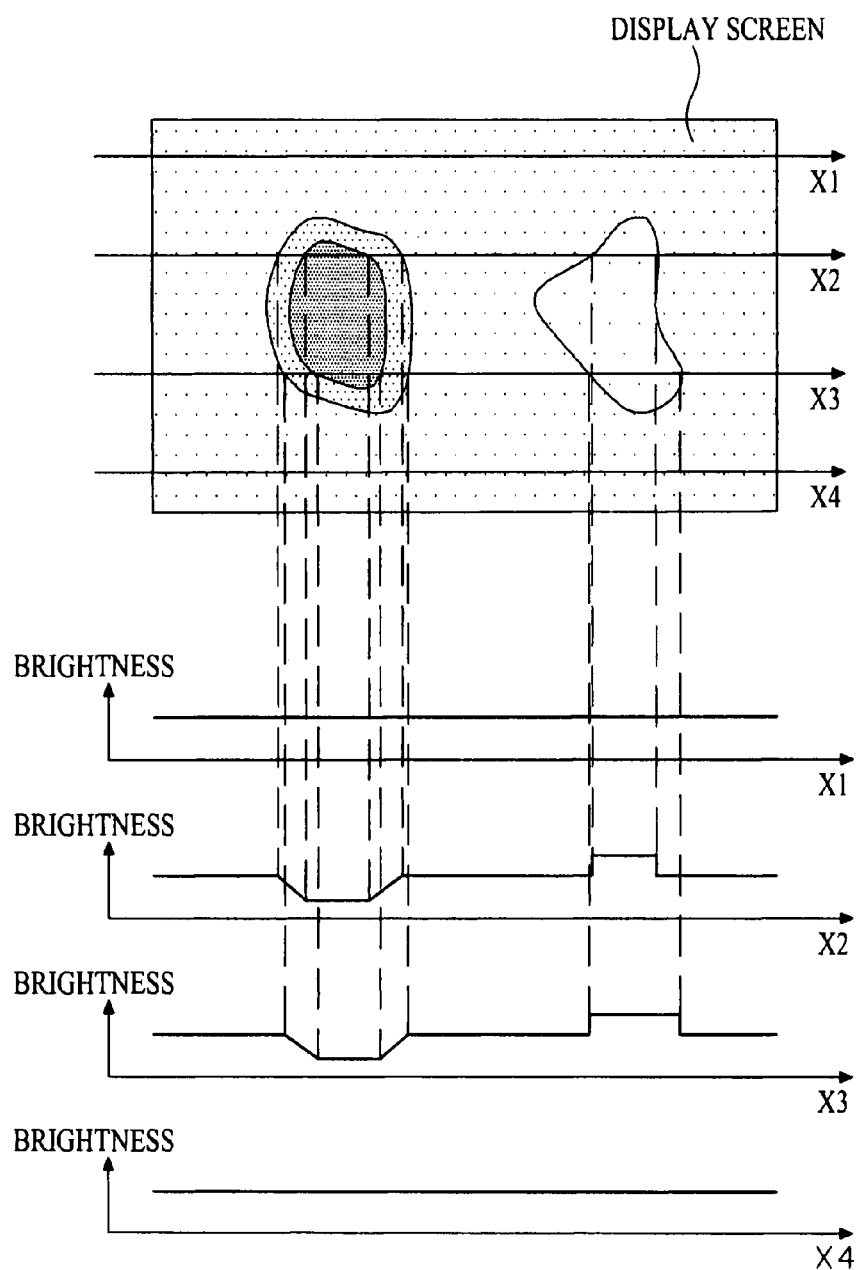

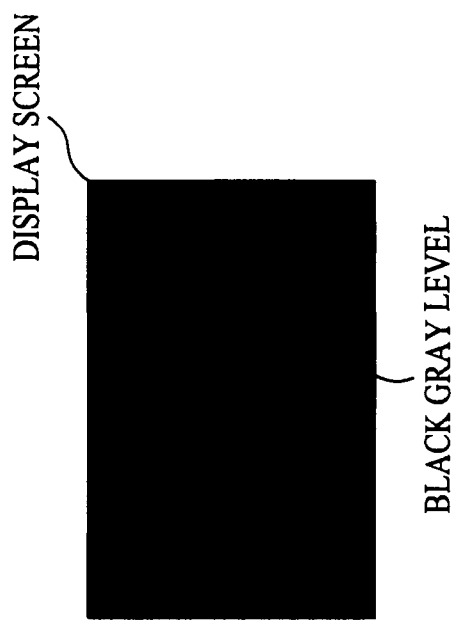

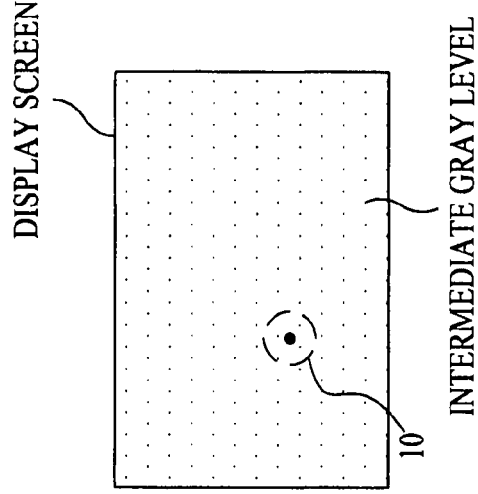

FIG.16A
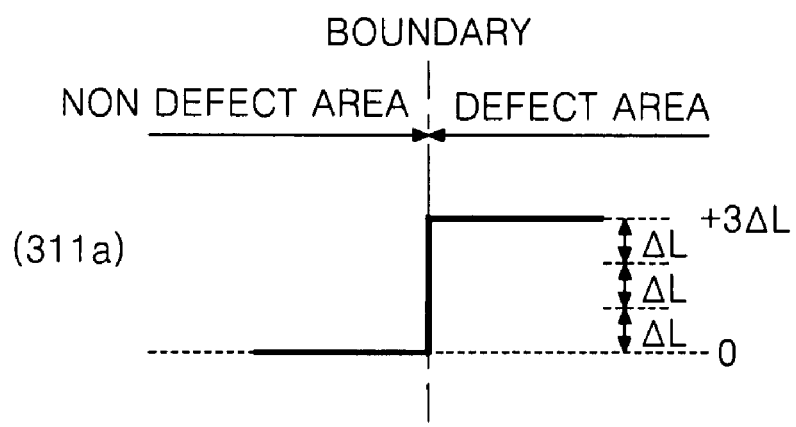
(311a)
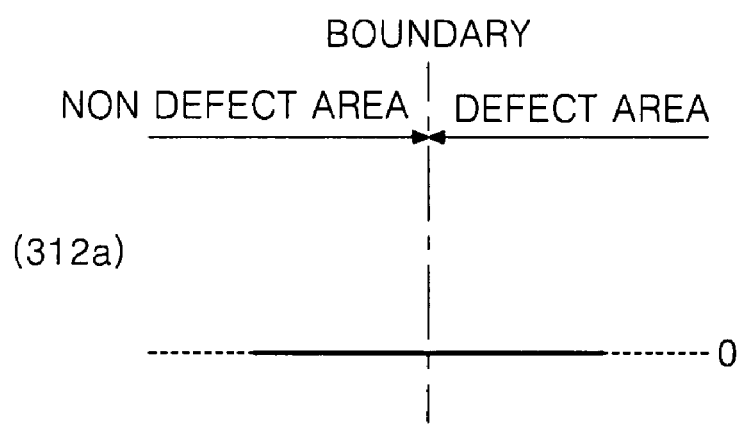
(312a)
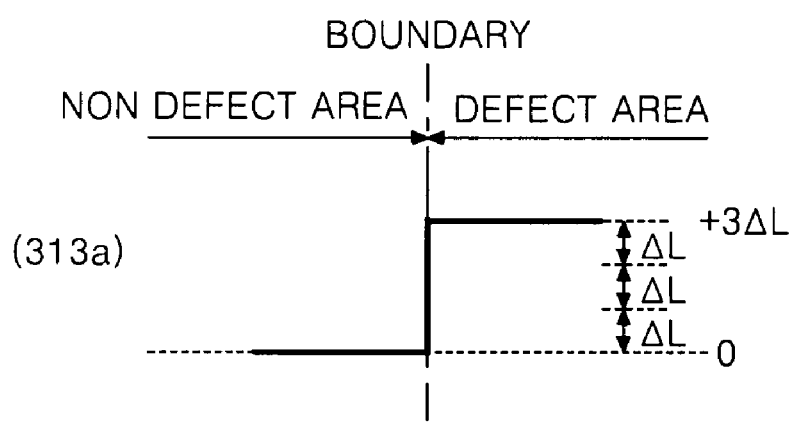
(313a)

FIG.16B
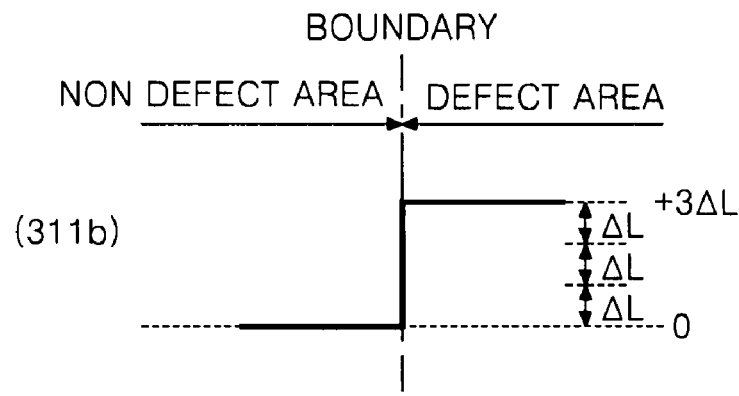
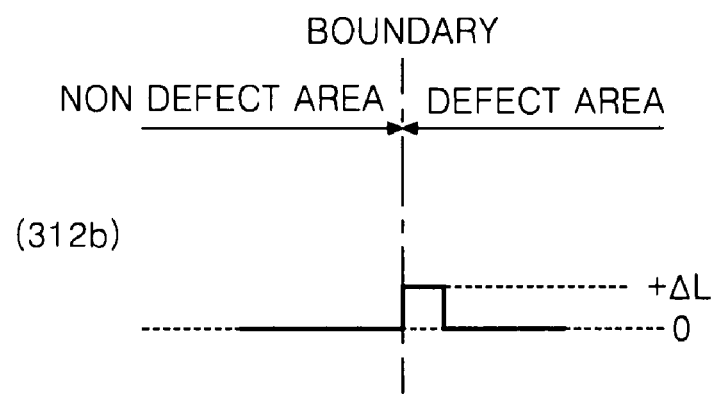
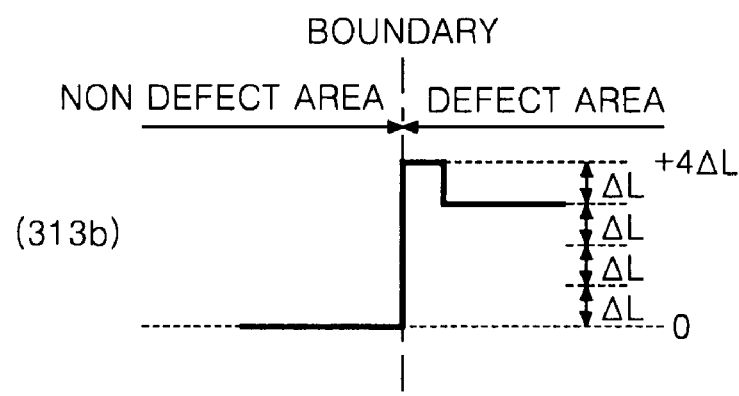

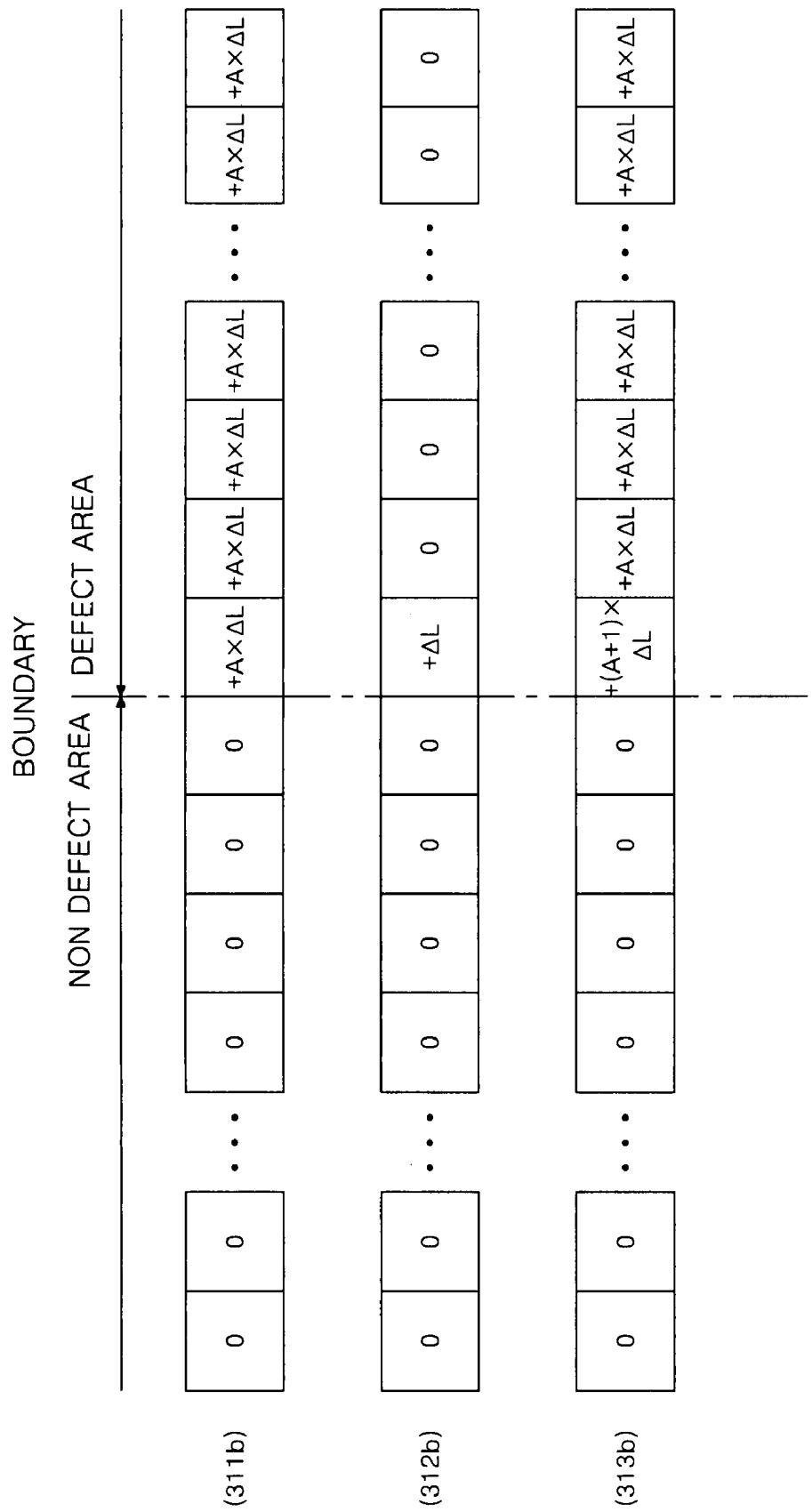

FIG.17A
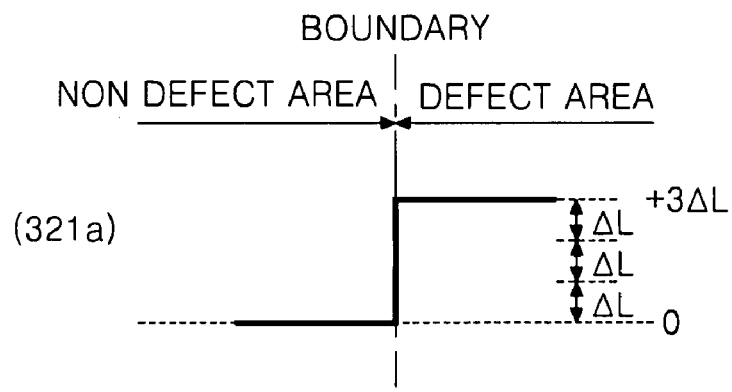
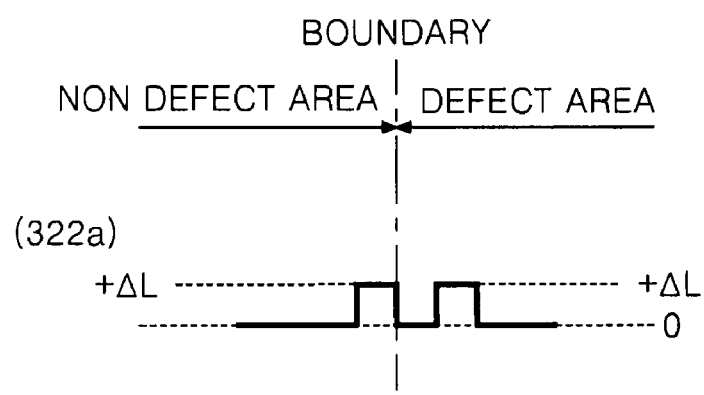
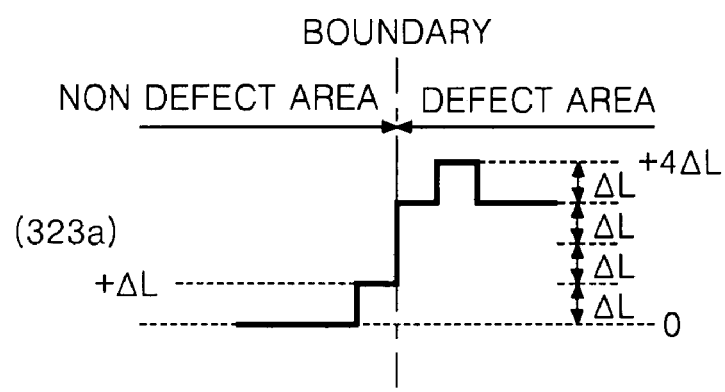

FIG.17B
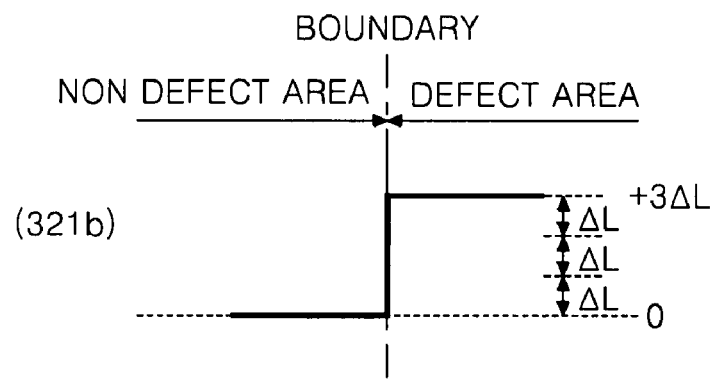
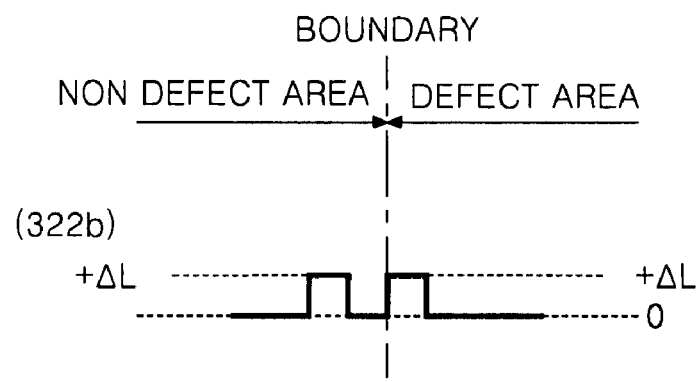
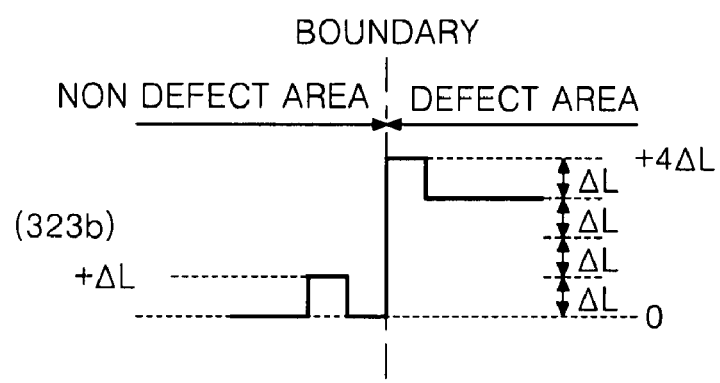

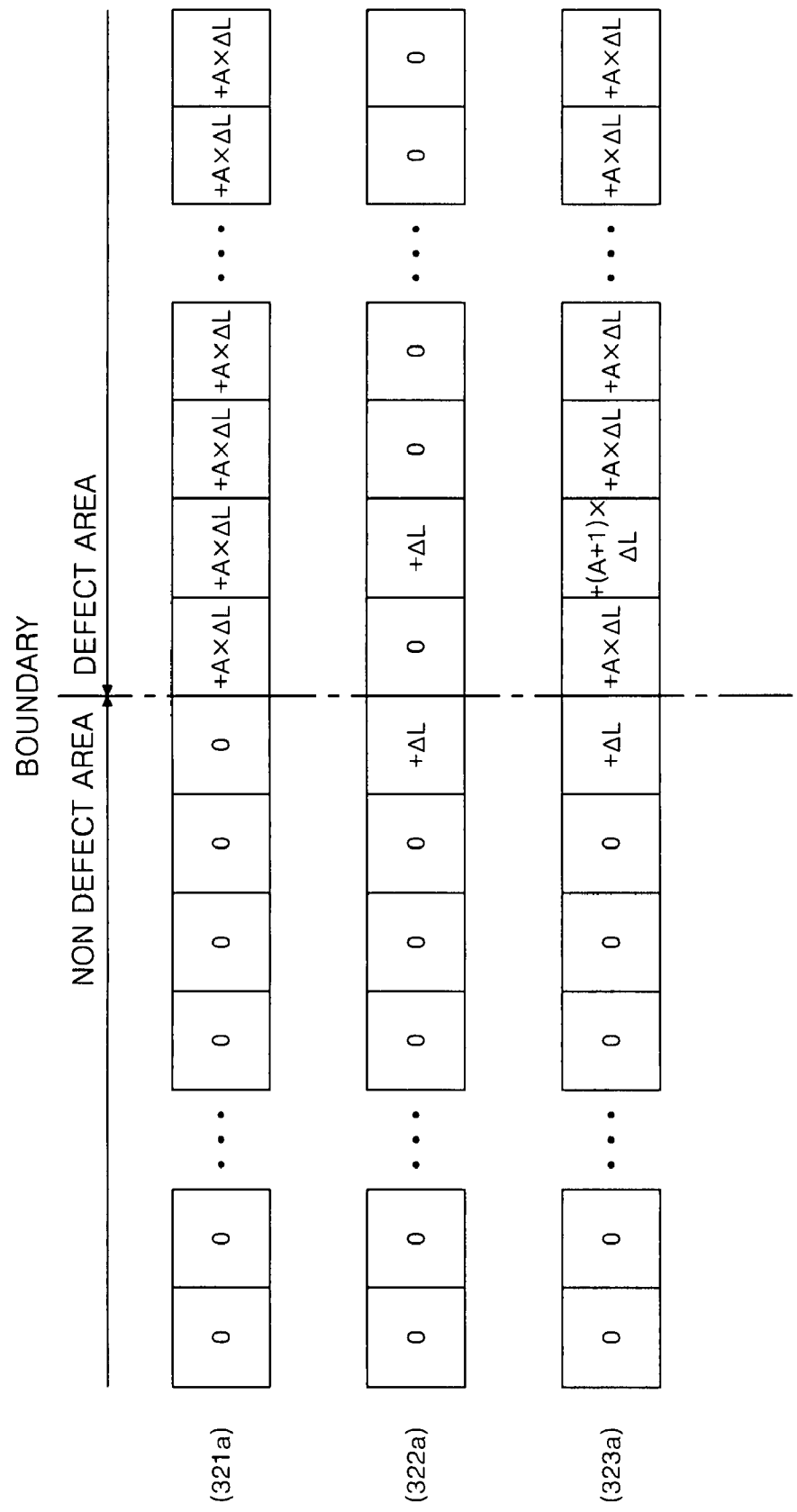

FIG.18B
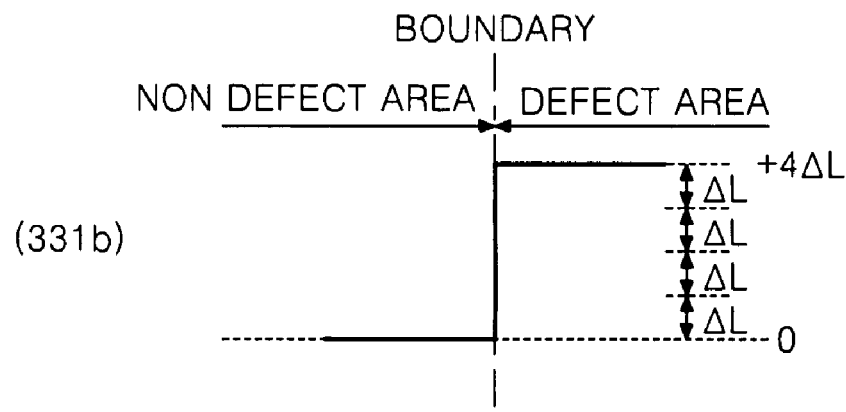
(331b)
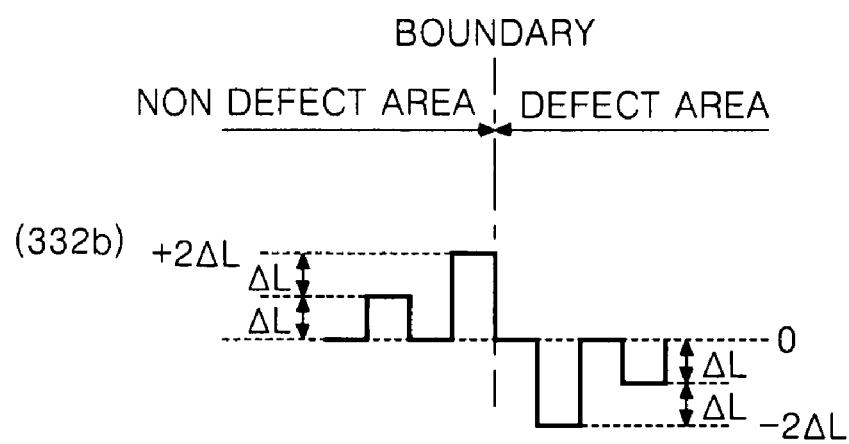
(332b)
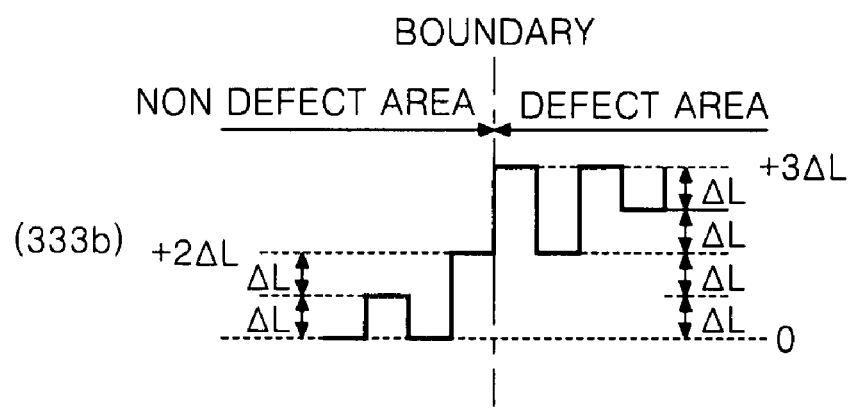
(333b)

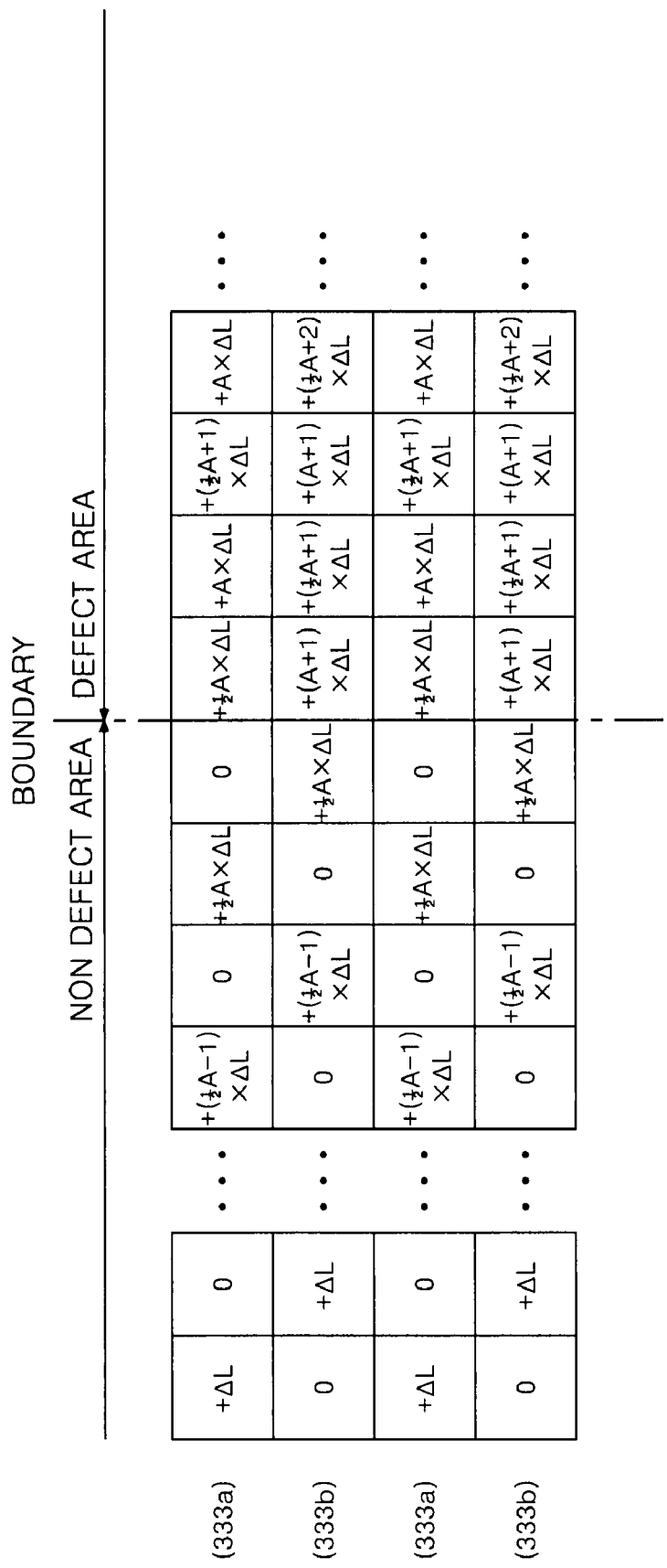

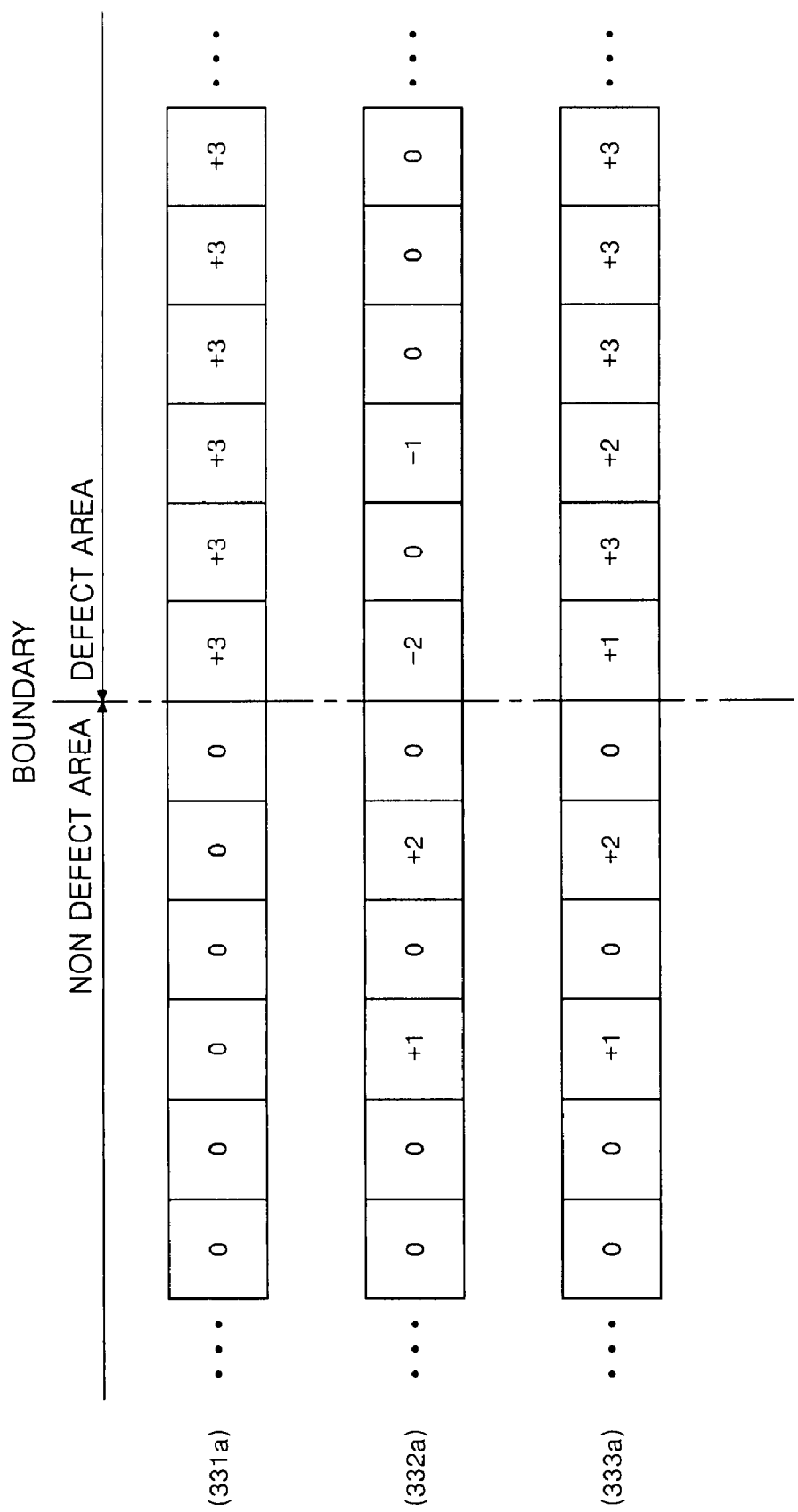

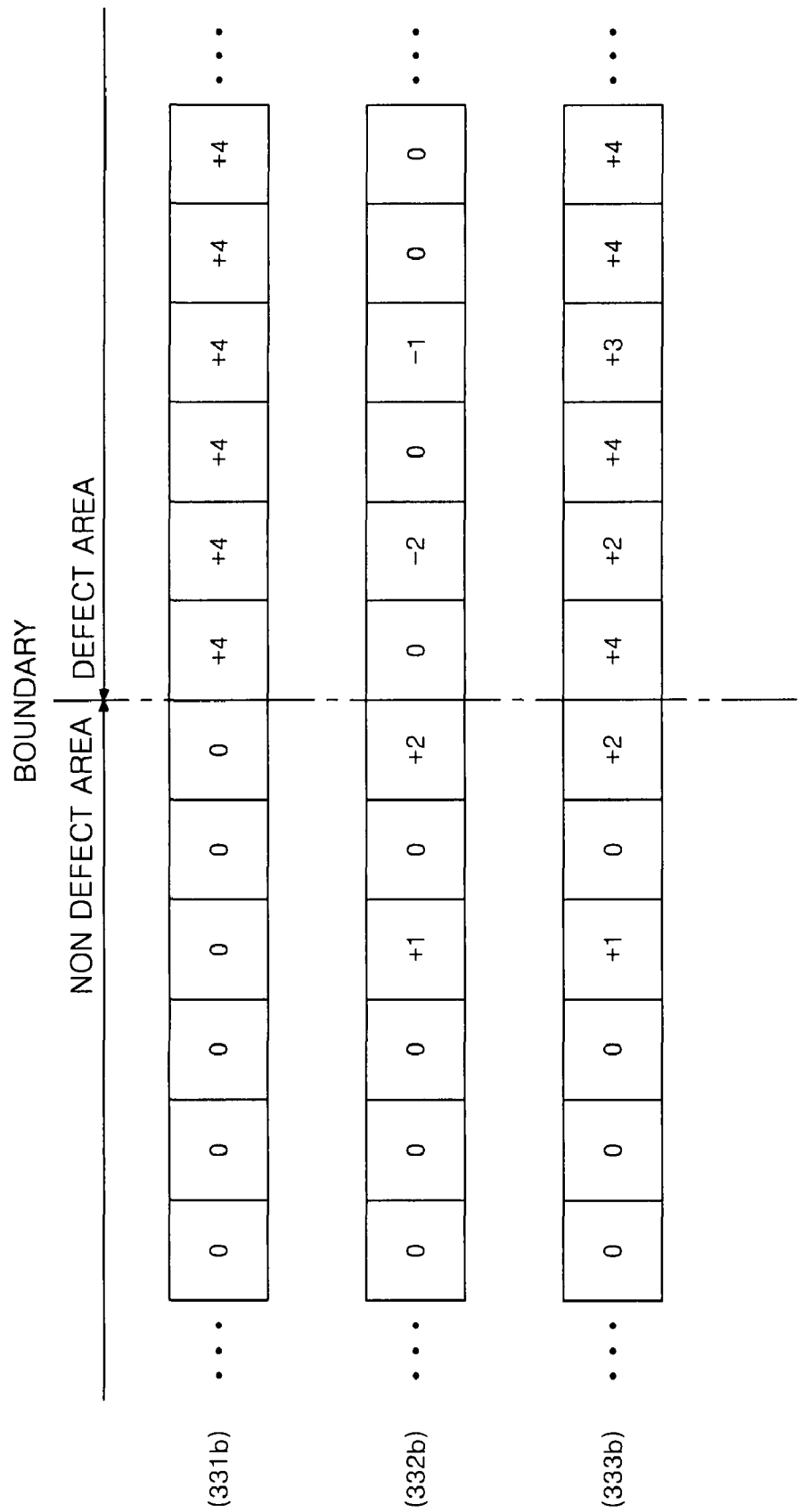

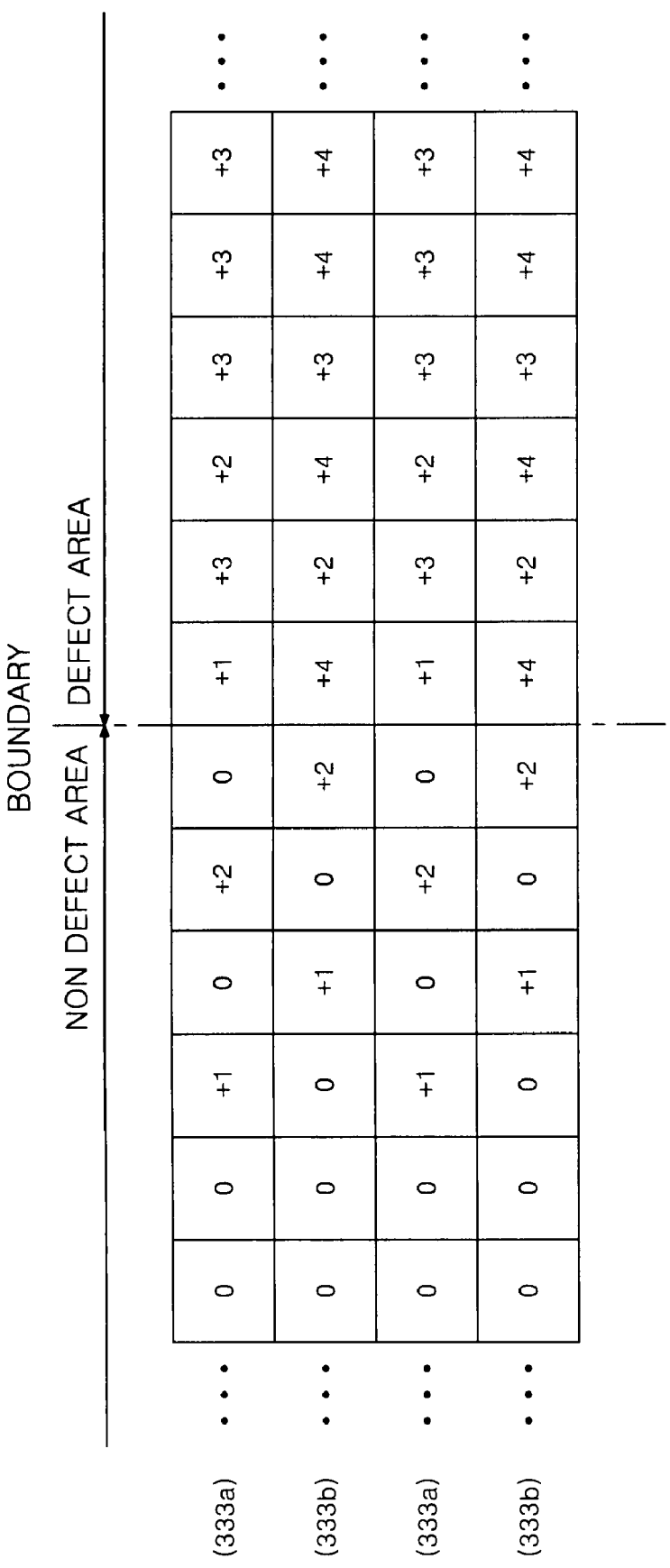

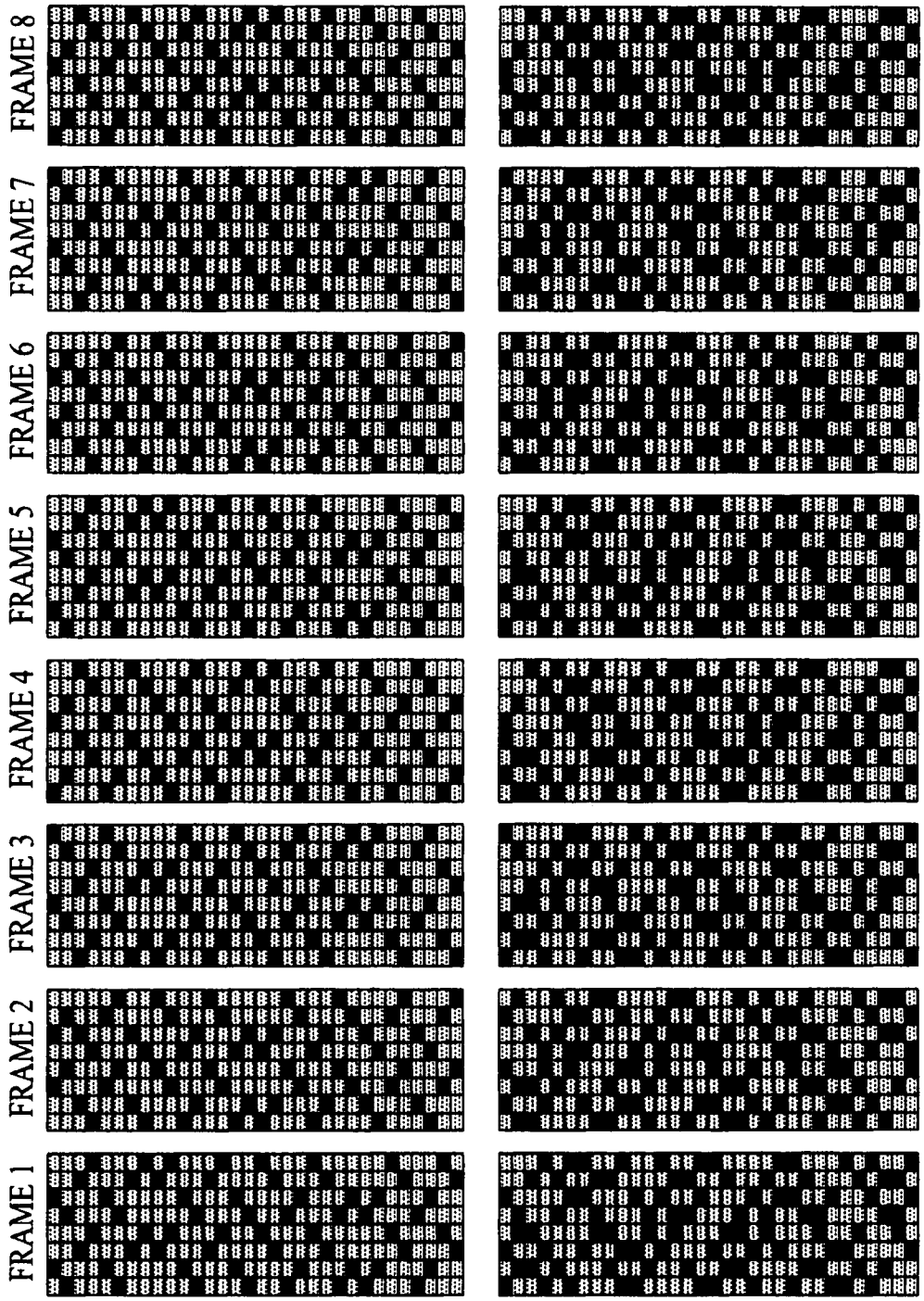

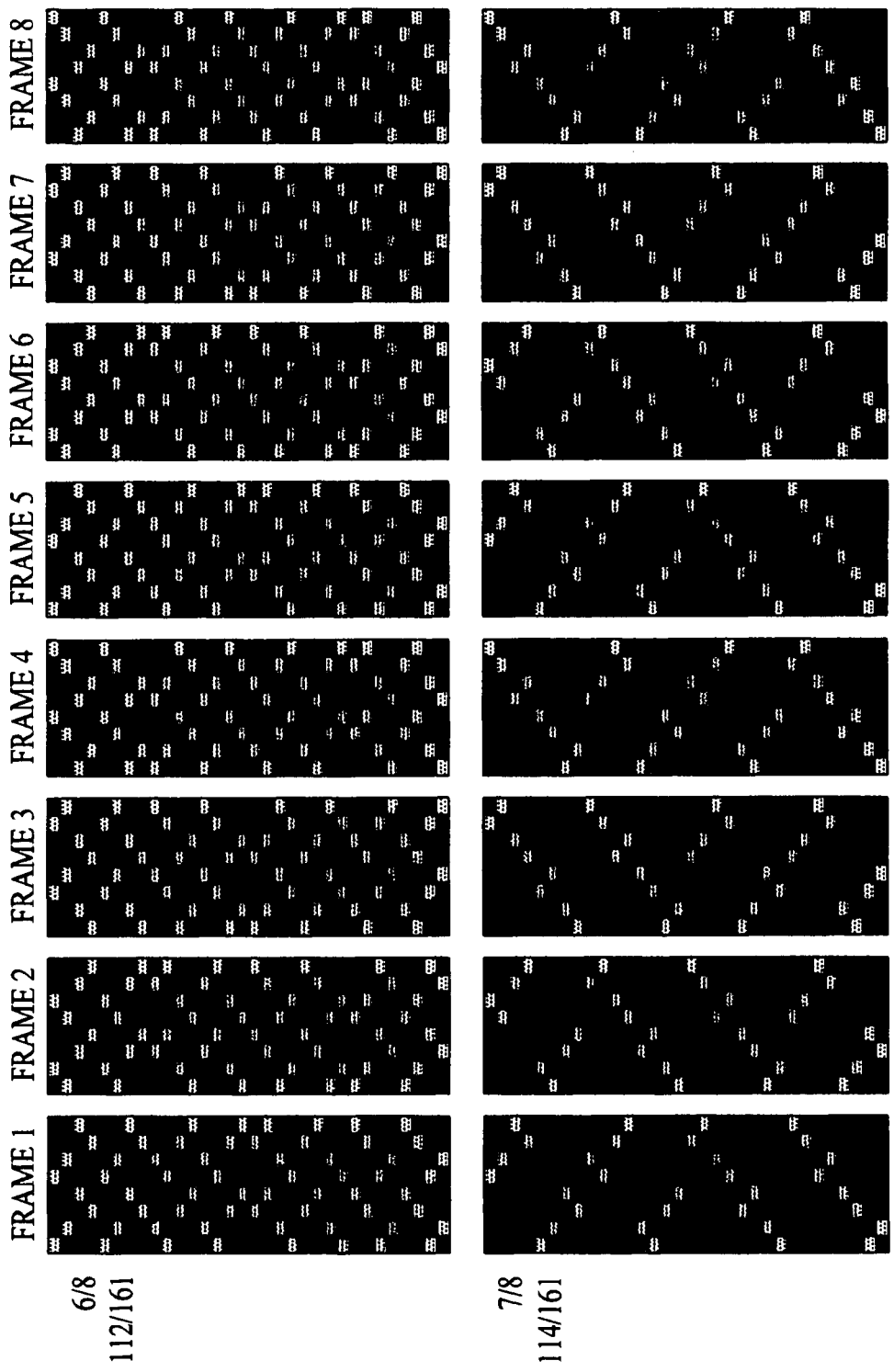

151: Frame Number Sensing Part
153: Compensation Value Judging Part
154: Operator 172: Pixel Location Sensing Part
173: Compensation Value Judging Part
174: Operator 191: Frame number Sensing Part
192: Pixel Location Sensing Part
193: Compensation Value Judging Part
194: Operator

FLAT PANEL DISPLAY AND METHOD OF CONTROLLING PICTURE QUALITY THEREOF

This application claims the benefit of the Korean Patent Application No. P2006-059330 filed on Jun. 29, 2006, which is hereby incorporated by reference.

BACKGROUND OF THE INVENTION

1. Field of the Invention

The present invention relates to a flat panel display device, and more particularly to a flat panel display device that is adaptive for optimizing data to be displayed in a panel defect area, in used of a compensation value of a compensation circuit as well as compensating a panel defect by a repair process, and a method of controlling a picture quality thereof.

2. Description of the Related Art

Recently, there has been paid attention to various flat panel display devices which can reduce their weight and size that are a disadvantage of a cathode ray tube. The flat panel display devices include a liquid crystal display device, a field emission display device, a plasma display panel, an organic light emitting diode and the like.

The flat panel display device includes a display panel for displaying a picture, and there might be a case that a picture quality defect is found in a test process of the display panel.

The cause of the picture quality defect occurring in the test process of the display panel results from a defect in a process, and the picture quality defect is generated because there is a defect in the display panel. The panel defect can be, for example, an exposure deviation in an overlapping exposure process, a lens aberration of an exposure device and the like. The panel defect caused by the process deviation might be generated in a fixed form such as dot, line, belt, circle, polygon and the like or in an indeterminate form, as shown in FIGS. 1 to 5.

In order to recover the panel defect, a repair process inclusive of a thin film forming process, a patterning process and the like is carried out, but even though the repair process is carried out, there is a limitation on the recover of the panel defect. And, the panel is disposed as a waste in case that the panel defect is heavy. Further, in most cases, the brightness or chromaticity of an area where there was the panel defect is shown differently from that of a non-defect area even though the repair process was carried out.

The repair process for a pixel defect shown in a dot shape among the panel defects includes a method of turning the defect pixel into a dark point. But, in the method of making the dark point, the dark point is almost not perceived in a black gray level, as shown in FIG. 6A, but the dark point 10 is clearly perceived in the display screen of an intermediate gray level and a white gray level, as shown in FIGS. 6B and 6C.

As a result, there is a limit in improving the picture quality deterioration, which is caused by the panel defect, only by the repair process for recovering the panel defect.

SUMMARY OF THE INVENTION

Accordingly, it is an object of the present invention to provide a flat panel display device that is adaptive for optimizing data to be displayed in a panel defect area, in used of a compensation value of a compensation circuit as well as compensating a panel defect by a repair process, and a method of controlling a picture quality thereof.

In order to achieve these and other objects of the invention, a flat panel display device according to an aspect of the present invention includes: a display panel which has a non-defect area and a panel defect area and has at least one link pixel where adjacent pixels are interlinked; a memory which stores a first compensation data for compensating data to be displayed on odd-numbered lines in the panel defect area, a second compensation data for compensating data to be displayed on even-numbered lines in the panel defect area, a third compensation data for compensating data to be displayed on odd-numbered lines included in a boundary part between the panel defect area and the non-defect area, a fourth compensation data for compensating data to be displayed on even-numbered lines of the boundary part, and a fifth compensation data for compensating data that are to be displayed in the link pixel; a compensation part that modulates the data to be displayed in the panel defect area, a fixed area inclusive of the boundary part and the link pixel, with the compensation data; and a driver for driving the display panel in use of the data modulated by the compensation part.

A picture quality controlling method of a flat panel display device according to another aspect of the present invention includes: determining a first compensation data for compensating data that are to be displayed on odd-numbered lines in the panel defect area, a second compensation data for compensating data that are to be displayed on even-numbered lines in the panel defect area, a third compensation data for compensating data that are to be displayed on odd-numbered lines included in a boundary part between the panel defect area and a non-defect area of a display panel, a fourth compensation data for compensating data that are to be displayed on even-numbered lines included in the boundary part, and a fifth compensation data for compensating data that are to be displayed in a link pixel where adjacent pixels are interlinked in the display panel, by an inspection process and a repair process of the display panel; storing the compensation data at a memory; a compensation step of modulating the data to be displayed in the panel defect area, a fixed area inclusive of the boundary and the link pixel, with the compensation data stored on the memory; and driving the display panel in use of the data modulated by the compensation step.

BRIEF DESCRIPTION OF THE DRAWINGS

These and other objects of the invention will be apparent from the following detailed description of the embodiments of the present invention with reference to the accompanying drawings, in which:

FIGS. 1 to 5 are diagrams representing various shapes of panel defect areas of a display panel;

FIGS. 6A to 6C are diagrams representing the extent of perceiving a defect pixel, which is turned into a dark point, for each gray level;

FIGS. 26A to 26D are diagrams for explaining another picture quality controlling method according to a frame rate control method in use of 8×32 dither patterns of the present invention;

DETAILED DESCRIPTION OF THE PREFERRED EMBODIMENT

Reference will now be made in detail to the preferred embodiments of the present invention, examples of which are illustrated in the accompanying drawings.

With reference to FIGS. 7A to 36, embodiments of the present invention will be explained as follows. The following embodiments will be explained centering on a liquid crystal display device among flat panel display devices.

Figure 1:
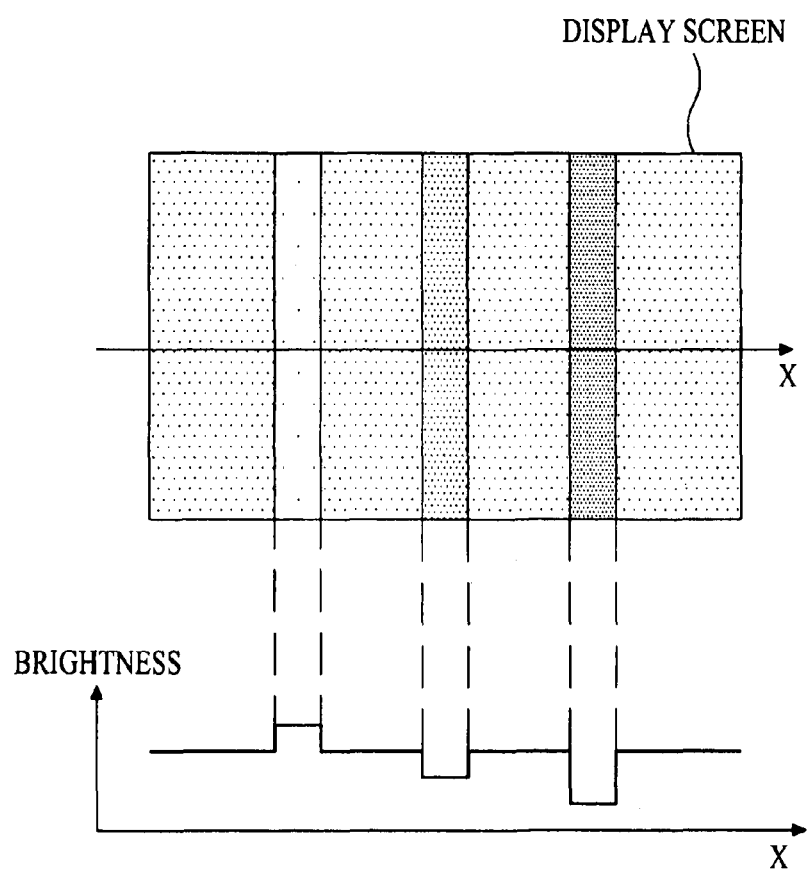
Figure 2:
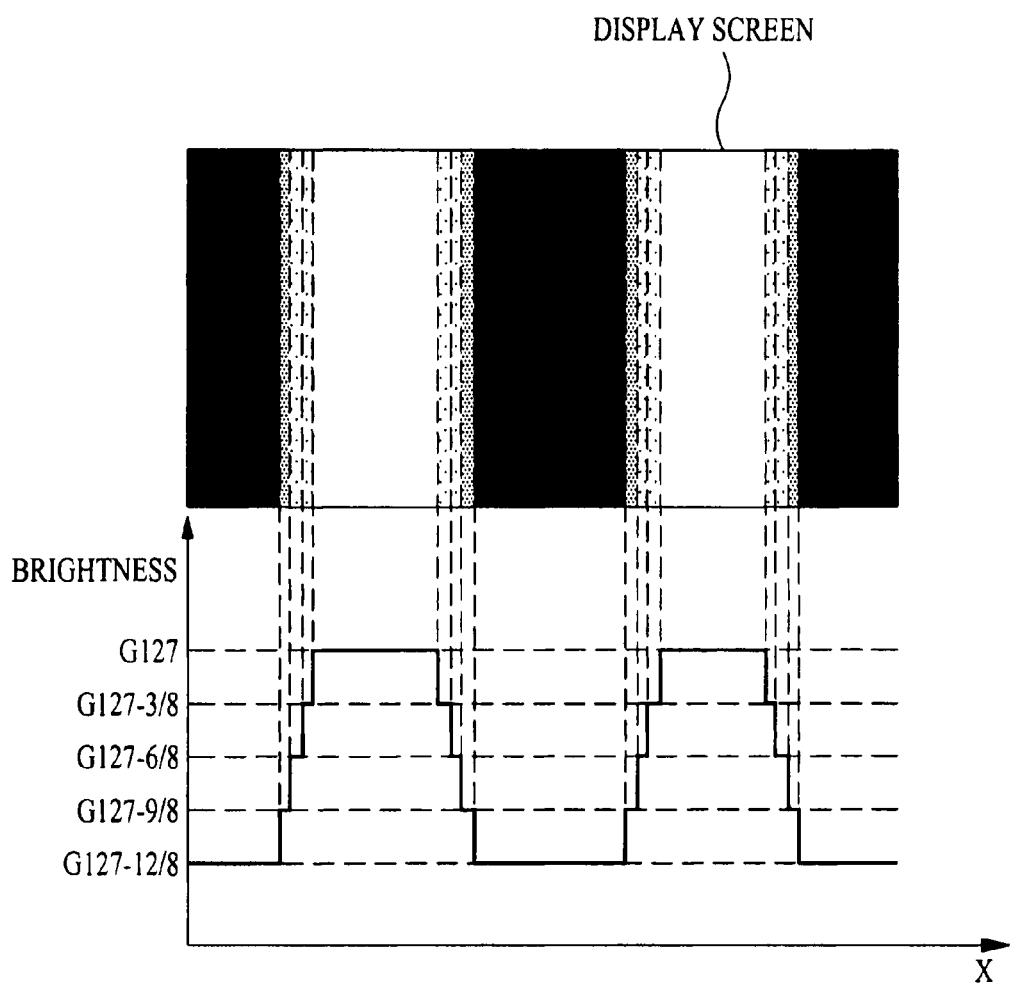
Figure 3:
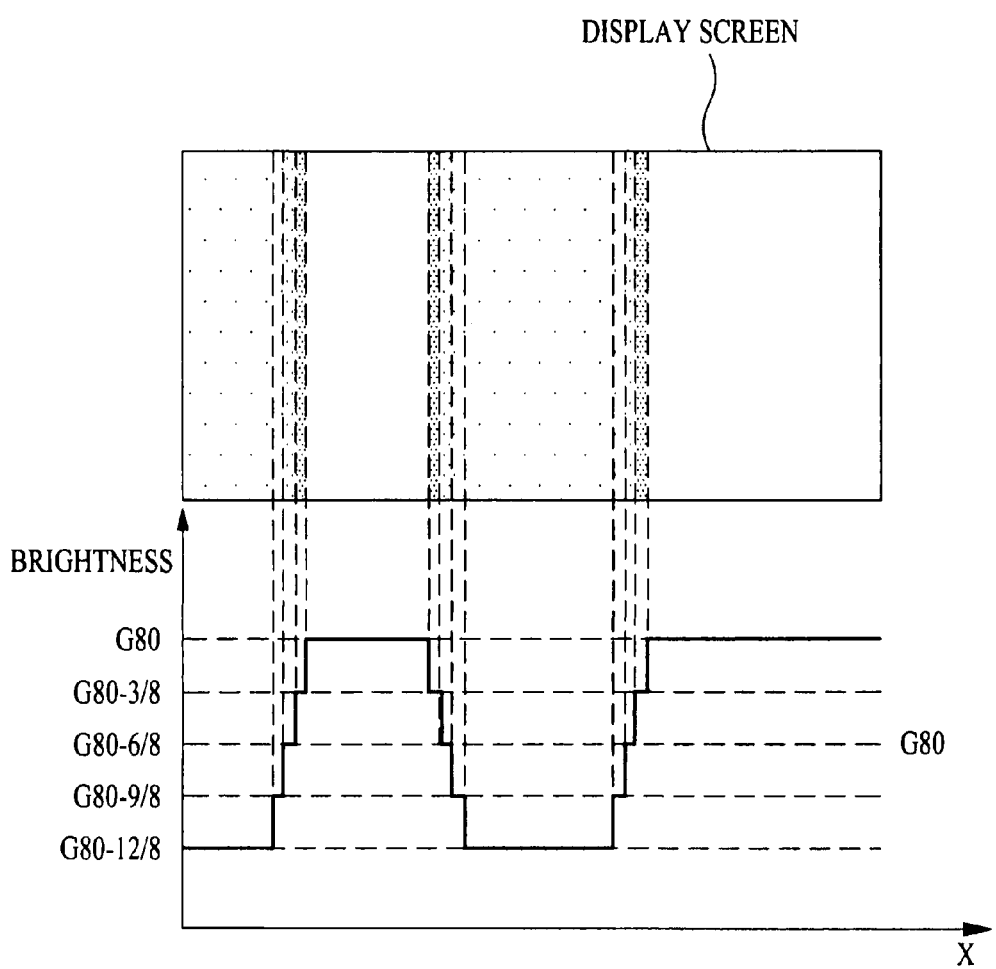
Figure 4:
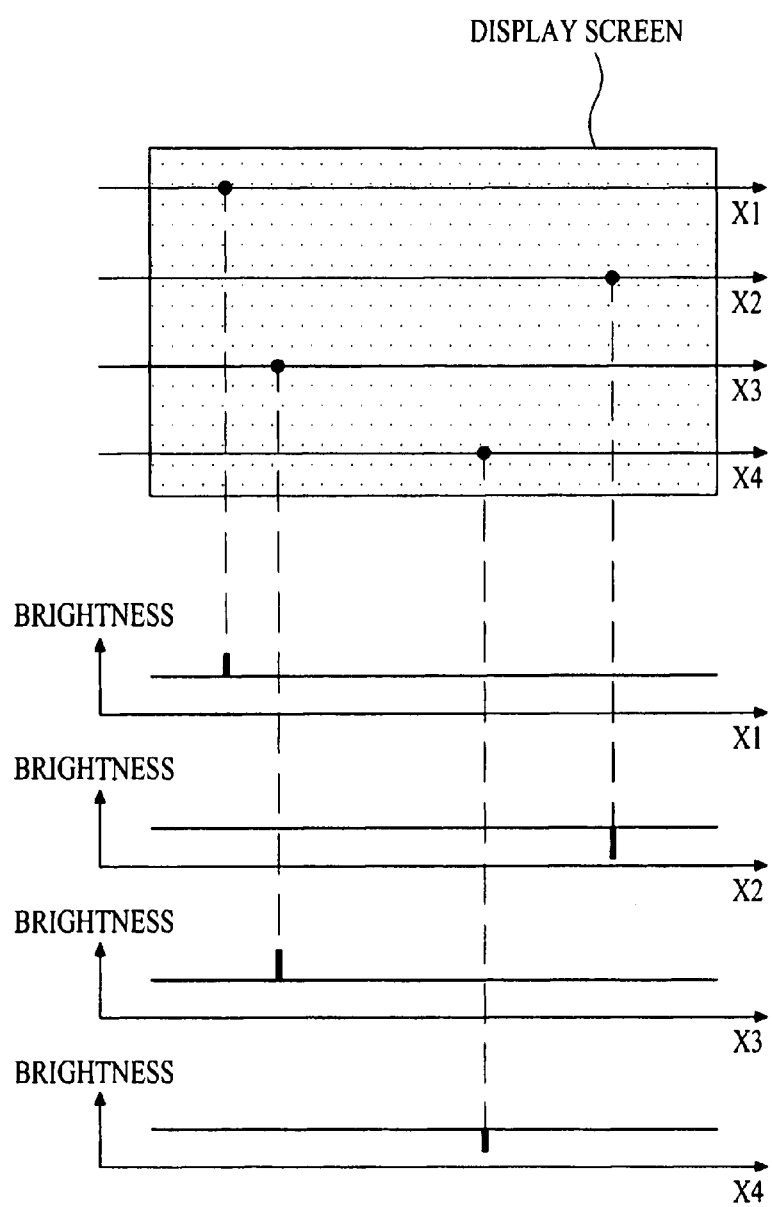
Figure 6C:
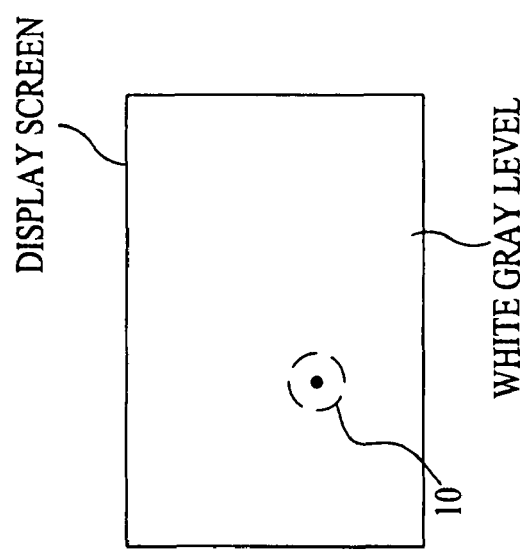
Figure 7A:
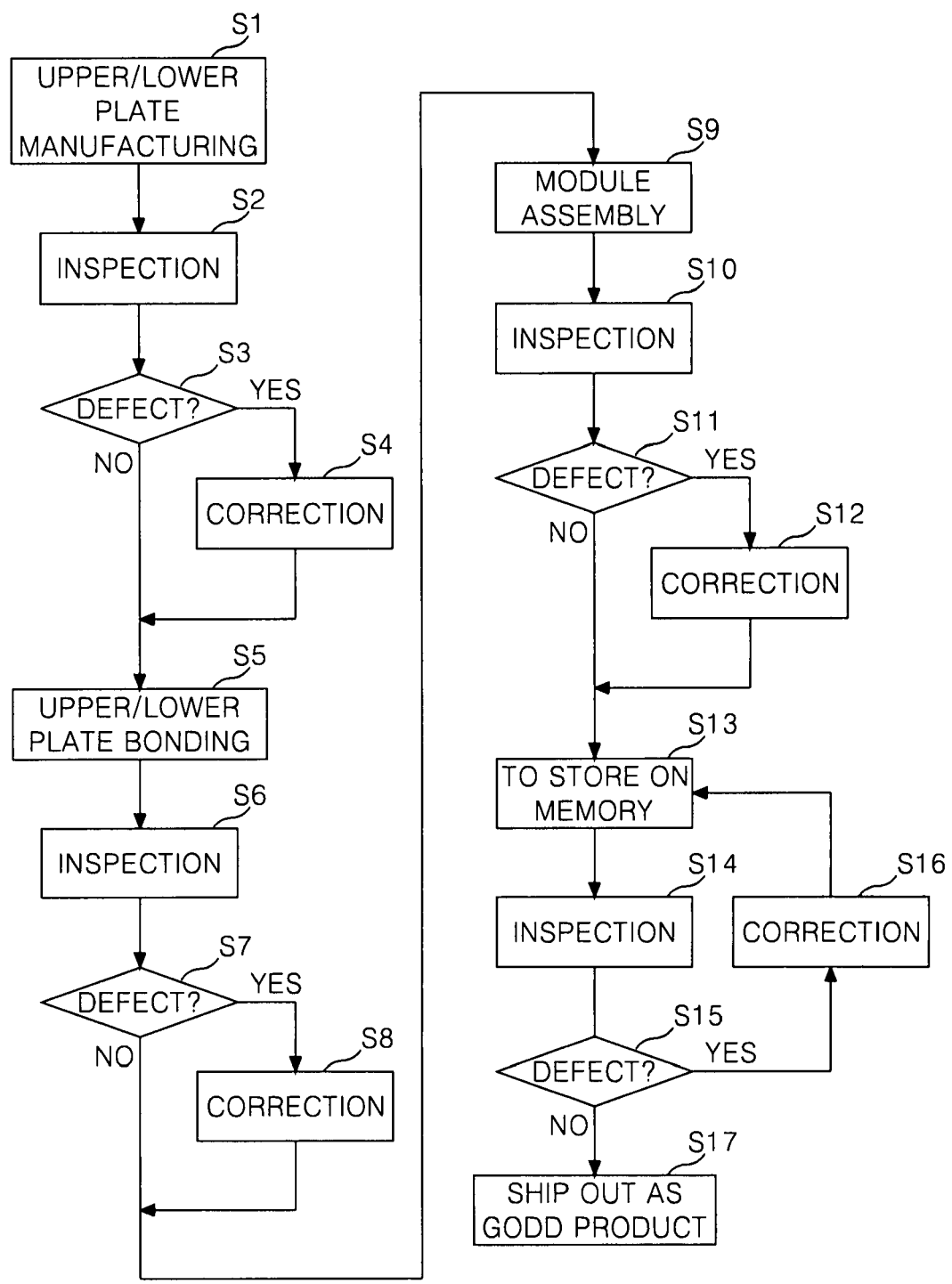
FIGS. 7A and 7B are diagrams representing a fabricating method of a flat panel display device according to the present invention, step by step.
Figure 7B:
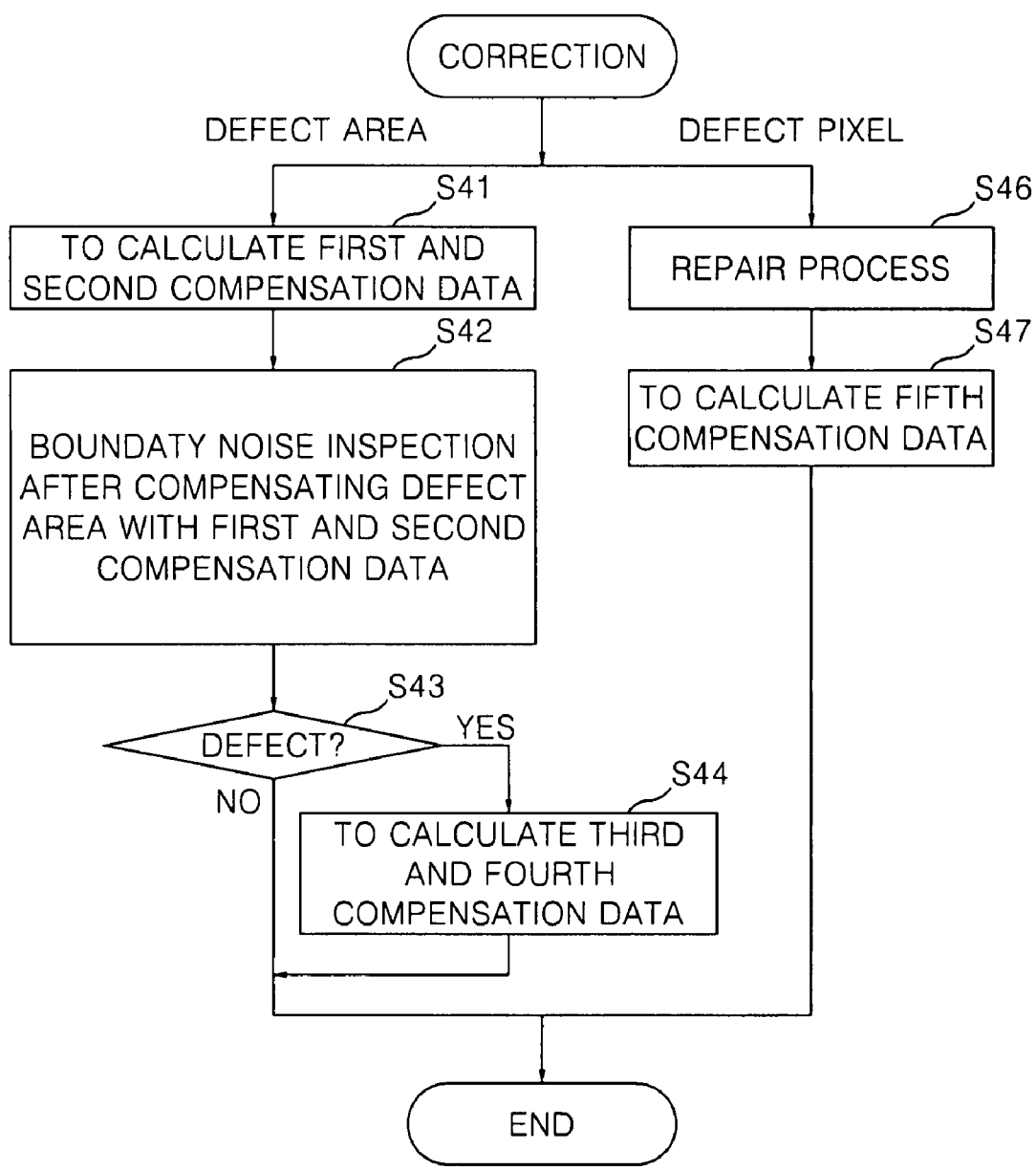

First of all, in reference to FIGS. 7A and 7B, a fabricating method of a liquid crystal display device according to an embodiment of the present invention will be described. FIGS. 7A and 7B are flow charts representing a fabricating method of a liquid crystal display device according to the present invention, step by step.

Referring to FIGS. 7A and 7B, firstly, an upper substrate (color filter substrate) and a lower substrate (TFT array substrate) of a liquid crystal display panel are made respectively (S1). The step S1 includes a substrate cleaning process, a substrate patterning process, an alignment film forming/rubbing process and the like. In the substrate cleaning process, impurities on the surfaces of the upper and lower substrates are removed with a cleaning solution. In the upper substrate patterning process, there are formed a color filter, a common electrode, a black matrix and the like. In the lower substrate patterning process, signal lines such as a data line and a gate line are formed, a TFT is formed at the crossing part of the data line and the gate line, and a pixel electrode is formed at a pixel area defined by the crossing of the data line and the gate line. On the other hand, the lower substrate patterning process might include a process of forming an aperture pattern, in which a gate metal is removed from the gate line, or a dummy pattern used in the repair process to be described later.

Subsequently, test data of each gray level are applied to the lower substrate of the display panel to display a test picture, and the panel defect is inspected by an electric/magnetic inspection for the picture (S2).

As the inspection result of the step S2, if the panel defect is not detected (NO of a step S3), the process advances to a step S5, and if the panel defect is detected, the location information indicating the location of a panel defect area is stored on an inspection computer and a data correction for compensating the panel defect is carried out (S4).

Figure 8:
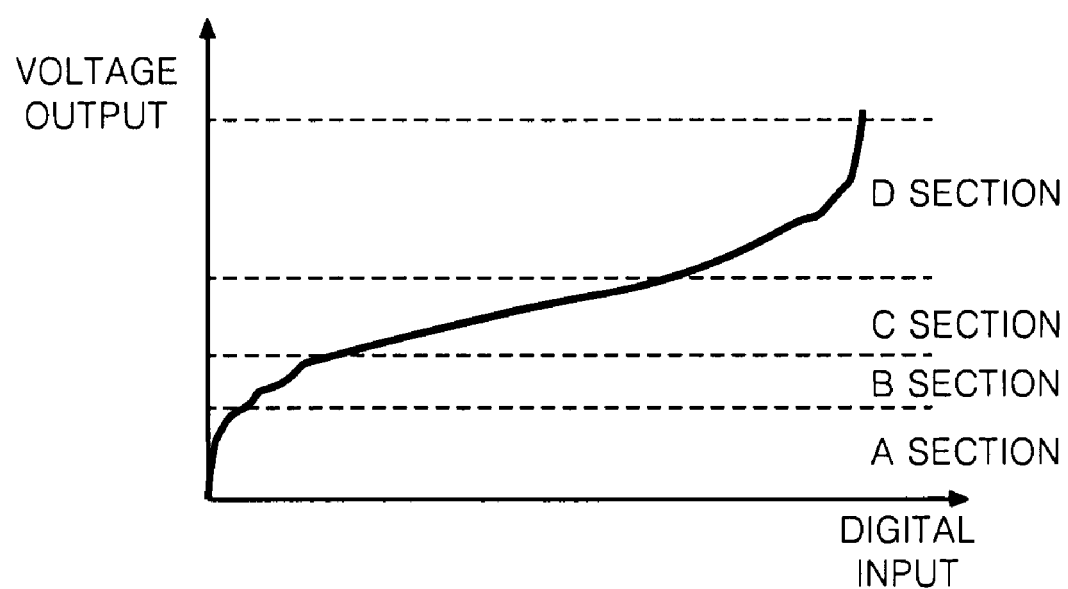
FIG. 8 is a diagram representing a gamma characteristic curve.

The correction of the step S4 is illustrated in more detail in FIG. 7B. Referring to FIG. 7B, in order to correct the brightness or chromaticity of the panel defect area, which is shown differently from that of a non-defect area, in the correction step S4, first and second compensation data are determined (S41). Herein, the first compensation data are for compensating data which are to be displayed on odd-numbered lines in the panel defect area, and the second compensation data are for compensating data which are to be displayed on even-numbered lines in the panel defect area. The first and second compensation data are different from a brightness difference or color difference between the panel defect area and the non-defect area in accordance with the location of the panel defect area, thus the first and second compensation data should be optimized for each location. Further, the first and second compensation data should be optimized for each gray level in consideration of a gamma characteristic. FIG. 8 is a diagram representing a gamma characteristic curve inclusive of a plurality of gray level sections. The compensation value might be differently determined for each gray level at each R, G, B pixel, or might be differently determined for each gray level section (A, B, C, D) inclusive of a plurality of gray levels, as shown in FIG. 8. For example, the compensation value might be differently optimized in accordance with the location of the panel defect area, i.e., '+1' at a first panel defect location, '−1' at a second panel defect location and the like, and might also be optimized for each gray level section, i.e., '0' at 'low gray level section A', '0' at 'low gray level section B', '1' at 'high gray level section C' and '1' at 'high gray level section D', as shown in FIG. 8. Further, the compensation value should be able to be minutely adjusted for the data which are to be displayed at the boundary part because the brightness is minutely changed in the boundary part between the panel defect area and the non-defect area. Accordingly, the compensation value can be made different for each gray level at the same pixel, and can also be made different if the location of the pixel corresponding thereto is changed even though the gray level of the data is the same. The compensation value like this is determined to be the same value for each of R, G, B data when correcting the brightness, and is determined to be different for each of R, G, B data when correcting the color difference. For example, if red is seen more prominently in the panel defect area of a specific location than in the non-defect area, an R compensation value corresponding to the panel defect area becomes lower than G, B compensation values.

The drive circuit of the flat panel display device expresses the brightness difference of the data in the display panel with the digital video data gray level value. Assuming that a minimum brightness difference which can be expressed in the display panel by correcting the gray level value is 'ΔL', the ΔL can be changed in accordance with the flat panel display device by various picture processing techniques or the data processing capacity of the drive circuit of the flat panel display device. Generally, the ΔL of the flat panel display device having a drive circuit of 8-bit data processing capacity is less than the ΔL of the flat panel display device having a drive circuit of 6-bit data processing capacity, and the ΔL can also be changed between the flat panel display devices of the same bit data processing capacity in accordance with whether the picture processing technique is applied.

When the brightness difference appears between the panel defect area and the non-defect area in the data of the same gray level, the present invention adjusts the data value with the compensation value which is determined by a method described above, thereby adjusting the brightness of the panel defect area with a gap of ΔL to be made close to the brightness of the non-defect area.

The brightness difference between the panel defect area and the non-defect area might remain less than ΔL by the data correction.

Figure 9A:
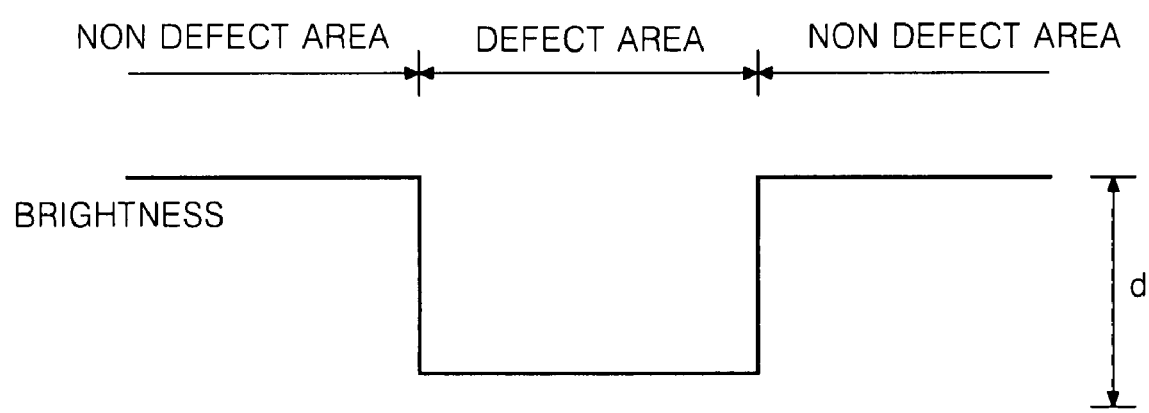
FIGS. 9A to 9C are diagrams for explaining a brightness characteristic which appears in a boundary part of a panel defect area and a non-defect area of the display panel.
Figure 9B:
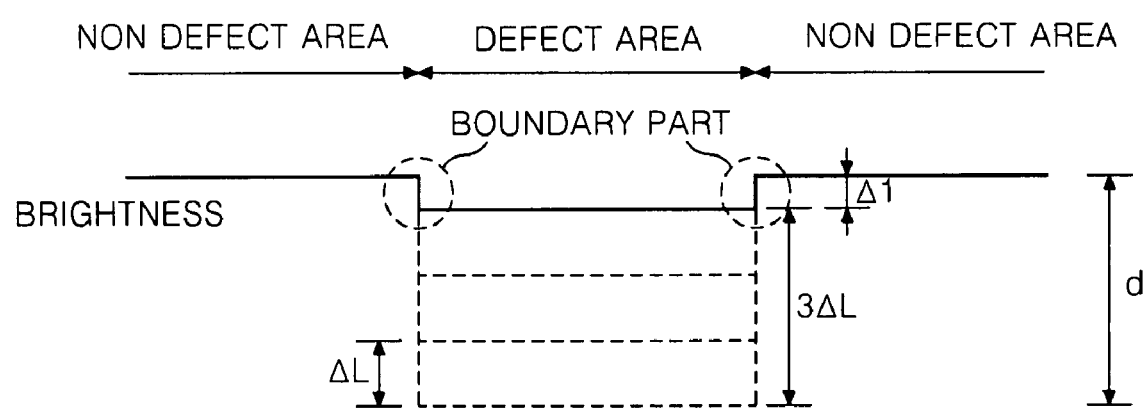
Figure 9C:
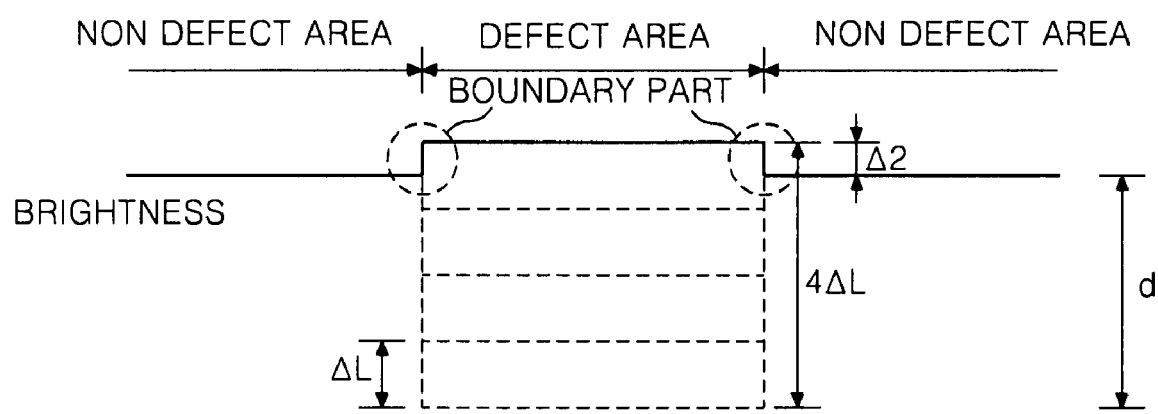

As shown in FIG. 9A, it is assumed that the brightness difference between the panel defect area and the non-defect area is 'd'. Further, it is assumed that d=3ΔL+Δ1 and Δ1<ΔL. In such a brightness difference, a compensation value '3' is added to the data, thereby the brightness of the panel defect area is increased by 3ΔL to be made close to the brightness of the non-defect area, as shown in FIG. 9B. However, the brightness of the panel defect area remains slightly lower by Δ1 than the brightness of the non-defect area. If a compensation value '4' is added to the data in order to correct this, on the contrary of the phenomenon shown in FIG. 9B, the brightness of the panel defect area is slightly increased by Δ2 in comparison with the brightness of the non-defect area, as shown in FIG. 9C. Herein, Δ2<ΔL and Δ1+Δ2=ΔL.

A minute brightness deviation remaining even after the data modulation like this appears in a line or block shape in a boundary line between the panel defect area and the non-defect area and a boundary part inclusive of a fixed area of the vicinity of the boundary line.

Accordingly, the fabricating method of the liquid crystal display device according to the embodiment of the present invention modulates test data in use of the first and second compensation data determined in the step S41, and applies the modulated test data to a lower substrate, thereby inspecting a boundary noise by an electric/magnetic inspection. In other words, the test data to be displayed in the panel defect area are modulated in use of the first and second compensation data to correct the brightness or chromaticity of the panel defect area, and the boundary noise inspection is performed for the boundary part of the non-defect area and the panel defect area of which the brightness or chromaticity is corrected (S42).

If the boundary noise is detected in the step S42 (YES of the step S43), the location information for the boundary part which appears as noise are stored on an inspection computer, and third and fourth compensation data for compensating the boundary noise are calculated (S44). Herein, the third compensation data are for compensating the data to be supplied to odd-numbered lines in the boundary part and the fourth compensation data are for compensating the data to be supplied to even-numbered lines in the boundary part. The third and fourth compensation data should also be optimized for each location and for each gray level in the same manner as the first and second compensation data.

Figure 10:
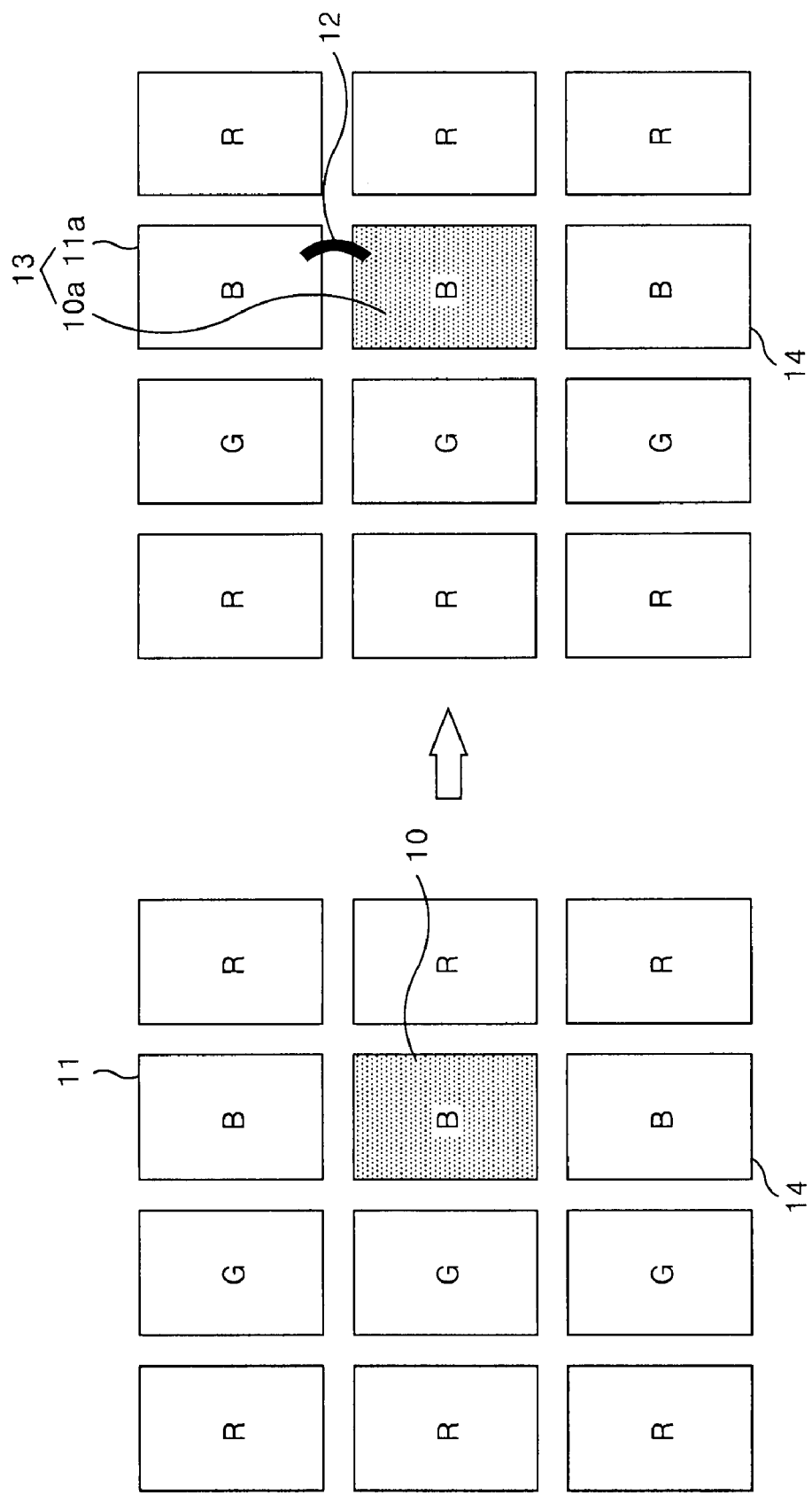
FIG. 10 is a diagram for briefly explaining a repair process according to an embodiment of the present invention.

Subsequently, at the same time as the steps S41 to S44 or before or after the steps S41 to S44, a repair process is carried out for the pixel defect (S46). FIG. 10 is a diagram illustrating an example of a repair process according to the present invention. As shown in FIG. 10 which illustrates a concept of the repair process, a defect pixel 10 and a normal pixel 11 are electrically connected through a conductive link pattern 12 to form a link pixel 13, thereby performing the repair process.

The repair process S46, as shown in FIG. 10, is performed by a method of electrically shorting or linking the defect pixel 10 and the normal pixel 11 which is adjacent thereto and has the same color as the defect pixel 10. The repair process S31 includes a process of blocking a path through which a data voltage is supplied to a pixel electrode of the defect pixel 10 and a process of electrically shorting or linking the normal pixel 11 and the defect pixel 10 in use of the conductive link pattern 12.

In the link pixel 13 where the defect pixel 10 and the normal pixel 11 are electrically connected, the linked defect pixel 10a is charged with the data voltage of the linked normal pixel 11a at the same time. But, the link pixel 13 has a different charge characteristic from the normal pixel 14 which is not linked, because the charges are supplied to the pixel electrodes included in two pixels 10a, 11a through one thin film transistor TFT. For example, assuming that the same data voltage is supplied to the link pixel 13 and the normal pixel 14 which is not linked, the charges are dispersed to the two pixels 10a, 11a in the link pixel 13, thus the amount of charge thereof becomes less than the normal pixel 14 which is not linked. As a result thereof, if the same data voltage is applied to the link pixel 13 and the unlinked normal pixel 14, the link pixel 13 is made to appear brighter than the unlinked normal pixel 14 in a normally white mode. On the other hand, the link pixel 13 is made to appear darker than the unlinked normal pixel 14 in a normally black mode. In the normally white mode, the transmittance or gray level is increased as the data voltage becomes lower. And, in the normally black mode, the transmittance or gray level is increased as the data voltage becomes higher.

Generally, a liquid crystal display device of a twisted nematic mode (hereinafter, referred to as "TN mode") is driven in a in a normally white mode. In the TN mode liquid crystal display device, a pixel electrode and a common electrode of the liquid crystal cell are separately formed on two substrates which face each other with a liquid crystal therebetween and a vertical electric field is applied between the pixel electrode and the common electrode, on the contrary, a liquid crystal display device of an in-plane switching mode (hereinafter, referred to as "IPS mode") is driven in a normally black mode. In the IPS mode liquid crystal display device, the pixel electrode and the common electrode of the liquid crystal cell are formed on the same substrate and a horizontal electric field is applied between the pixel electrode and the common electrode.

After the repair process S46, the location information and charge characteristic of the link pixel 13 are stored on an inspection computer, and a fifth compensation data for compensating the charge characteristic of the link pixel 13 is calculated S47. The charge characteristic of the link pixel 13 is different from the unlinked normal pixel 14 in the extent of the brightness difference or color difference in accordance with the location of the link pixel 13, thus the fifth compensation data should be optimized for each location and for each gray level in the same manner as the first to fourth compensation data.

Hereinafter, in reference to FIGS. 11A to 14C, various embodiments of a repair process according to the present invention will be explained.

Figure 11A:
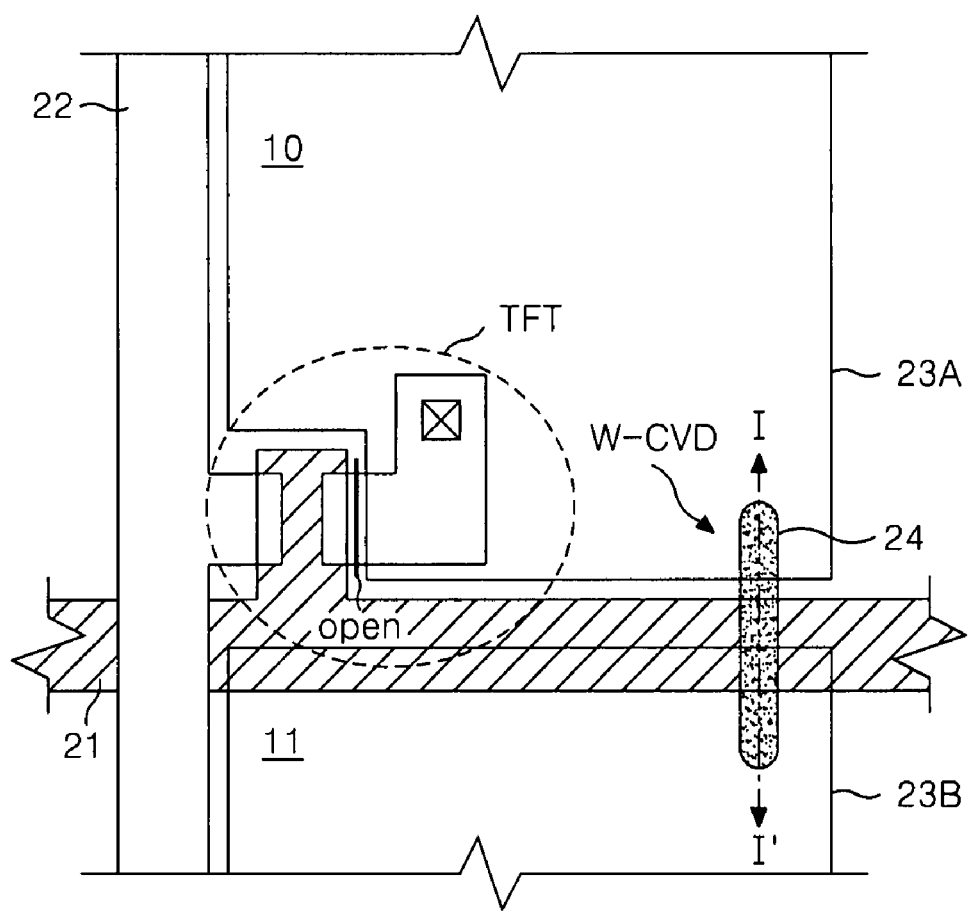
FIGS. 11A to 11C are diagrams illustrating an example of a repair process of a liquid crystal display device of a TN mode according to the present invention.
Figure 11B:
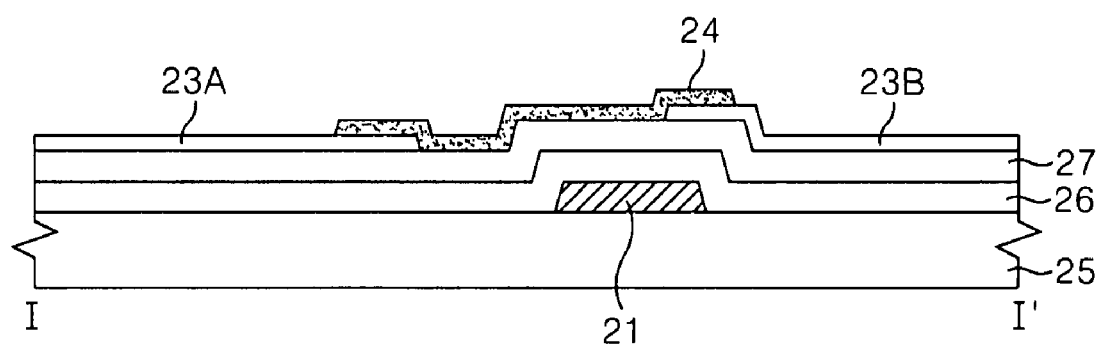
Figure 11C:
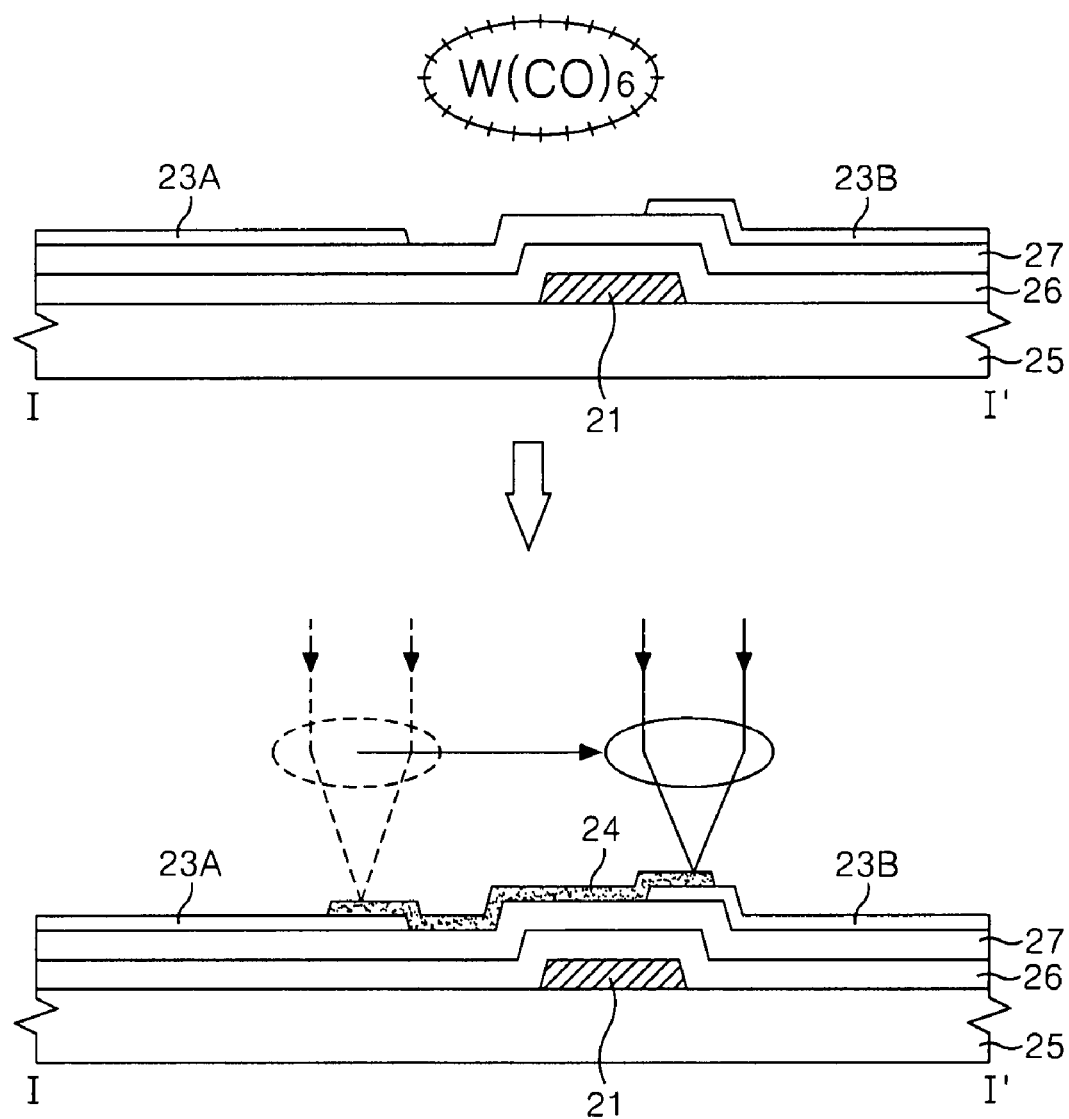

FIGS. 11A to 11C represent a repair process of a liquid crystal display device of a TN mode according to a first embodiment of the present invention.

Referring to FIGS. 11A and 11B, the repair process according to the present invention directly forms a link pattern 24 in a pixel electrode 23A of the defect pixel 10 and a pixel electrode 23B of the normal pixel 11, which are adjacent to each other, by a W-CVD (tungsten-chemical vapor deposition) process.

On a lower substrate 25, a gate line 21 and a data line 22 cross each other and a thin film transistor TFT is formed at the crossing part thereof. A gate electrode of the TFT is electrically connected to the gate line 21 and a source electrode thereof is electrically connected to the data line 22. And, a drain electrode of the TFT is electrically connected to the pixel electrodes 23A, 23B through a contact hole.

A gate metal pattern inclusive of the gate line 21, the gate electrode of the TFT and the like is formed on the lower substrate 25 by a deposition process of a gate metal such as aluminum Al, aluminum neodymium AlNd and the like, a photolithography process and an etching process.

A source/drain metal pattern inclusive of the data line 22, the source and drain electrodes of the TFT and the like is formed on a gate insulating film 26 by a deposition process of a source/drain metal such as chrome Cr, molybdenum Mo, titanium Ti and the like, a photolithography process and an etching process.

The gate insulating film 26 for electrically insulating the gate metal pattern from the source/drain metal pattern is formed of an inorganic insulating film such as silicon nitride SiNx, silicon oxide SiOx or the like. And, a passivation film covering the TFT, the gate line 21 and line 22 is formed of an inorganic insulating film or an organic insulating film.

The pixel electrodes 23A, 23B are formed on the passivation film 27 by a process of depositing a transparent conductive metal such as ITO (indium tin oxide), TO (tin oxide), IZO (indium zinc oxide), ITZO (indium tin zinc oxide) or the like, a photolithography process and an etching process. A data voltage from the data line 22 is supplied to the pixel electrodes 23A, 23B through the TFT for a scan period when the TFT is turned on.

The repair process is performed for the lower substrate before the substrate bonding/liquid crystal injecting process. The repair process firstly includes a step of opening a current path between the source electrode of the TFT and the data line 22 or between the drain electrode of the TFT and the pixel electrode 23A by a laser cutting process in order to block the current path between the pixel electrode 23A of the defect pixel 10 and the data line 22. Further, the repair process includes a step of forming a link pattern 24 between the pixel electrode 23A of the defect pixel 10 and the pixel electrode 23B of the normal pixel 11, which is adjacent thereto and has a color identical thereto, by directly depositing tungsten W on the passivation film 27 between the pixel electrodes 23A, 23B in use of the W-CVD process. On the other hand, the order of the wire breaking process and the W-CVD process can be interchanged.

The W-CVD process includes a step of condensing a laser light on any one of the pixel electrodes 23A, 23B under an atmosphere of $W(CO)_6$ and moving or scanning the condensed laser light to another pixel electrode, as shown in FIG. 11C. Then, the tungsten W is separated from the $W(CO)_6$ by the laser light and the tungsten W is deposited on one end of the pixel electrode 23A, an exposure part of the passivation film 27 and one end of the pixel electrode 23B along a scan direction of the laser light.

Figure 12A:
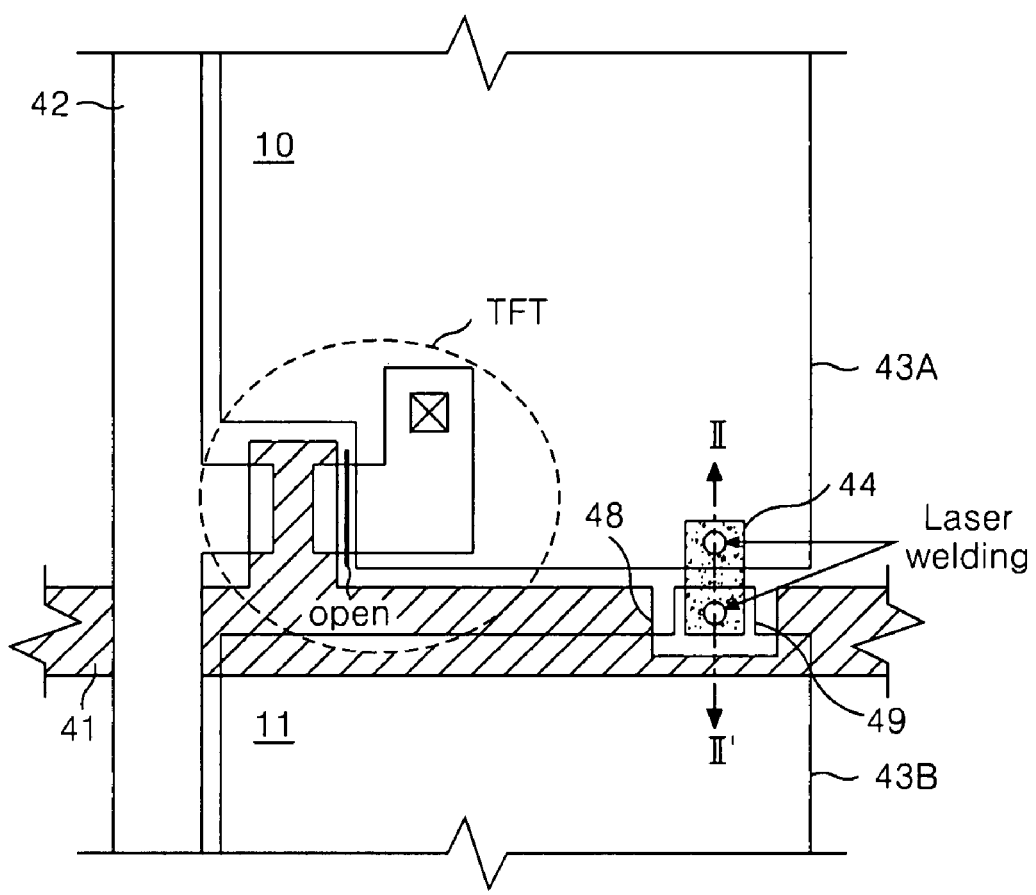
FIGS. 12A to 12C are diagrams illustrating another example of the repair process of the liquid crystal display device of the TN mode according to the present invention.
Figure 12B:
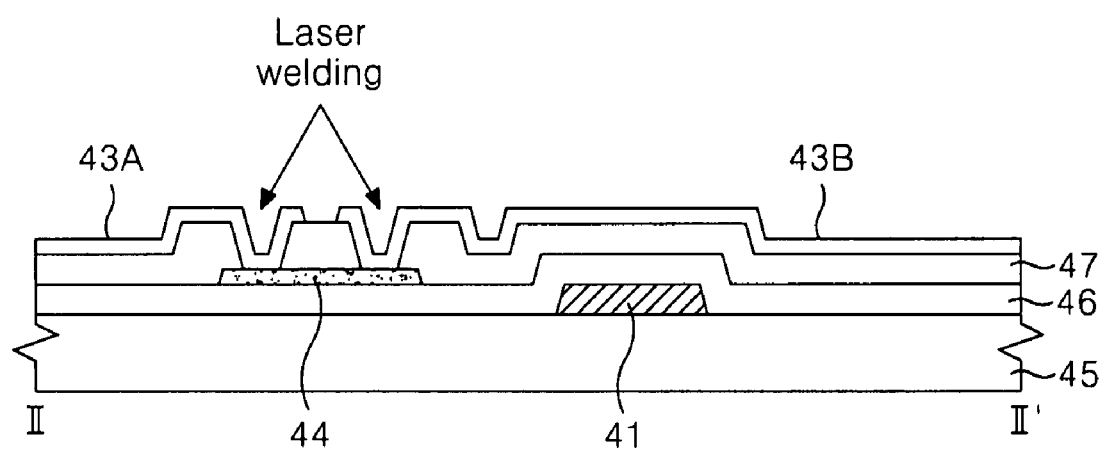
Figure 12C:
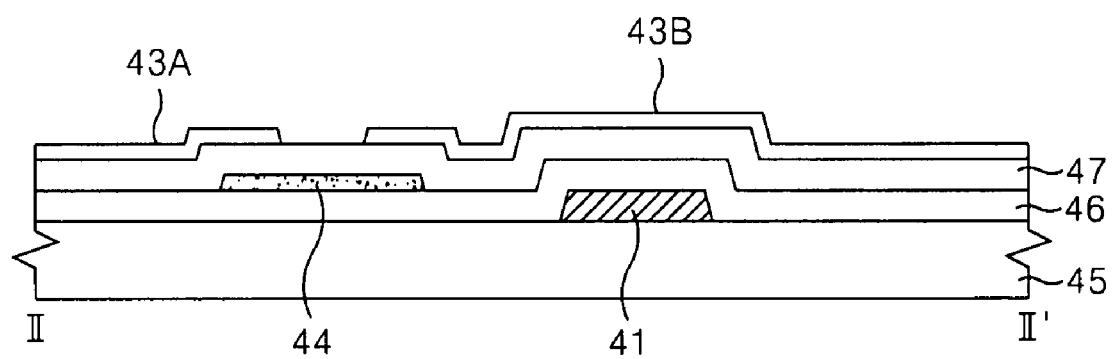

FIGS. 12A to 12C represent another example of a repair process of a liquid crystal display device of a TN mode according to the present invention.

Referring to FIGS. 12A and 12B, the lower substrate 45 of the liquid crystal display device according to the present invention includes a conductive dummy pattern 44 that overlaps a part of a pixel electrode 43A of the defect pixel 10 and a part of a pixel electrode 43B of the normal pixel 11, which are adjacent thereto, with a passivation film 47 therebetween.

On a lower substrate 45, a gate line 41 and a data line 42 cross each other and a thin film transistor TFT is formed at the crossing part thereof. A gate electrode of the TFT is electrically connected to the gate line 41 and a source electrode is electrically connected to the data line 42. And, a drain electrode of the TFT is electrically connected to the pixel electrodes 43A, 43B through a contact hole.

A gate metal pattern inclusive of the gate line 41, the gate electrode of the TFT and the like is formed on the lower substrate 45 by a gate metal deposition process, a photolithography process and an etching process.

The gate line 41 includes a concave pattern 48 which is not overlapped with the dummy pattern to be formed in the following process, but can encompass the dummy pattern 44.

A source/drain metal pattern inclusive of the data line 42, the source and drain electrodes of the TFT, the dummy pattern 44 and the like is formed on a gate insulating film 46 by a source/drain metal deposition process, a photolithography process and an etching process.

The dummy pattern 44 is formed to be an island pattern, which is not connected to the gate line 41, the data line 42 and the pixel electrodes 43A, 43B, before the repair process. Both ends of the dummy pattern 44 are connected to the pixel electrodes 43A and 43B respectively by a laser welding process so as to overlap the pixel electrodes 43A, 43B which are perpendicularly adjacent.

The gate insulating film 46 electrically insulates the gate metal pattern from the source/drain metal pattern, and the passivation film 47 electrically insulates the source/drain metal pattern from the pixel electrodes 43A, 43B.

The pixel electrodes 43A, 43B are formed on the passivation film 47 by a process of depositing a transparent conductive metal, a photolithography process and an etching process. The pixel electrodes 43A, 43B include an extension part 49 which is extended from one side of an upper part. The pixel electrodes 43A, 43B are sufficiently overlapped with one end of the dummy pattern 44 by the extension part 49. A data voltage from the data line 42 is supplied to the pixel electrodes 43A, 43B through the TFT for a scan period while the TFT is turned on.

The repair process is performed for the lower substrate before the substrate bonding/liquid crystal injecting process or for a panel after the substrate bonding/liquid crystal injecting process. The repair process firstly includes a step of opening a current path between the source electrode of the TFT and the data line 42 or between the drain electrode of the TFT and the pixel electrode 43A by a laser cutting process in order to block the current path between the pixel electrode 43A of the defect pixel 10 and the data line 42. Further, the repair process includes a step of irradiating a laser beam onto the pixel electrodes 43A, 43B which are adjacent to both ends of the dummy pattern 44 in use of the laser welding process, as shown in FIG. 12B. Then, the pixel electrodes 43A, 43B and the passivation film 47 are melted by the laser light, and as a result, the pixel electrodes 43A, 43B are connected to the dummy pattern 44. On the other hand, the order of the wire breaking process and the laser welding process can be interchanged. FIG. 12C shows the pixel electrodes 43A, 43B and the dummy pattern 44 which are electrically separated by the passivation film 47 before the laser welding process.

Figure 13A:
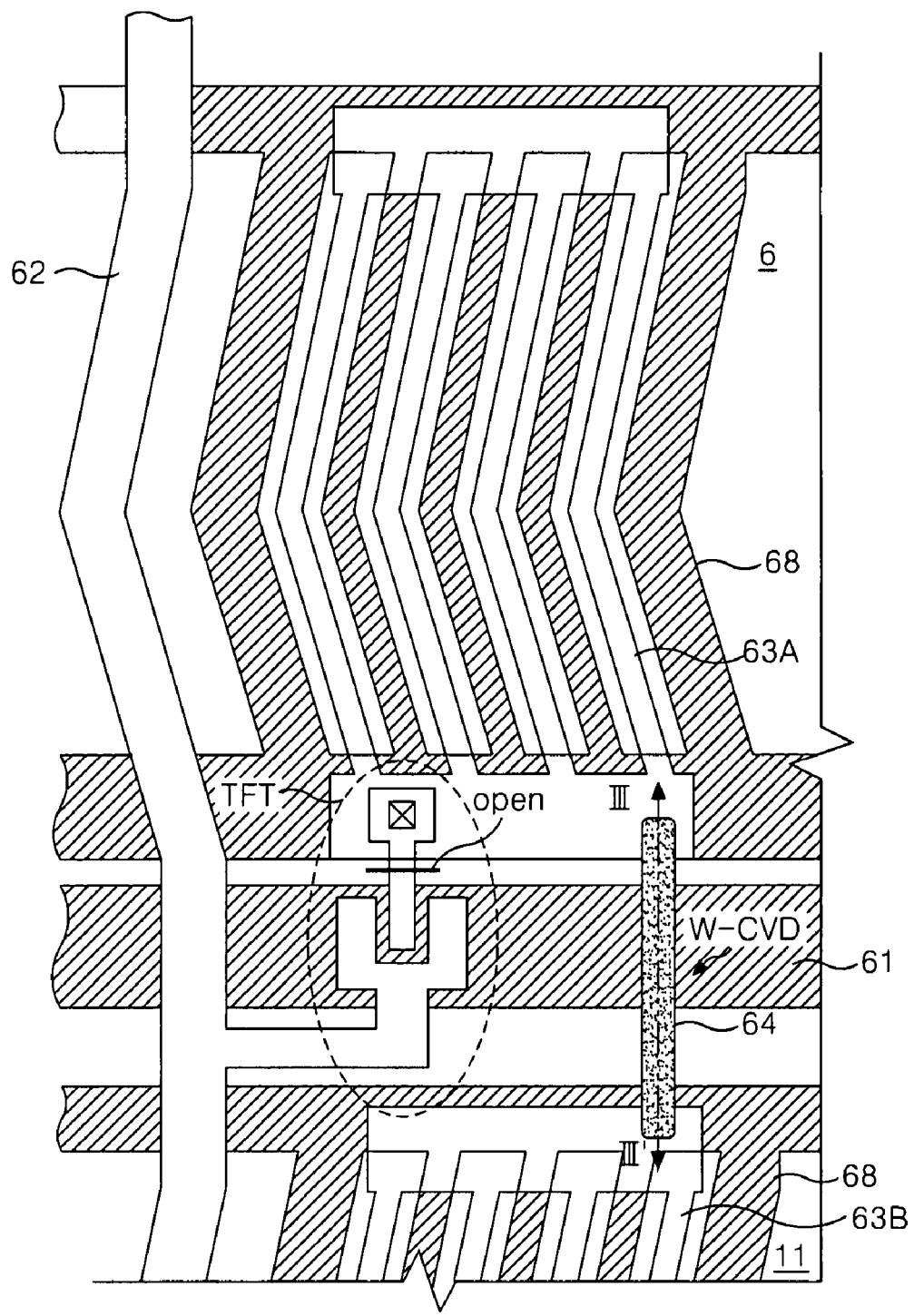
FIGS. 13A to 13B are diagrams illustrating an example of a repair process of a liquid crystal display device of an IPS mode according to the present invention.
Figure 13B:
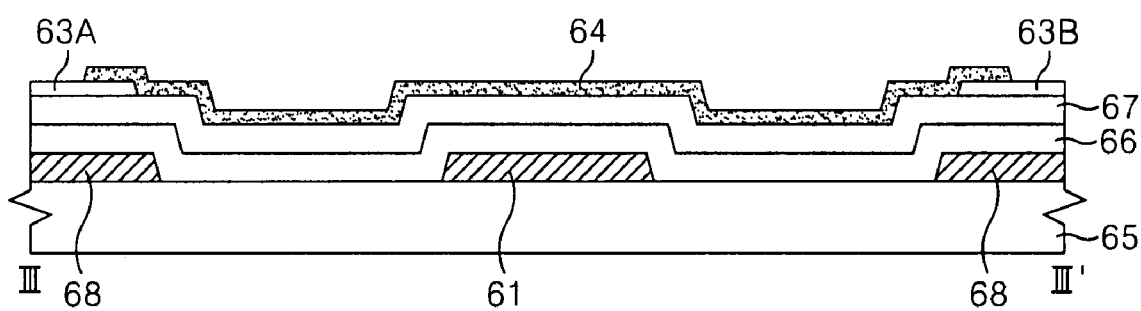

FIGS. 13A and 13B represent an example of a repair process of a liquid crystal display device of an IPS mode according to the present invention.

Referring to FIGS. 13A and 13B, a repair process according to the present invention includes a step of directly forming a link pattern 64 on a pixel electrode 63A of the defect pixel 10 and a pixel electrode 63B of the normal pixel 11, which are adjacent thereto, in use of a W-CVD process.

On a lower substrate 65, a gate line 61 and a data line 62 cross each other and a thin film transistor TFT is formed at the crossing part thereof. A gate electrode of the TFT is electrically connected to the gate line 61 and a source electrode thereof is electrically connected to the data line 62. And, a drain electrode of the TFT is electrically connected to the pixel electrodes 63A, 63B through a contact hole.

A gate metal pattern inclusive of the gate line 61, the gate electrode of the TFT, a common electrode 68 and the like is formed on the lower substrate 65 by a gate metal deposition process, a photolithography process and an etching process. The common electrode 68 is connected all liquid crystal cells to apply common voltages Vcom to the liquid crystal cells. A horizontal electric field is applied to the liquid crystal cells by the common voltage Vcom applied to the common electrode 68 and the data voltage applied to the pixel electrodes 63A, 63B.

A source/drain metal pattern inclusive of the data line 62, the source and drain electrodes of the TFT and the like is formed on a gate insulating film 66 by a source/drain metal deposition process, a photolithography process and an etching process.

The pixel electrodes 63A, 63B are formed on a passivation film 67 by a process of depositing a transparent conductive metal, a photolithography process and an etching process. A data voltage from the data line 62 is supplied to the pixel electrodes 63A, 63B through the TFT for a scan period when the TFT is turned on.

The repair process is performed for the lower substrate before the substrate bonding/liquid crystal injecting process. The repair process firstly includes a step of opening a current path between the source electrode of the TFT and the data line 62 or between the drain electrode of the TFT and the pixel electrode 63A by a laser cutting process in order to block the current path between the pixel electrode 63A of the defect pixel 10 and the data line 62. Subsequently, the repair process includes a step of forming a link pattern 64 between the pixel electrode 63A of the defect pixel 10 and the pixel electrode 63B of the normal pixel 11, which is adjacent thereto and has a color identical thereto, by directly depositing tungsten W on the passivation film 67 between the pixel electrodes 63A, 63B in use of the W-CVD process. On the other hand, the order of the wire breaking process and the W-CVD process can be interchanged.

Figure 14A:
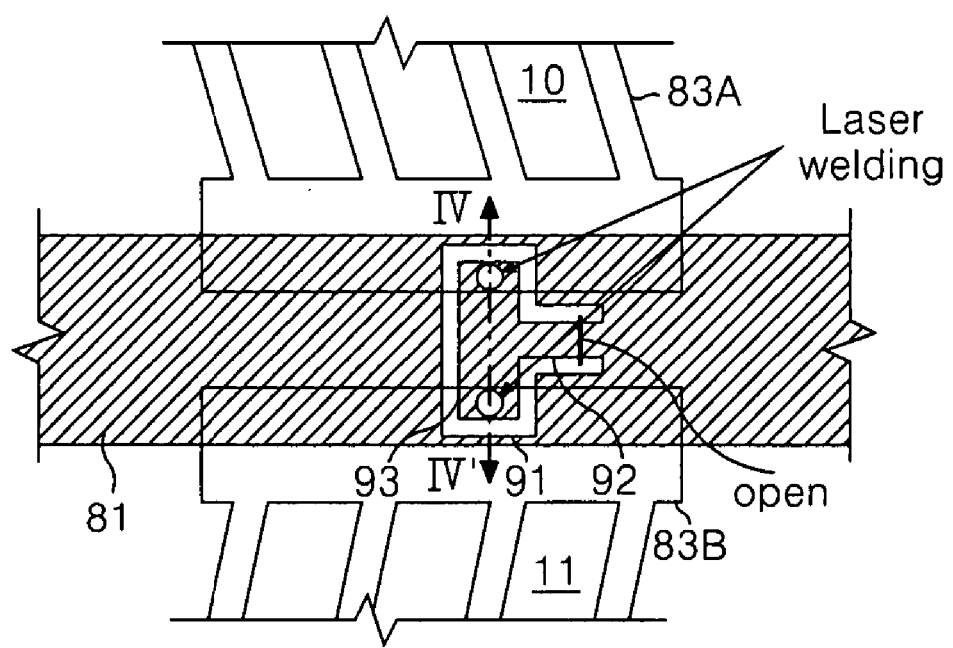
FIGS. 14A to 14C are diagrams illustrating another example of the repair process of the liquid crystal display device of the IPS mode according to the present invention.
Figure 14B:
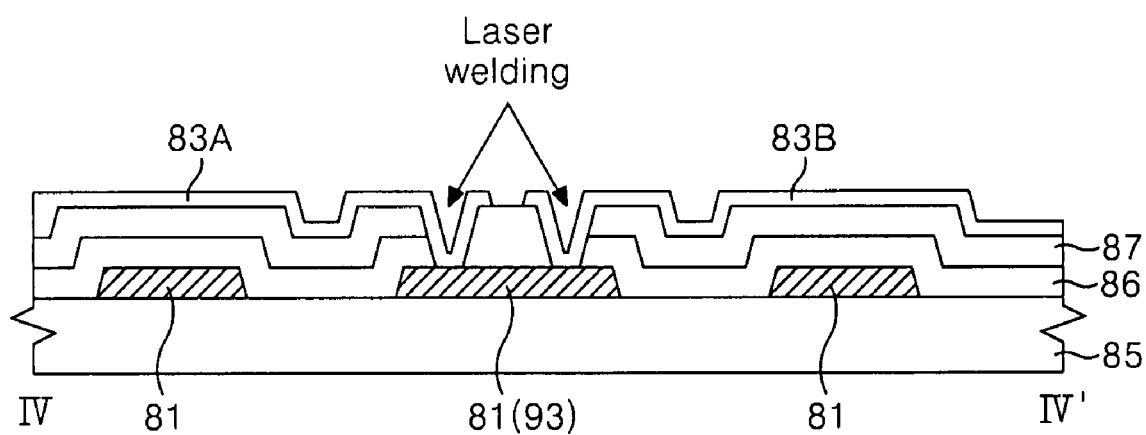
Figure 14C:
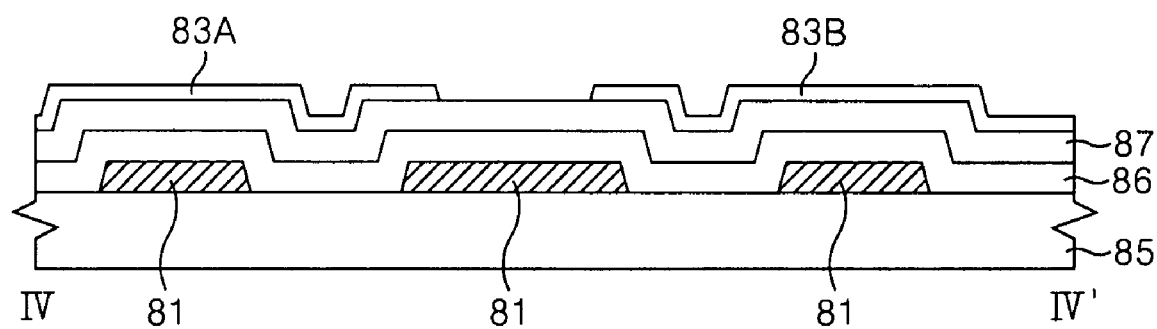

FIGS. 14A to 14C represent another example of a repair process of a liquid crystal display device of an IPS mode according to the present invention. In FIGS. 14A to 14C, the data metal pattern such as the data line and the like; the TFT; the common electrode for applying the horizontal electric field to the liquid crystal cells together with the pixel electrode; and the like are omitted.

Referring to FIGS. 14A and 14B, a gate line 81 of the liquid crystal display device according to the present invention includes a neck part 92; a head part 93 which is connected to the neck part 92 and of which the area is expanded; and an aperture pattern 91 which is removed in a 'C' shape around the neck part 92 and the head part 93.

A gate metal pattern inclusive of the gate line 81, the gate electrode of the TFT (not shown), a common electrode and the like is formed on a glass substrate 85 by a gate metal deposition process, a photolithography process and an etching process.

The pixel electrodes 83A, 83B are formed on a passivation film 87 by a process of depositing a transparent conductive metal, a photolithography process and an etching process.

In the gate line 81, the neck part 92 is opened by the laser cutting process in the repair process. One end of the head part 93 overlaps the pixel electrode 83A of the defect pixel 10 with a gate insulating film 86 and a passivation film 87 therebetween, and the other end of the head part 93 overlaps the pixel electrode 83B of the normal pixel 11, which is adjacent to the defect pixel 10, with the gate insulating film 86 and the passivation film 87 therebetween.

The repair process is performed for the lower substrate before the substrate bonding/liquid crystal injecting process or a panel after the substrate bonding/liquid crystal injecting process. The repair process includes a step of opening a current path between the source electrode of the TFT and the data line or between the drain electrode of the TFT and the pixel electrode 83A by a laser cutting process in order to block the current path between the pixel electrode 83A of the defect pixel and the data line, and a step of opening the neck part of the gate line 81. Subsequently, the repair process includes a step of irradiating a laser beam onto the pixel electrodes 83A, 83B which are adjacent to both ends of the head part 93 in use of the laser welding process, as shown in FIG. 14B. Then, the pixel electrodes 83A, 83B, the passivation film 87 and the gate insulating film 86 are melted by the laser light, and as a result, the head part 93 becomes an independent pattern to be separated from the gate line 81 and the pixel electrodes 83A, 83B are connected to the head part 93. On the other hand, the order of the wire breaking process and the laser welding process can be interchanged. FIG. 14C shows the pixel electrodes 83A, 83B and the head part 93 which are electrically separated by the passivation film 87 and the gate insulating film 86 before the laser welding process.

The repair process according to the present invention removes the neck part 92 in advance in the patterning process of the gate line 81 to form the independent pattern such as the dummy pattern 44 of FIG. 12A, thereby making it possible to omit the cutting process of the neck part 92 in the repair process.

On the other hand, the dummy pattern 44 of FIG. 12A, or the head part 93, the neck part 92 and the aperture pattern 91 of FIG. 14A can be formed by one per pixel as in the foregoing embodiments, or they can be formed by a plural number per pixel for reducing the electrical contact characteristic, i.e., the contact resistance, of the link pixels.

Referring to FIG. 7A, subsequently to the foregoing step S3 or S4, the present invention bonds the upper/lower substrates together in use of a sealant or frit glass (S5). The step S5 includes an alignment film forming/rubbing process and a substrate bonding/liquid crystal injecting process. In the alignment film forming/rubbing process, an alignment film is spread over each of the upper and lower substrates of the display panel and the alignment film is rubbed with a rubbing cloth and the like. In the substrate bonding/liquid crystal injecting process, the upper substrate and the lower substrate are bonded together in use of the sealant, and a liquid crystal and a spacer are injected through a liquid crystal injection hole and then the liquid crystal injection hole is sealed off.

Subsequently, a test picture is displayed by applying test data of each gray level to the display panel of after the substrate bonding/liquid crystal injecting process, and the panel defect is inspected by an electric/magnetic inspection and/or a visual inspection for the picture (S6). Herein, the visual inspection includes an inspection which is carried out in use of optical equipment such as a camera and the like.

If the panel defect is detected in the step S6 (YES of S7), the present invention stores the location information of the panel defect area at an inspection computer, and performs correction for compensating the panel defect (S8). The step S8 is substantially the same as the foregoing step S4 except for the W-CVD process among the embodiments of the foregoing repair process.

Subsequently to the step S7 or S8, a drive circuit is mounted on the display panel of after the substrate bonding/liquid crystal injecting process, and the display panel on which the drive circuit is mounted, a backlight and the like are put into a case to perform a module assembly process of the display panel (S9). In the mounting process of the drive circuit, an output terminal of a tape carrier package (hereinafter, referred to as 'TCP') on which ICs such as a gate drive IC and a data drive IC are mounted is connected to a pad part on a substrate, and an input terminal of a tape carrier package is connected to a printed circuit board (hereinafter, referred to as 'PCB') on which a timing controller is mounted. A memory on which the compensation data are to be stored and a compensation circuit which modulates the data that are to be supplied to the display panel in use of the data stored on the memory and which supplies the modulated data to the drive circuit are mounted on the PCB. The memory is a non-volatile memory such as EEPROM (electrically erasable programmable read only memory) where the data can be renewed and erased. On the other hand, the compensation circuit can be embedded in the timing controller by being made into one chip with the timing controller. And, the drive ICs can also be mounted directly on the substrate by a COG (chip-on-glass) method other than a TAB (tape automated bonding) method in use of the tape carrier package.

Subsequently, the test picture is displayed by applying the test data of each gray level to the display panel and the panel defect is detected by the electric/magnetic inspection and/or the visual inspection for the picture (S10). Herein, the visual inspection includes an inspection which is carried out in use of optical equipment such as a camera and the like.

If the panel defect is detected in the step S10 (YES of S11), the location information of the panel defect area is stored on an inspection computer, and a correction for compensating the panel defect is carried out (S12). The step S12 is substantially the same as the foregoing step S4 except for the W-CVD process among the embodiments of the foregoing repair process.

After the steps S11 and S12, the location data and the compensation data of the panel defect determined by the foregoing inspection and correction steps are stored on the EEPROM (S13). The inspection computer supplies the location data and the compensation data to the EEPROM in use of a ROM recorder. The ROM recorder might transmit the location data and the compensation data to the EEPROM through a user connector. The compensation data are transmitted in series through the user connector, and serial clocks, power sources, ground power sources and the like are transmitted to the EEPROM through the user connector.

On the other hand, the memory on which the location data and the compensation data are stored in order to modulate data in the panel defect area, can be EDID ROM (extended display identification data ROM) instead of EEPROM. The EDID ROM stores a monitor information data such as a seller/buyer identification information, the variables and characteristic of the basic display device and the like. And, the EDID ROM stores the location data and the compensation data on a storage space which is separate from the storage space at which the monitor information data are stored. In case of storing the compensation data at the EDID ROM instead of EEPROM, the ROM recorder transmits the compensation data through a DDC (data display channel). Accordingly, the EEPROM and the user connector can be removed if the EDID ROM is used, thus there is an effect that an additional development cost is reduced as much. Hereinafter, an explanation will be made assuming that the memory on which the location data and the compensation data are stored is the EEPROM. Of course, the EEPROM and the user connector can be replaced with EDID ROM and DDC. The memory for storing the location data and the compensation data can be another type of non volatile memory which can renew and erase the data as well as the EEPROM and the EDID ROM.

After the step S13, the test data are modulated in use of the first to fifth compensation data which are stored on the EEPROM, and the panel defect is inspected by the electric/magnetic inspection and/or the visual inspection by applying the modulated test data to the display panel (S14). Herein, the visual inspection includes an inspection which is carried out in use of optical equipment such as a camera and the like.

In case of detecting the panel defect which exceeds a good product reference tolerance as the inspection result of the step S14 (YES of S15), a correction for this is performed (S16). The correction object of the step S16 includes the panel defect which is not found in the above-mentioned inspections, and the panel defect which is not recovered due to the non optimization of the compensation value calculated in the above-mentioned correction steps. For example, in case that the compensation data are not optimized, the compensation data are re-calculated to renew the compensation data stored on the EEPROM. And, in case that the defect pixel is newly detected, a repair process is performed for this to form a link pixel, and the compensation data for this are calculated to be stored on the EEPROM. At this moment, the W-CVD process is excluded from the repair process.

On the other hand, there is a case that a bright line appears on a display screen because the light from a backlight is not uniformly incident to the entire incidence surface of the liquid crystal display panel, and this problem can be solved by adjusting the compensation data in the step S16 in the same manner as the foregoing panel defect even in case of the bright line caused by the backlight.

In case that the picture quality defect is not found as the inspection result of the step S14 (S15[NO]), i.e., if the degree of the picture quality defect is found to be not higher than the good product tolerance reference value, the liquid crystal display device is judged as the good product to be shipped out (S17).

The foregoing inspection steps and correction steps can have a process simplified or a designated step thereof omitted for a rational process such as a simplification of the fabrication process and the like.

Hereinafter, in reference to FIGS. 15 to 19E, a method of determining the compensation data will be explained in detail.

A determining method of the compensation data according to a first embodiment of the present invention is as follows. First of all, the first and second compensation data are for compensating data to be displayed at the panel defect area when the panel defect area and the non-defect area have a brightness difference d between A×ΔL (A is a positive integer) and (A+1)×ΔL, and are determined to be a compensation value of ±A×ΔL. And, the third compensation data are determined to be 0 in the boundary part of the panel defect area and the non-defect area, and the fourth compensation data are determined to be a compensation value of ±K×ΔL (K is a positive integer not greater than A) every other pixel for pixels adjacent to the boundary part and pixels located in the even-numbered lines inclusive of those pixels in the panel defect area. The fourth compensation data are applied to the pixels that are ranging from the first pixel of the defect area which is adjacent to the boundary to the pixels which are apart therefrom by ½ of a distance between the boundary line and the end of the panel defect area. On the other hand, '+' represents an increase in brightness, and '−' represents a decrease in brightness.

Figure 15:
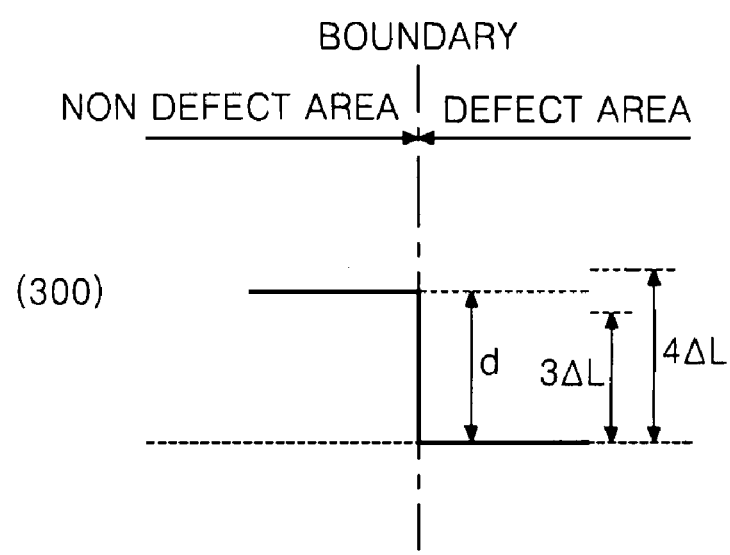
FIGS. 15 to 19E are diagrams representing various embodiments of a compensation data determination method according to the present invention.

For example, as shown in FIG. 15, assuming that the brightness of the panel defect area is lower by 'd' than that of the non-defect area and 'd' is between 3ΔL and 4ΔL, the determining method of the compensation data according to the first embodiment of the present invention proceeds as follows.

Referring to FIG. 16A, a first compensation data 311A is determined to be a compensation value of +3ΔL in the panel defect area, and a third compensation data 312A is determined to be a compensation value of 0 in the panel defect area and the non-defect area. The compensation value of the compensation data for the odd-numbered line of the boundary part and the panel defect area is determined to be the sum 313A of the first compensation data 311A and the third compensation data 312A.

Referring to FIG. 16B, a second compensation data 311B is determined to be the compensation value of +3ΔL in the panel defect area in the same manner as the first compensation data. A fourth compensation data is determined to be the compensation value of 0 in the non-defect area, and +K×ΔL, e.g., a compensation value of +ΔL, for the pixels adjacent to the boundary line, in the panel defect area. The fourth compensation data 312B can be determined by the unit of every other pixel for the pixels which include pixels adjacent to the boundary line and which are apart therefrom at maximum by ½ of a distance between the boundary line and the end of the panel defect area. The compensation value of the compensation data for the even-numbered line of the boundary part and the panel defect area is determined to be the sum of the second compensation data 311B and the fourth compensation data 312B.

Figure 16C:
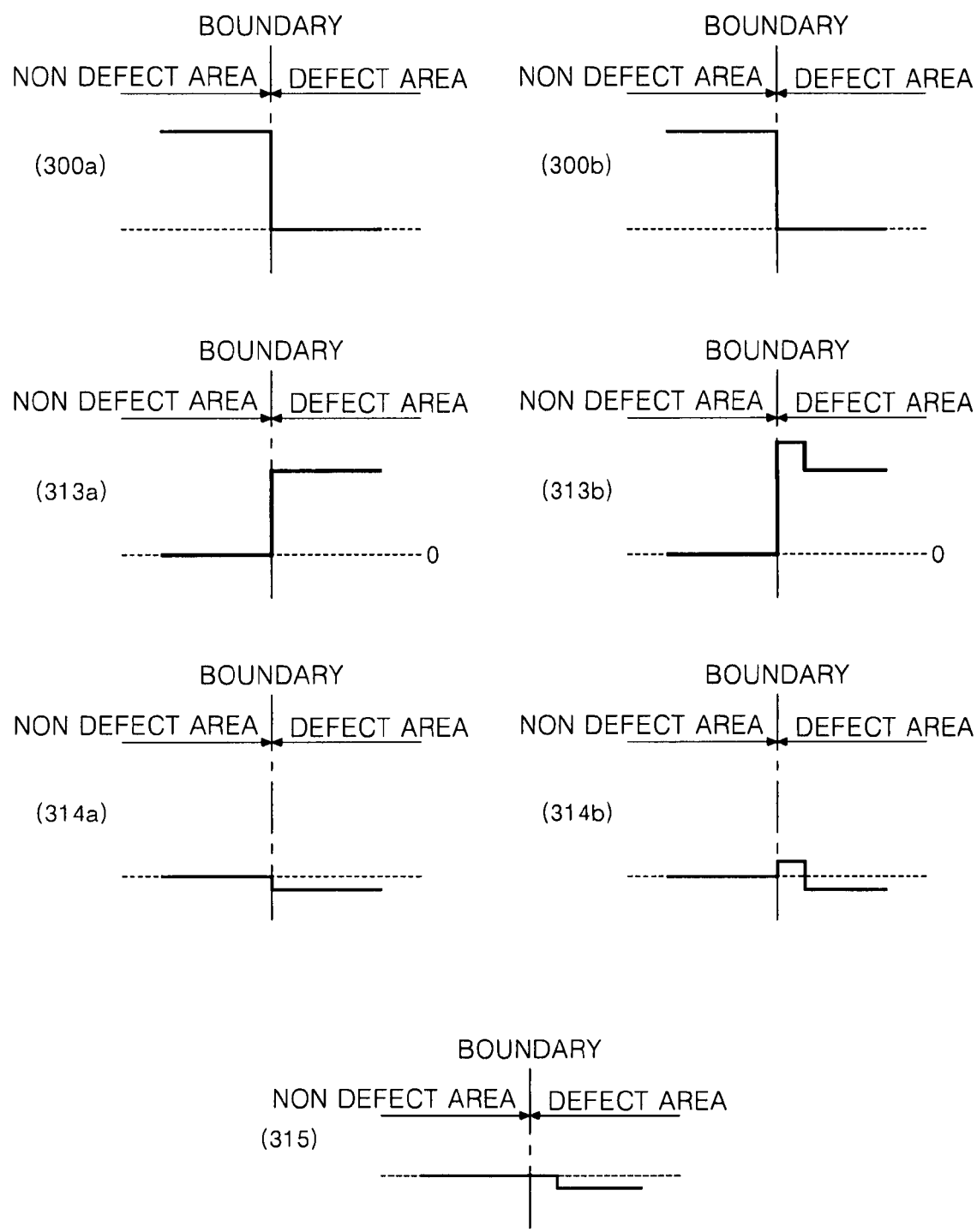

When modulating the digital video data with the first to fourth compensation data determined in this way in the panel defect area and the boundary part, the brightness compensation result of the boundary part and the panel defect area is as shown in FIG. 16C. In the panel defect area and the non-defect area, if the brightness measured in the adjacent odd-numbered line and even-numbered line is like 300A and 300B, the compensation data 313A of the odd-numbered line determined in the same way as FIG. 16A is added to the digital video data to compensate the brightness of the odd-numbered line like 314A. And, the compensation data 313B of the even-numbered line determined in the same way as FIG. 16B is added to the digital video data to compensate the brightness of the even-numbered line like 314B. Accordingly, the average brightness of the adjacent two lines is like 315.

Figure 16D:
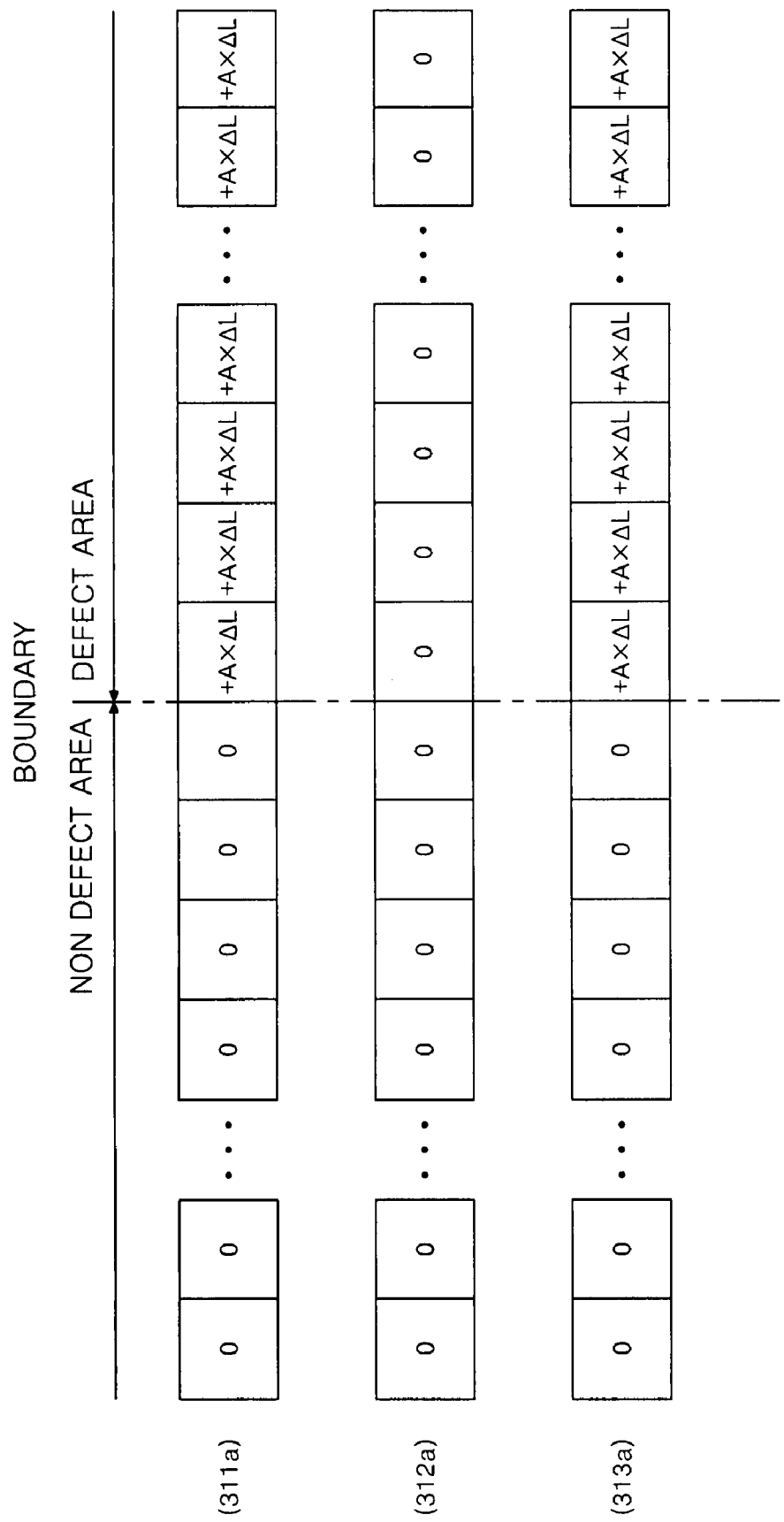
Figure 16F:
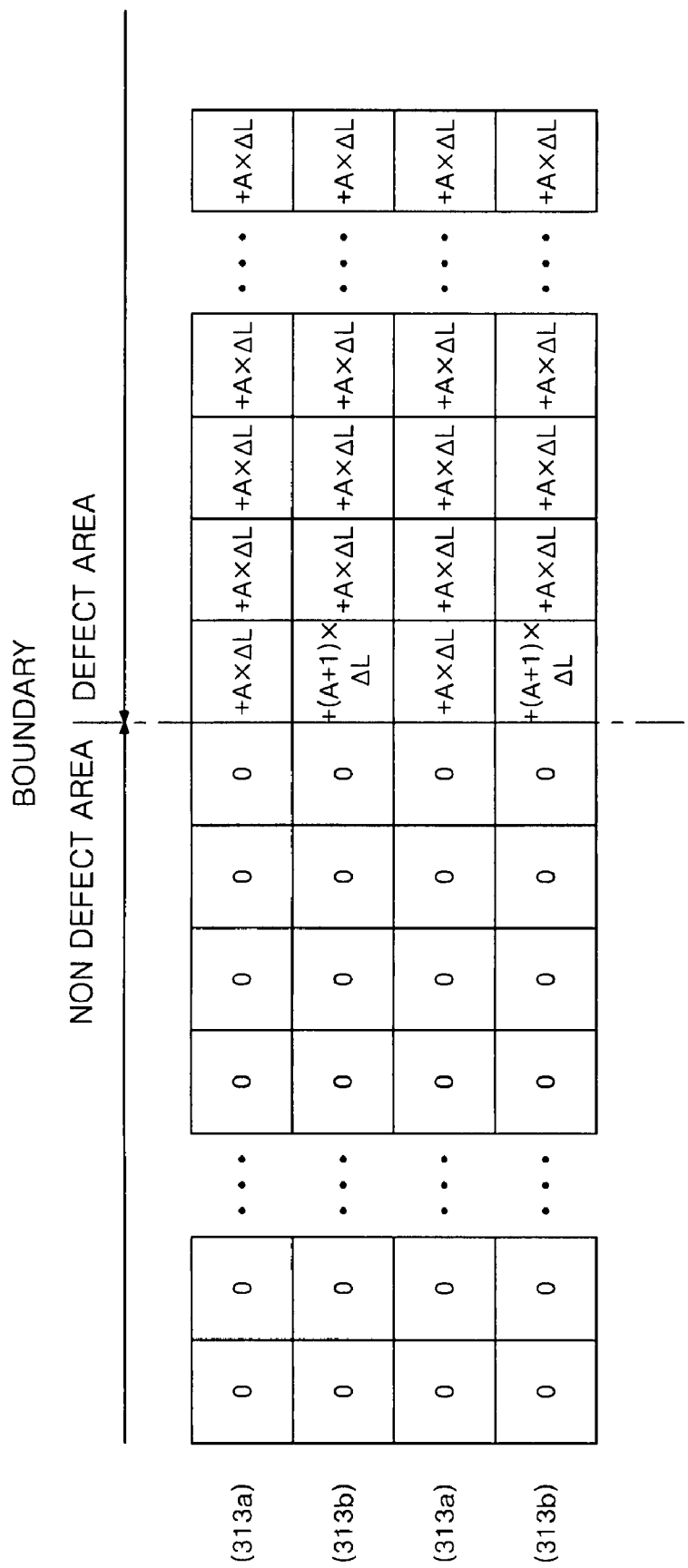

FIGS. 16D to 16F represent specific examples that compensation data are made to correspond to each location of pixels disposed in the boundary part and the panel defect area.

Spaces of quadrangles arranged in the drawings of FIGS. 16D to 16F represent pixels on a display panel, and 'A', '+' and 'ΔL' stated therein are as defined above.

Referring to FIG. 16D, the first compensation data 311A is determined to be the compensation value of '+A×3ΔL' in the panel defect area. Herein, in case that the brightness difference between the panel defect area and the non-defect area is as shown in FIG. 15, A is 3. And, the third compensation data 312A is determined to be the compensation value of 0 in the boundary part and the panel defect area. 313A is the sum of the first compensation data 311A and the third compensation data 312A, and is a final compensation value of the compensation data for the odd-numbered line of the boundary part and the panel defect area.

Referring to FIG. 16E, the second compensation data 311B is determined to be the compensation value of '+A×ΔL' in the panel defect area in the same manner as the first compensation data 311A. The fourth compensation data is determined to be the compensation value of 0 in the non-defect area, and '+ΔL' for the pixels, which are adjacent to the boundary line, i.e., boundary part pixels. 313B is the sum of the second compensation data 311B and the fourth compensation data 312B, and is a final compensation value of the compensation data for the even-numbered line of the boundary part and the panel defect area.

The result that final compensation values 313A, 313B of the odd-numbered and even-numbered lines determined in the boundary part and the panel defect area are applied to the compensation data and the compensation data are mapped to each pixel is as shown in FIG. 16F.

A determining method of the compensation data according to a second embodiment of the present invention is as follows. First of all, the first and second compensation data are for compensating data to be displayed at the panel defect area when the panel defect area and the non-defect area actually measured in the display panel have a brightness difference d between A×ΔL and (A+1)×ΔL, and are determined to be the compensation value of ±A×ΔL. And, the third compensation data to be applied to the odd-numbered line data of the boundary part are determined to be the compensation value of ±K×ΔL every other pixel for pixels which include a part of pixels of the panel defect area in the vicinity of the boundary line and a part of pixels of the vicinity of the non-defect area. The fourth compensation data to be applied to the even-numbered line data of the boundary part are determined to be the compensation value of ±K×ΔL every other pixel for pixels which include a part of pixels of the panel defect area in the vicinity of the boundary line and a part of pixels of the vicinity of the non-defect area. The third fourth compensation data are arranged for the pixels, which are compensated with ±K×ΔL in the odd-numbered line, and the pixels, which are compensated with ±K×ΔL in the even-numbered line adjacent thereto, to be out of joint. That is to say, the third and fourth compensation data are arranged in a check pattern when being mapped to the pixels. The third and fourth compensation data are applied to pixels ranging from one pixel adjacent to the boundary line of the non-defect area and the panel defect area, to the pixels which are apart therefrom by ½ of the distance between the boundary line and the end of the panel defect area.

For example, as shown in FIG. 15, assuming that the brightness of the panel defect area is lower by 'd' than that of the non-defect area and 'd' is between 3ΔL and 4ΔL, the determining method of the compensation data according to the second embodiment of the present invention proceeds as follows.

Referring to FIG. 17A, a first compensation data 321A is determined to be a compensation value of +3ΔL in the panel defect area, and a third compensation data 322A is determined to be a compensation value of +ΔL for the pixels of the non-defect area adjacent to the boundary line of the non-defect area and the panel defect area and the pixels of the panel defect area separated from the pixels with the boundary line therebetween by a gap of every other pixel. The third compensation data 322A can be applied to every other pixel which is ranging from the pixel adjacent to the boundary to the pixels that are apart therefrom by ½ of the distance between the boundary line and the end of the panel defect area. The compensation value of the compensation data for the odd-numbered line of the boundary part and the panel defect area is determined to be the sum 323A of the first compensation data 321A and the third compensation data 322A.

Referring to FIG. 17B, a second compensation data 321B is determined to be the compensation value of +3ΔL in the panel defect area, and a fourth compensation data is determined to be the compensation value of +ΔL, for the pixels of the panel defect area adjacent to the boundary line of the panel defect area and the non-defect area, and the pixels of the non-defect area which are separated from the pixel with the boundary line therebetween by a gap of every other cell. The fourth compensation data 322B can be applied to every other cell which is ranging from the pixels adjacent to the boundary line to the pixels that are apart therefrom by ½ of the distance between the boundary line and the end of the panel defect area. The compensation value of the compensation data for the even-numbered line of the boundary part and the panel defect area is determined to be the sum of the second compensation data 321B and the fourth compensation data 322B.

Figure 17C:
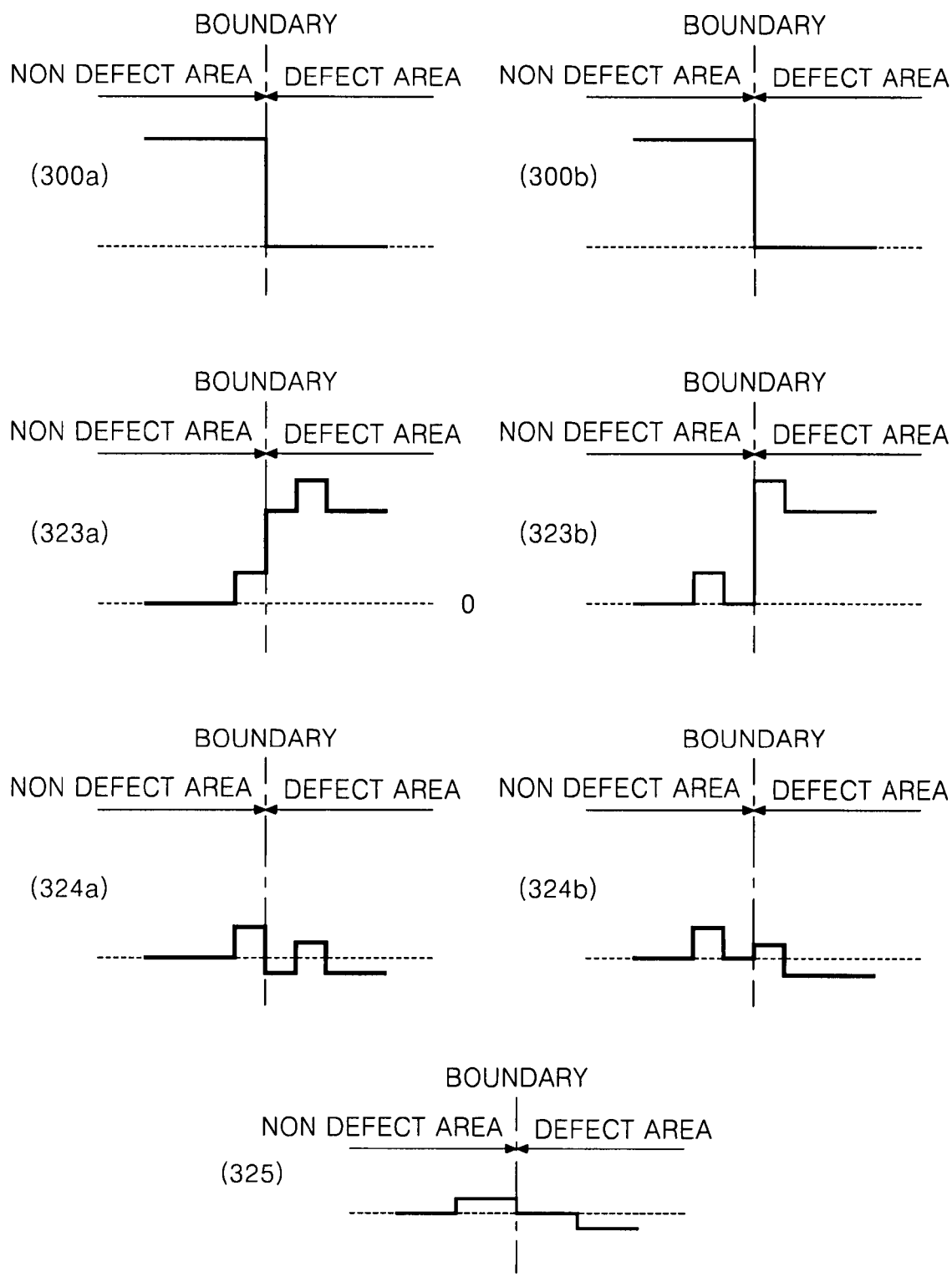

When modulating the digital video data with the first to fourth compensation data determined in this way in the panel defect area and the boundary part, the brightness compensation result of the boundary part and the panel defect area is as shown in FIG. 17C. In the panel defect area and the non-defect area, if the brightness measured in the adjacent odd-numbered line and even-numbered line is like 300A and 300B, the compensation data 323A of the odd-numbered line determined in the same way as FIG. 17A is added to the digital video data to compensate the brightness of the odd-numbered line like 324A. And, the compensation data 323B of the even-numbered line determined in the same way as FIG. 17B is added to the digital video data to compensate the brightness of the even-numbered line like 324B. Accordingly, the average brightness of the adjacent two lines is like 325.

Figure 17E:
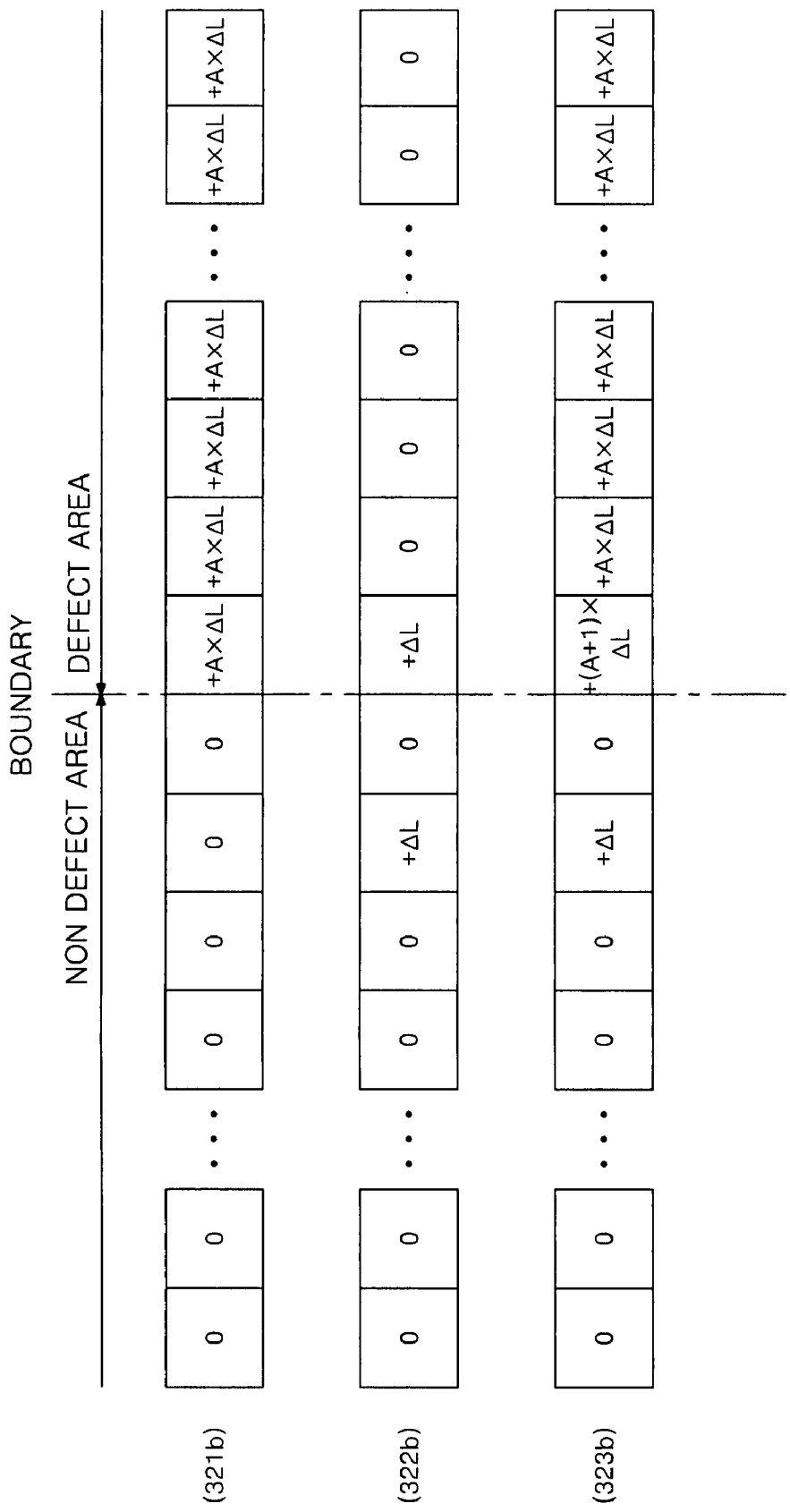
Figure 17F:
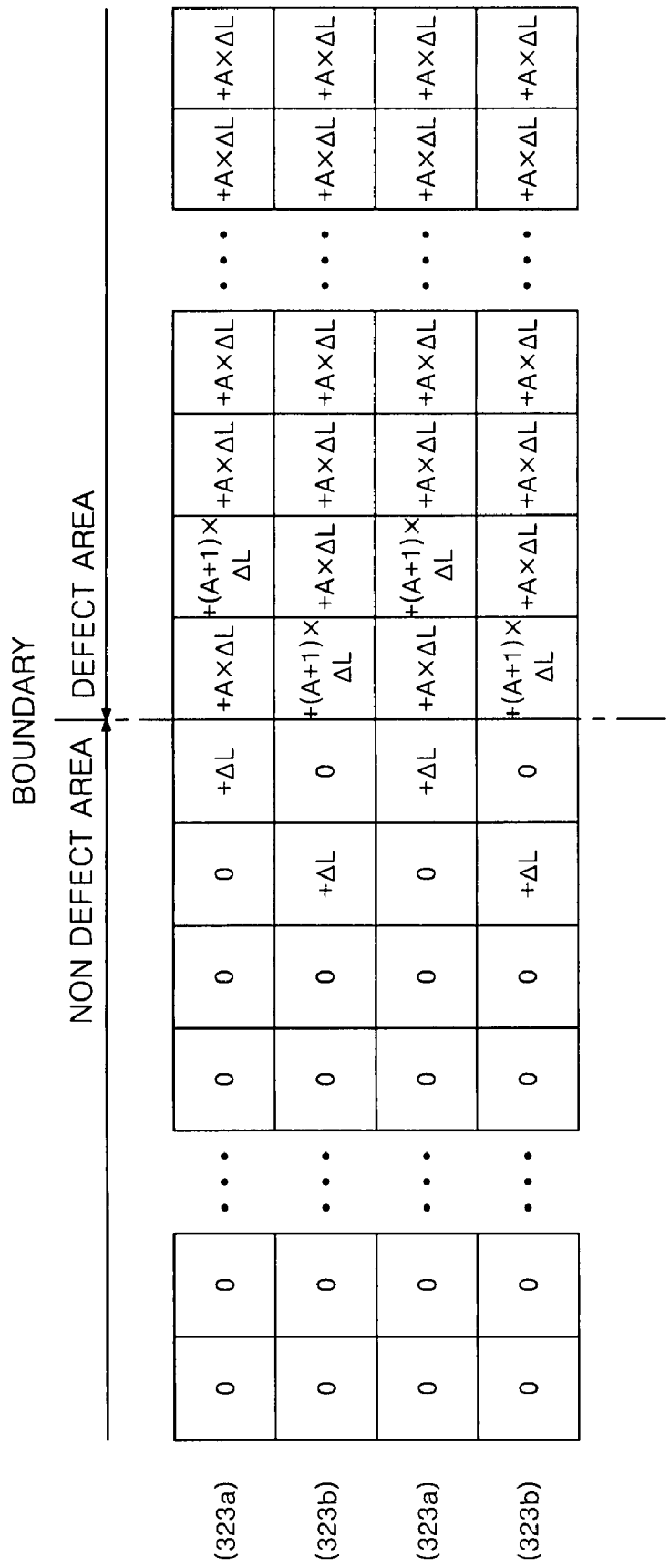

FIGS. 17D to 17F represent specific examples that compensation data are determined to correspond to each location of pixels disposed in the boundary part and the panel defect area.

Referring to FIG. 17D, the first compensation data 321A is determined to be the compensation value of '+A×ΔL' in the panel defect area. Herein, in case that the brightness difference between the panel defect area and the non-defect area is as shown in FIG. 15, A is 3. And, the third compensation data 322A is determined to be '+ΔL' for the pixels which are adjacent to the boundary line in the non-defect area and the pixels which are located apart from the pixels with the boundary therebetween by a gap of every other cell. 323A represents the compensation data for the odd-numbered line of the non-defect area and the panel defect area, which are calculated as the sum of the first compensation data 321A and the third compensation data 322A.

Referring to FIG. 17E, the second compensation data 321B is determined to be the compensation value of '0' in the non-defect area and '+A×ΔL' in the panel defect area in the same manner as the first compensation data 321A. And, the fourth compensation data 322B is determined to '+ΔL' for the pixels which are adjacent to the boundary in the panel defect area and the pixels which are located apart from the pixels with the boundary therebetween by a gap of every other cell. 323B represents the compensation data for the even-numbered line of the non-defect area and the panel defect area, which are calculated as the sum of the second compensation data 321B and the fourth compensation data 322B.

The result of applying the compensation data such as 323A and 323B to the odd-numbered and even-numbered lines of the non-defect area and the defect area is as shown in FIG. 17F.

In a determining method of the compensation data according to a third embodiment of the present invention, when the panel defect are and the non-defect area have a brightness difference d between A×ΔL and (A+1)×ΔL, the first compensation data is determined to be the compensation value of +A×ΔL in the panel defect area and the second compensation data is determined to be the compensation value of +(A+1)×ΔL in the panel defect area. And, the third compensation data is determined to be the compensation value of −K×ΔL for the pixel adjacent to the boundary and to be the compensation value which increases by ΔL for each pixel which gets away from the pixel by a gap of every other pixel, in the panel defect area. And, in the non-defect area, the third compensation data is determined to be the compensation value of +K×ΔL for the pixels which are located apart from the pixel adjacent to the boundary of the panel defect area with the boundary therebetween and to be the compensation value which decreases by ΔL for each pixel which gets away from the pixel by a gap of every other pixel. And, the fourth compensation data is determined to be the compensation value of +K×ΔL for the pixel adjacent to the boundary and to be the compensation value which decreases by ΔL for each pixel which gets away from the pixel by a gap of every other pixel, in the non-defect area. And, in the panel defect area, the fourth compensation data is determined to be the compensation value of −K×ΔL for the pixels which are located apart from the pixel adjacent to the boundary of the panel defect area with the boundary therebetween and to be the compensation value which increases by ΔL for each pixel which gets away from the pixel by a gap of every other pixel. At this moment, the third and fourth compensation data can be determined to the compensation value for pixels ranging from one pixel adjacent to the boundary to pixels which are apart from the boundary by half a distance between both ends of the panel defect area. On the other hand, K can be (½)A. And, the third and fourth compensation data can be determined to be the compensation value which decrease from +K×ΔL in the panel defect area and increases from −K×ΔL in the non-defect area, to the contrary above.

For example, as shown in FIG. 9A, when the brightness of the panel defect area is lower by 'd' than that of the non-defect area and 'd' is a value between 3ΔL and 4ΔL, the determining method of the compensation data according to the third embodiment of the present invention proceeds as follows.

Figure 18A:
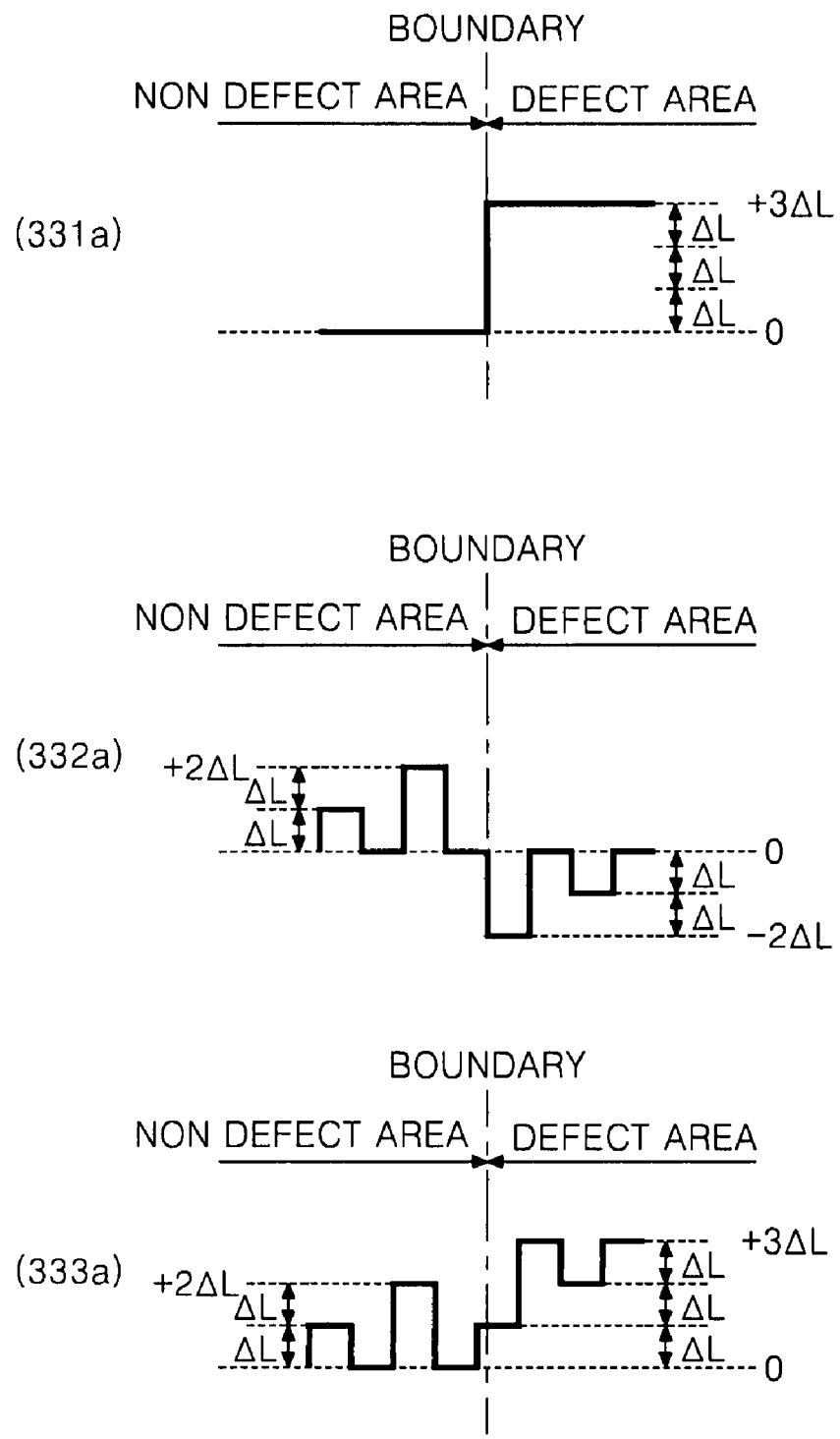

Referring to FIG. 18A, a first compensation data 331A is determined to be a compensation value of +3ΔL in the panel defect area, and a third compensation data 332A is determined to be a compensation value of −2ΔL for the pixels adjacent to the boundary and to be the compensation value which increases by ΔL for each pixel that gets away from the pixel by a gap of every other cell, in the panel defect area. And, in the non-defect area, the third compensation data 332A is determined to be a compensation value of +2ΔL for the pixels which are located apart from the pixel adjacent to the boundary of the panel defect area with the boundary therebetween and to be the compensation value which decreases by ΔL for each pixel that gets away from the pixel by a gap of every other pixel. The third compensation data 332A can be determined every other pixel for pixels which include the above-mentioned pixels and which are apart from the boundary at maximum by half a distance between both ends of the panel defect area. The compensation locations of the first compensation data 331A and the third compensation data 332A are overlapped such that the compensation data for the odd-numbered line of the non-defect area and the panel defect area calculated as the sum of the first compensation data 331A and the third compensation data 332A is like 333A.

Referring to FIG. 18B, a second compensation data 331B is determined to be the compensation value of +4ΔL in the panel defect area, differently from the first compensation data 331A. And, a fourth compensation data 332B is determined to be a compensation value of +2ΔL for the pixels adjacent to the boundary and to be the compensation value which decreases by ΔL for each pixel that gets away from the pixel by a gap of every other cell, in the non-defect area. And, in the panel defect area, the fourth compensation data 332B is determined to be a compensation value of −2ΔL for the pixels which are located apart from the pixel adjacent to the boundary of the non-defect area with the boundary therebetween and to be the compensation value which increases by ΔL for each pixel that gets away from the pixel by a gap of every other pixel. The fourth compensation data 332B can be determined every other pixel for pixels which include the above-mentioned pixels and which are apart from the boundary at maximum by half a distance between both ends of the panel defect area. The compensation locations of the second compensation data 331B and the fourth compensation data 332B are overlapped such that the compensation data for the even-numbered line of the non-defect area and the panel defect area calculated as the sum of the second compensation data 331B and the fourth compensation data 332B is like 333B.

Figure 18C:
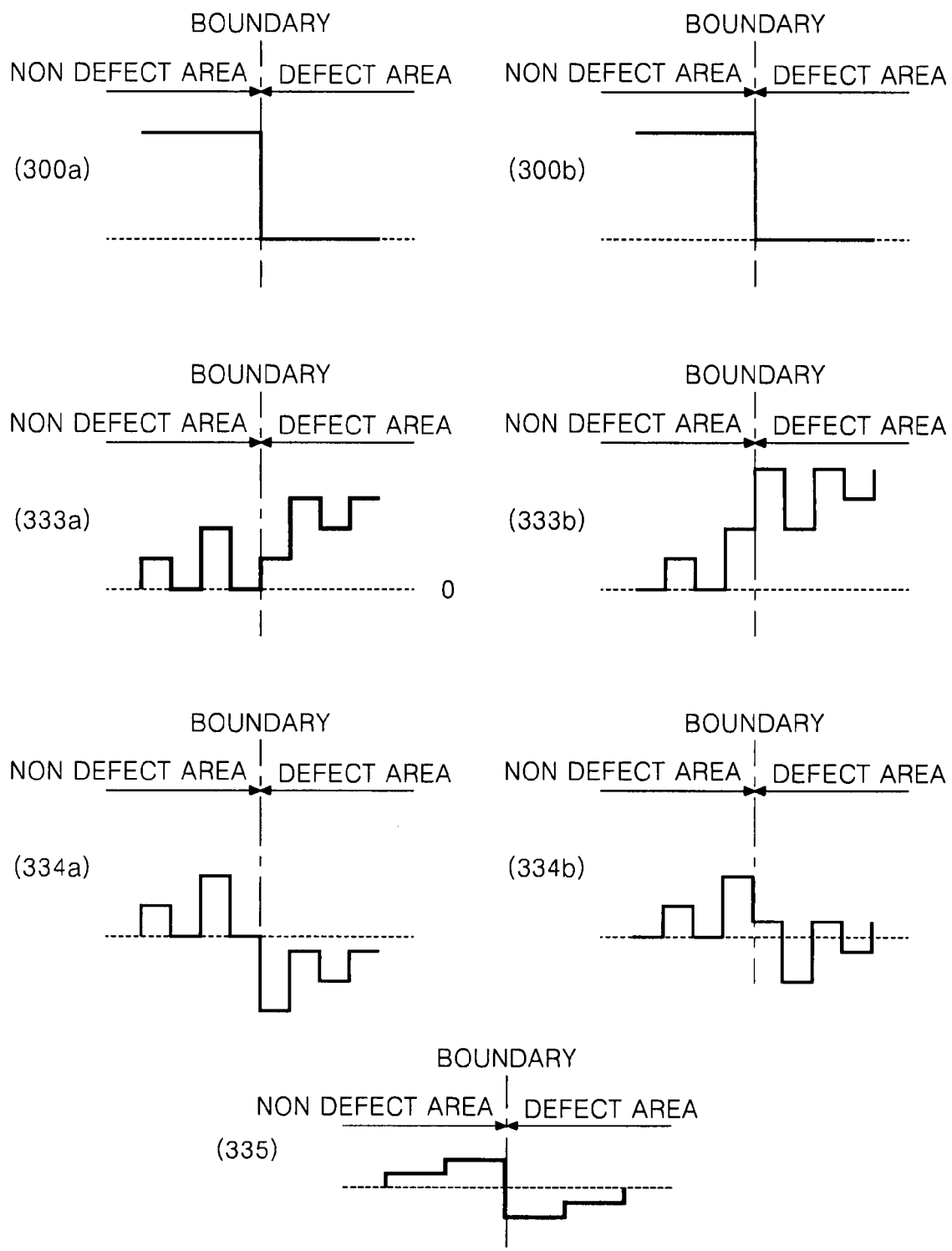

The brightness compensation result of the boundary part and the panel defect area which can be predicted with the first to fourth compensation data determined like this is as shown in FIG. 18C. That is to say, when the brightness measured in the adjacent odd-numbered line and even-numbered line in the panel defect area and the non-defect area is like 300A and 300B, if the brightness of the odd-numbered line is compensated like 334A in use of the compensation data calculated like 333A and the brightness of the even-numbered line is compensated like 334B in use of the compensation data calculated like 333B, the average brightness of the adjacent two lines appearing as a result thereof is like 335.

Figure 18D:
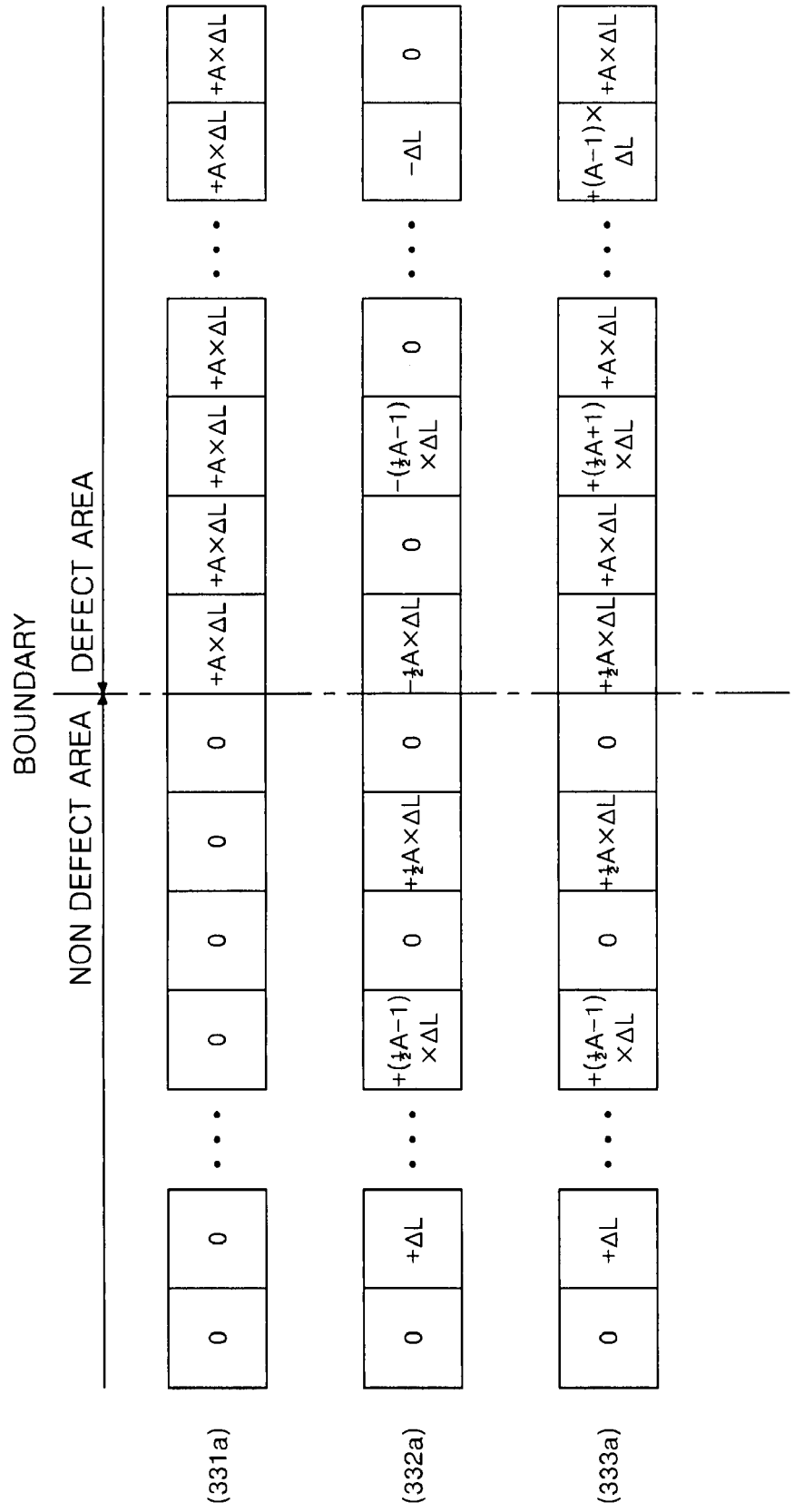
Figure 18E:
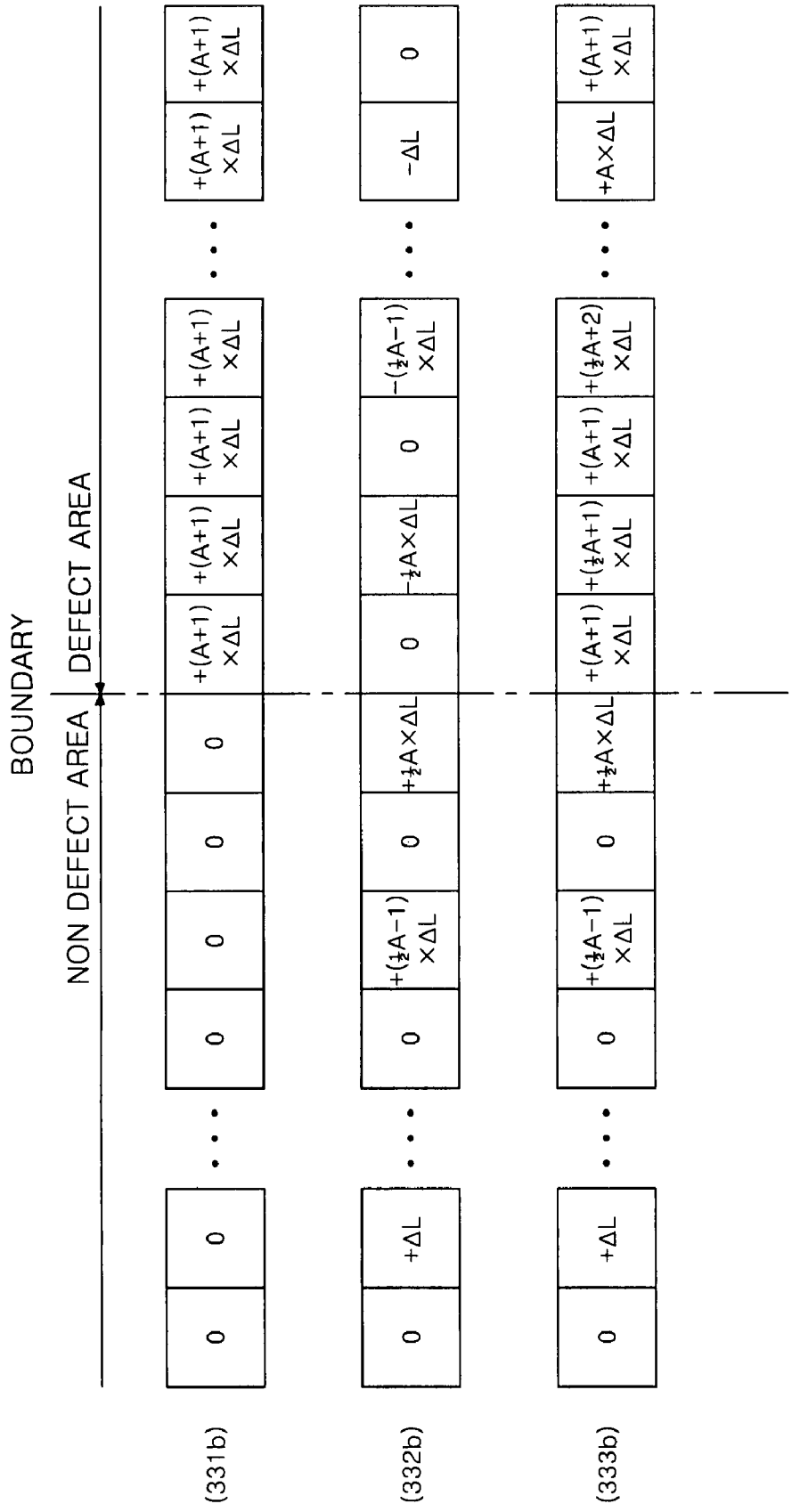

FIGS. 18D to 18F represent specific examples that compensation data are determined to correspond to each location of pixels disposed in the boundary part and the panel defect area.

Referring to FIG. 18D, the first compensation data 331A is determined to be the compensation value of '+A×ΔL' in the panel defect area. Herein, in case that the brightness difference between the panel defect area and the non-defect area is as shown in FIG. 9, A has a value of 3. And, the third compensation data 332A is determined to be the compensation value of −(½)A×ΔL for the pixels which are adjacent to the boundary line and to be the compensation value which increases by ΔL for each pixel that gets away from the pixel by a gap of every other cell, in the panel defect area. And, in the non-defect area, the third compensation data 332A is determined to be a compensation value of +(½)A×ΔL for the pixels which are located apart from the pixel adjacent to the boundary of the panel defect area with the boundary therebetween and to be the compensation value which decreases by ΔL for each pixel that gets away from the pixel by a gap of every other pixel. The third compensation data 332A can be determined every other pixel for pixels which include the above-mentioned pixels and which are apart from the boundary at maximum by half a distance between both ends of the panel defect area. 333A represents a compensation data for the odd-numbered line of the non-defect area and the panel defect area calculated as the sum of the first compensation data 331A and the third compensation data 332A.

Referring to FIG. 18E, the second compensation data 331B is determined to be the compensation value of '+(A+1)×ΔL' in the panel defect area, differently from the first compensation data 331A. And, the fourth compensation data 332B is determined to be a compensation value of +(½)A×ΔL for the pixels adjacent to the boundary and to be the compensation value which decreases by ΔL for each pixel that gets away from the pixel by a gap of every other cell, in the non-defect area. And, in the panel defect area, the fourth compensation data 332B is determined to be a compensation value of −(½)A×ΔL for the pixels which are located apart from the pixel adjacent to the boundary of the non-defect area with the boundary therebetween and to be the compensation value which increases by ΔL for each pixel that gets away from the pixel by a gap of every other pixel. The fourth compensation data 332B can be determined every other pixel for pixels which include the above-mentioned pixels and which are apart from the boundary at maximum by half a distance between both ends of the panel defect area. 333B represents a compensation data for the even-numbered line of the non-defect area and the panel defect area calculated as the sum of the second compensation data 331B and the fourth compensation data 332B.

The result of applying the compensation data such as 333A and 333B to the odd-numbered and even-numbered lines of the non-defect area and the defect area is as shown in FIG. 18F.

FIGS. 19A to 19E represent an example of applying arbitrary numerical values for the determining method of the compensation data according to the third embodiment of the present invention.

Figure 19A:
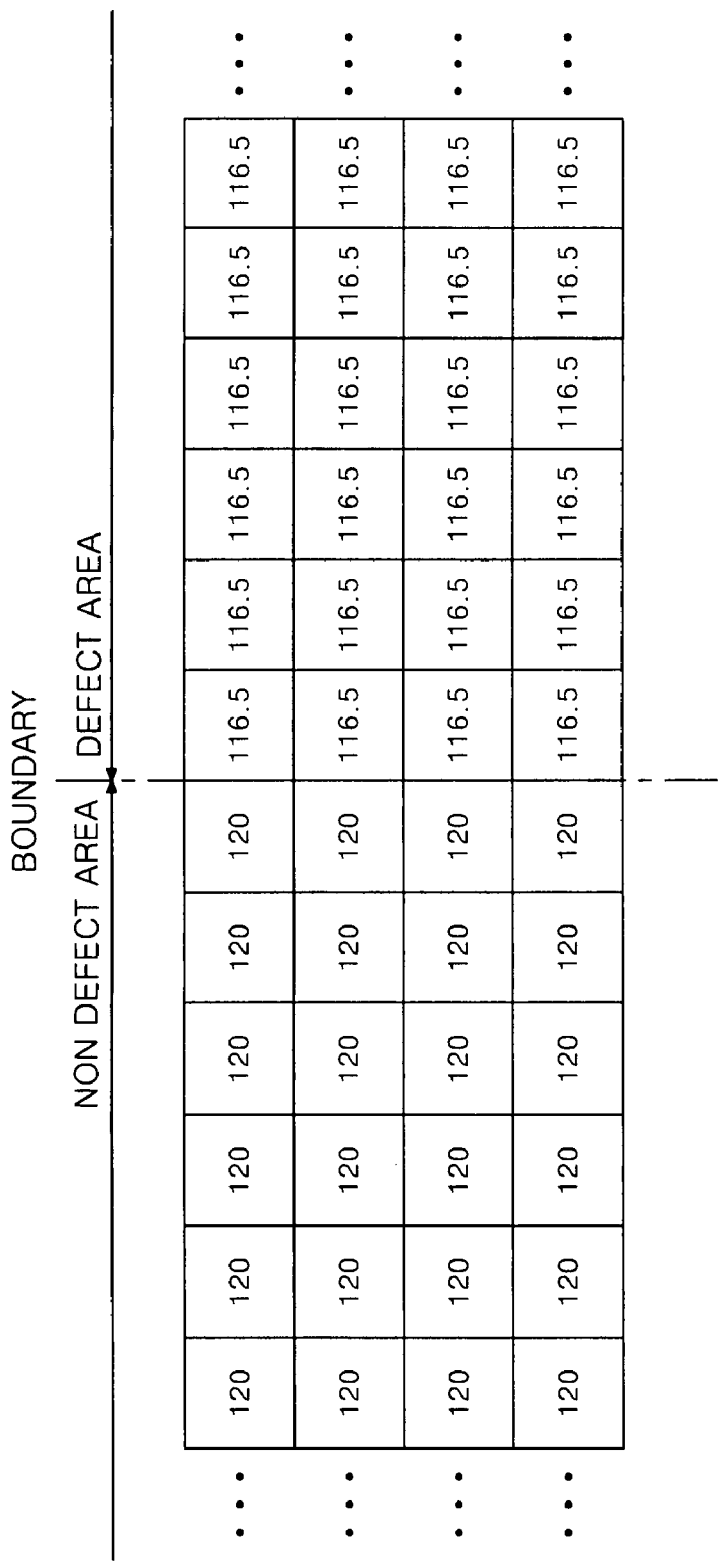

For example, as shown in FIG. 19A, if the brightness of the panel defect area is 116.5 when the brightness of the non-defect area is 120, i.e., if the brightness difference d between the panel defect area and the non-defect area is 3.5 and ΔL has a value of 1, the first compensation data 331A is determined to be the compensation value of '0' in the non-defect area and the compensation value of '+3' in the panel defect area, as shown in FIG. 19B. And, the third compensation data 332A is determined to be the compensation value of −2 for the pixel adjacent to the boundary and to be the compensation value which increases by 1 for each pixel that gets away from the pixel by a gap of every other pixel, in the panel defect area. In the non-defect area, the third compensation data 332A is determined to be the compensation value of +2 for the pixels which are located apart from the pixel adjacent to the boundary of the panel defect area with the boundary therebetween and to be the compensation value which decreases by 1 for each pixel that gets away from the pixel by a gap of every other pixel. 333A represents the compensation data for the odd-numbered line of the non-defect area and the panel defect area calculated as the sum of the first compensation data 331A and the third compensation data 332A.

Referring to FIG. 19C, the second compensation data 331B is determined to be the compensation value of '0' in the non-defect area in the same manner as the first compensation data and the compensation value of '+4' in the panel defect area. And, the fourth compensation data is determined to be a compensation value of +2×ΔL for the pixels adjacent to the boundary and to be the compensation value which decreases by 1 for each pixel that gets away from the pixel by a gap of every other cell, in the non-defect area. And, in the panel defect area, the fourth compensation data 332B is determined to be the compensation value of −2 for the pixels which are located apart from the pixel adjacent to the boundary of the non-defect area with the boundary therebetween and to be the compensation value which increases by 1 for each pixel that gets away from the pixel by a gap of every other pixel. The fourth compensation data 332B can be determined every other pixel for pixels which include the above-mentioned pixels and which are apart from the boundary at maximum by half a distance between both ends of the panel defect area. 333B represents the compensation data for the even-numbered line of the non-defect area and the panel defect area calculated as the sum of the second compensation data 331B and the fourth compensation data 332B.

Figure 19E:
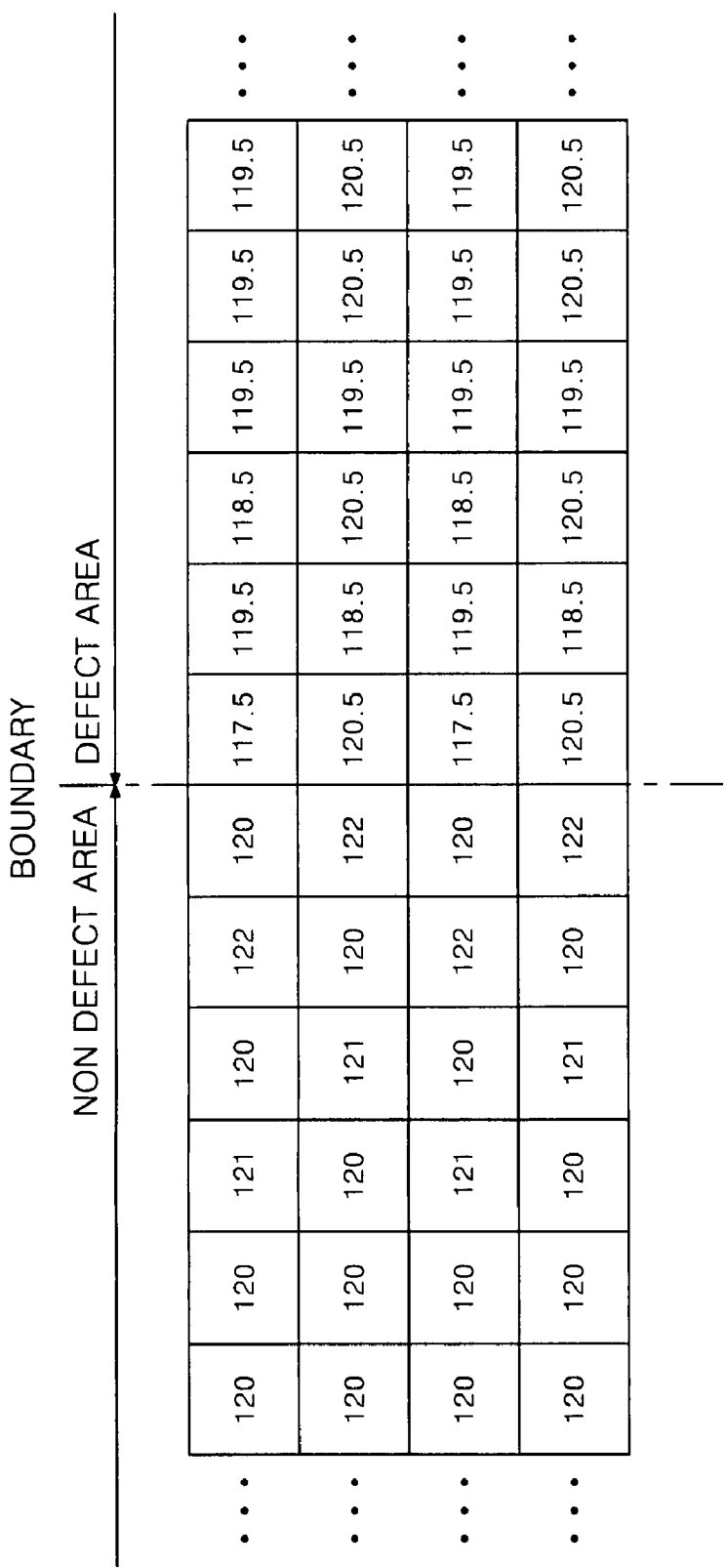

The result of applying the compensation data such as 333A and 333B to the odd-numbered and even-numbered lines of the non-defect area and the defect area is as shown in FIG. 19D, and the brightness compensation result of the boundary part and the panel defect area which can be predicted with the first to fourth compensation data determined like this is as shown in FIG. 19E.

And, the determining method of the compensation data of the present invention determines the fifth compensation data to be the compensation value of ±K×ΔL for the link pixel. In case that the location of the link pixel overlaps the location of the boundary part or the panel defect area described above, the compensation data is added up with other compensation data for the overlapping location in the same manner as the foregoing first and third compensation data or second and fourth compensation data.

On the other hand, in the foregoing embodiments, the description was made centering on that the compensation data are calculated by way of sequentially going through all the foregoing steps, however, for the sake of rational processes such as the simplification of fabrication process and the like, the patterns of a plurality of standardized compensation data corresponding to various patterns of boundary noises and defects are put into database by repeated experiments in a real mass production process, thus it is possible to calculate optimal compensation data at one time by selecting the optimal compensation data patterns corresponding to the brightness difference type of the boundary area and the defect area among the standardized patterns after the simple inspection process.

Hereinafter, a picture quality controlling method according to the embodiment of the present invention will be explained.

The picture quality controlling method according to the embodiment of the present invention includes a compensation step of modulating the data to be displayed in the panel defect area, the boundary part and the link pixel, in use of the compensation data which are stored on the memory after being calculated by the process described above.

The compensation step according to a first embodiment of the present invention increases or decreases the data to be supplied to the panel defect area, the boundary part and the link pixel, with the compensation data. For example, in case that the charge characteristic compensation data for each location and for each gray level for the panel defect area, the boundary part and the link pixel are determined as in TABLE 1 below, the compensation step according to the first embodiment of the present invention, for example, modulates the data to be supplied to 'location 1', to '01000110(70)' by adding '00000110(6)' to '01000000(64)' if the data to be supplied to 'location 1' is '01000000(64)' corresponding to 'gray level section 2', and modulates the data to be supplied to 'location 2', to '10000110(134)' by adding '00000110(6)' to '10000000(128)' if the data to be supplied to 'location 2' is '10000000(128)' corresponding to 'gray level section 3'.

TABLE 1

| Classification | Gray level area | Location 1 | Location 2 |
|---|---|---|---|
| Gray level section 1 | 00000000(0) ~00110010(50) | 00000100(4) | 00000010(2) |
| Gray level section 2 | 00110011(51) ~01110000(112) | 00000110(6) | 00000100(4) |
| Gray level section 3 | 01110001(113) ~10111110(190) | 00001000(8) | 00000110(6) |

The compensation step according to a second embodiment of the present invention converts R/G/B data of m/m/m bits inclusive of red R, green G and blue B information to be displayed in the panel defect area, the boundary part and the link pixel, into Y/U/V data of n/n/n (herein, n is an integer larger than m) bits inclusive of brightness Y and color difference U/V information; modulates the Y data to be displayed in the panel defect area and the boundary part, among the converted Y/U/V data of n/n/n bits with the compensation data by increasing or decreasing the Y data; and then converts the Y/U/V data of n/n/n bits back into the R/G/B data of m/m/m bits inclusive of red R, green G and blue B information. For example, the R/G/B data of 8/8/8 bits are converted into the Y/U/V data of 10/10/10 bits; the compensation data is added to or subtracted from the extended bits of the Y data when converting the R/G/B data into the Y/U/V data; and then the Y/U/V data of 10/10/10 bits where the Y data is increased or decreased are converted back into the R/G/B data of 8/8/8 bits.

For example, in case that the compensation data for each location and for each gray level for the panel defect area, the boundary part and the link pixel are determined as in TABLE 2 below, the R/G/B data of 8/8/8 bits to be supplied to 'location 1' are converted into Y/U/V data of 10/10/10 bits; the Y data are modulated by adding '10(2)' to the lower 2 bits of the Y data if the upper 8 bits of the converted Y data is '01000000 (64)' corresponding to 'gray level section 2'; and the Y/U/V data inclusive of the modulated Y data are converted back into the R/G/B data of 8/8/8 bits, thereby modulating the data. And, the R/G/B data of 8/8/8 bits to be supplied to 'location 4' are converted into Y/U/V data of 10/10/10 bits; the Y data are modulated by adding '11(3)' to the lower 2 bits of the Y data if the upper 8 bits of the converted Y data is '10000000(128)' corresponding to 'gray level section 3'; and the Y/U/V data inclusive of the modulated Y data are converted back into the R/G/B data of 8/8/8 bits, thereby modulating the data. On the other hand, a conversion method between the R/G/B data and the Y/U/V data will be described in detail in the explanation for the picture quality controlling method of the liquid crystal display device according to the present invention to be described later.

TABLE 2

| Classification | Gray level area | Location 1 | Location 2 | Location 3 | Location 4 |
| --- | --- | --- | --- | --- | --- |
| Gray level section 1 | 00000000(0)~00110010(50) | 01(1) | 00(0) | 01(1) | 01(1) |
| Gray level section 2 | 00110011(51)~01110000(112) | 10(2) | 00(0) | 01(1) | 10(2) |
| Gray evel section 3 | 01110001(113)~10111110(190) | 11(3) | 01(1) | 10(2) | 11(3) |
| Gray evel section 4 | 10111111(191)~11111010(250) | 00(0) | 01(1) | 10(2) | 11(3) |

As described above, the compensation step according to the second embodiment of the present invention converts the RGB video data to be displayed in the panel defect area, the boundary part and the link pixel, into the brightness component and the hue component by noticing a fact that the human eyes are more sensitive to the brightness difference than to the hue difference; extends the number of bits of the Y data which includes the brightness information among them; and modulates the brightness of the panel defect area, the boundary part and the link pixel, thus there is an advantage in that the brightness can be adjusted in detail.

The compensation step according to a third embodiment of the present invention disperses the compensation data to a plurality of frames in use of a frame rate control FRC method, and increases or decreases the video data to be displayed in the panel defect area, the boundary part and the link pixel, with the compensation data which are dispersed to a plurality of frames. Herein, the frame rate control is an image control method using an integration effect of a visual sense, and is a picture quality controlling method in which the pixels representing different hues or gray levels are temporally arranged to make an image that expresses the hue and gray level therebetween. And, the temporal arrangement of the pixels takes a frame period as a unit. The frame period is also known as a field period and is a display period of one screen when the data are applied to all the pixels of one screen, and the frame period is standardized to be 1/60 seconds in case of an NTSC system and 1/50 seconds in case of a PAL system.

The compensation step according to a fourth embodiment of the present invention disperses the compensation data to a plurality of adjacent pixels in use of a dithering method, and increases or decreases the data to be supplied to the panel defect area, the boundary part and the link pixel, in use of the compensation data dispersed to a plurality of pixels. Herein, the dithering is an image control method using an integration effect of a visual sense, and is a picture quality controlling method in which the pixels representing different hues or gray levels are spatially arranged to make an image that expresses the hue and gray level therebetween.

The compensation step according to a fifth embodiment of the present invention disperses the compensation data to a plurality of frames in use of a frame rate control method; disperses the compensation value to a plurality of adjacent pixels in use of a dithering method; and increases or decreases the data to be supplied to the panel defect area, the boundary part and the link pixel, in use of the compensation data dispersed to the frames and the pixels.

The frame rate control method and the dithering method will be explained in reference to FIGS. 20 to 23.

Figure 20:
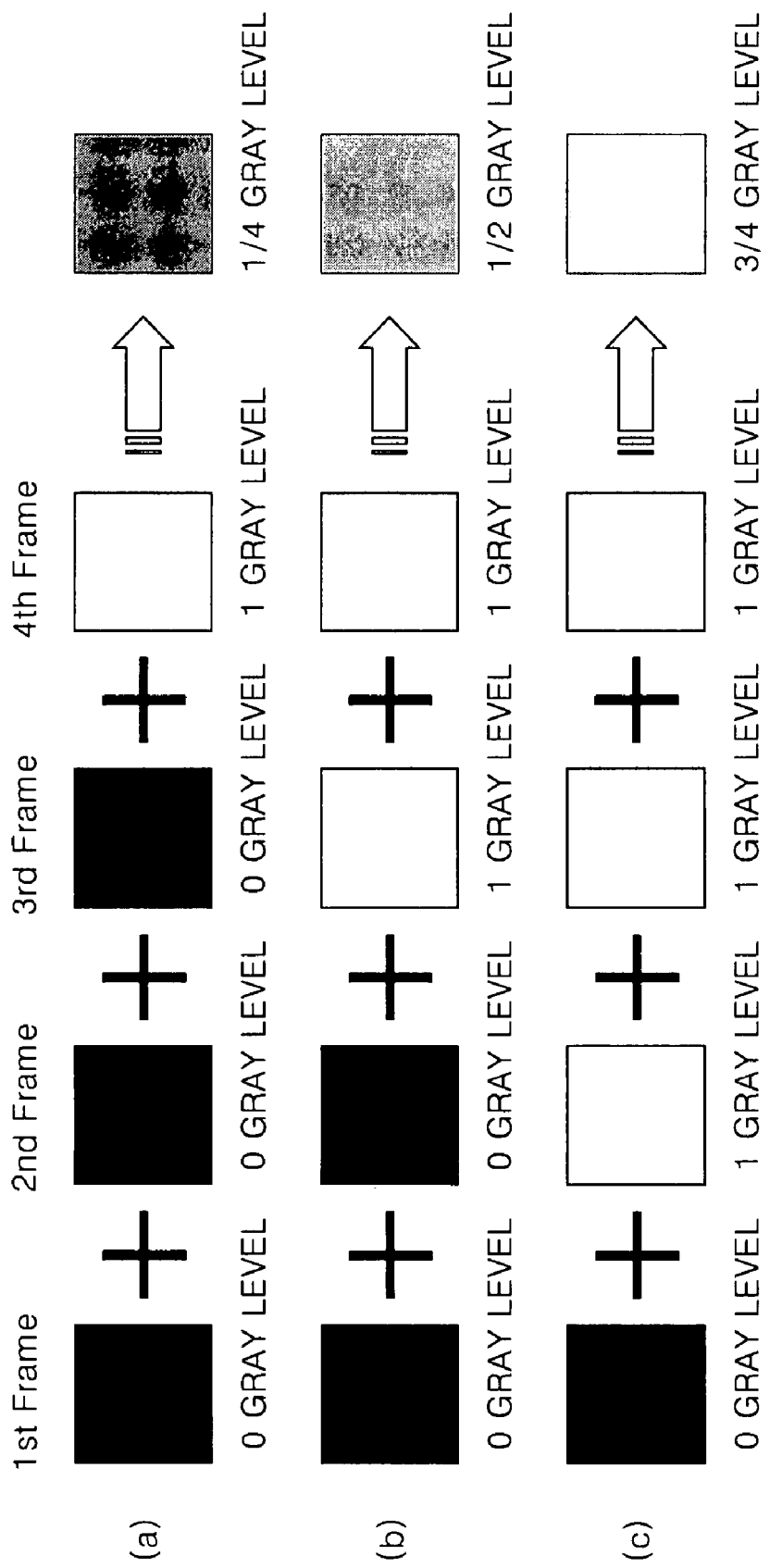
FIG. 20 is a diagram for explaining a picture quality controlling method according to a frame rate control method of the present invention.

In case of expressing an intermediate gray level such as 1/4 gray level, 1/2 gray level, 3/4 gray level and the like in a screen composed of pixels which can only display 0 gray level and 1 gray level; in the frame rate control method, if '1' is added to the digital data corresponding to any one pixel for one frame period among four frame periods which continue sequentially by taking four frames as one frame group, as shown in (a) of FIG. 20, an observer perceives +1/4 gray level of the digital data in the pixel. As shown in (b) of FIG. 20, if '1' is added to the digital data corresponding to any one pixel for two frame periods among four frame periods, the observer perceives +1/2 gray level of the digital data in the pixel. As shown in (c) of FIG. 20, if '1' is added to the digital data corresponding to any one pixel for three frame periods among four frame periods, the observer perceives +3/4 gray level of the digital data in the pixel.

Figure 21:
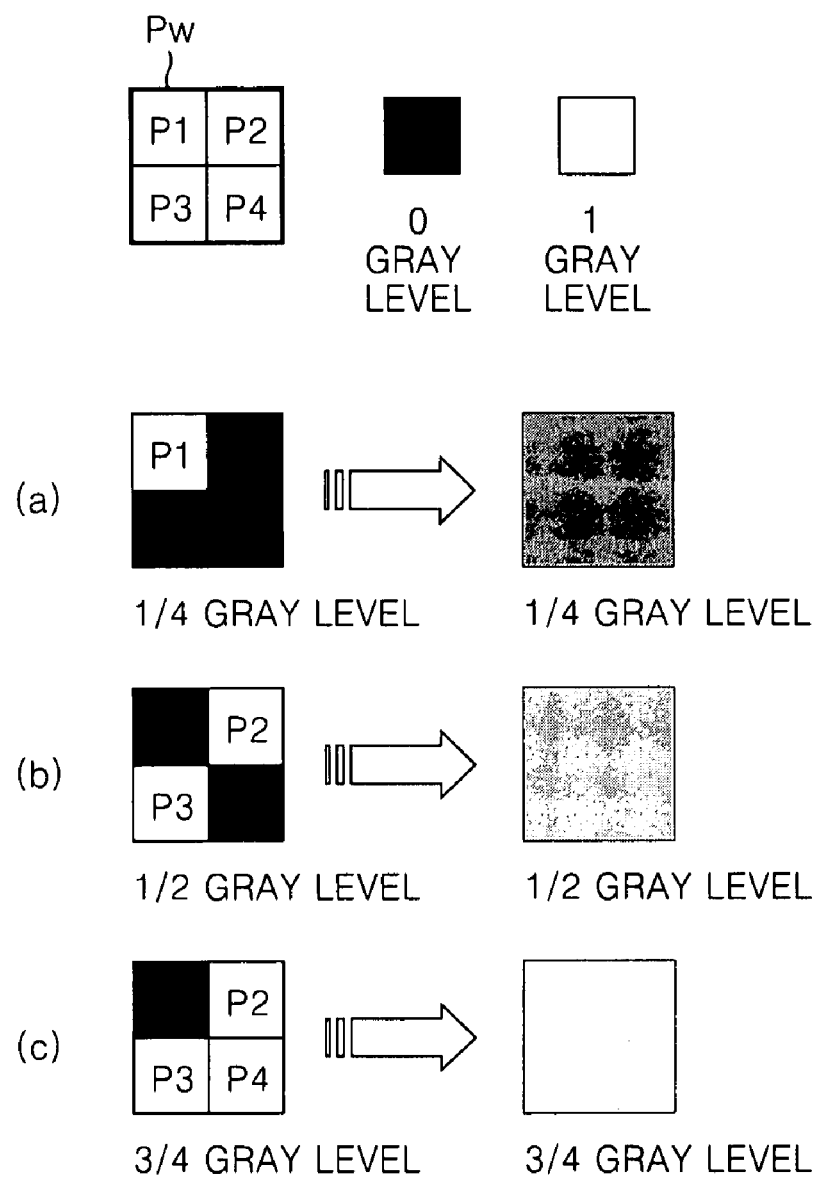
FIG. 21 is a diagram for explaining a picture quality controlling method according to a dithering method of the present invention.

In the dithering method, if '1' is added to the digital data corresponding to one pixel among four pixels in a dither pattern Pw having a 2×2 pixel structure, i.e., taking four pixels as one pixel group, as shown in (a) of FIG. 21, the observer perceives +1/4 gray level of the digital data from the dither pattern Pw. As shown in (b) of FIG. 21, if '1' is added to the digital data corresponding to two pixels among four pixels in the dither pattern Pw, the observer perceives +1/2 gray level of the digital data from the dither pattern Pw. As shown in (c) of FIG. 21, if '1' is added to the digital data corresponding to three pixels among four pixels in the dither pattern Pw, the observer perceives +3/4 gray level of the digital data from the dither pattern Pw.

Figure 22:
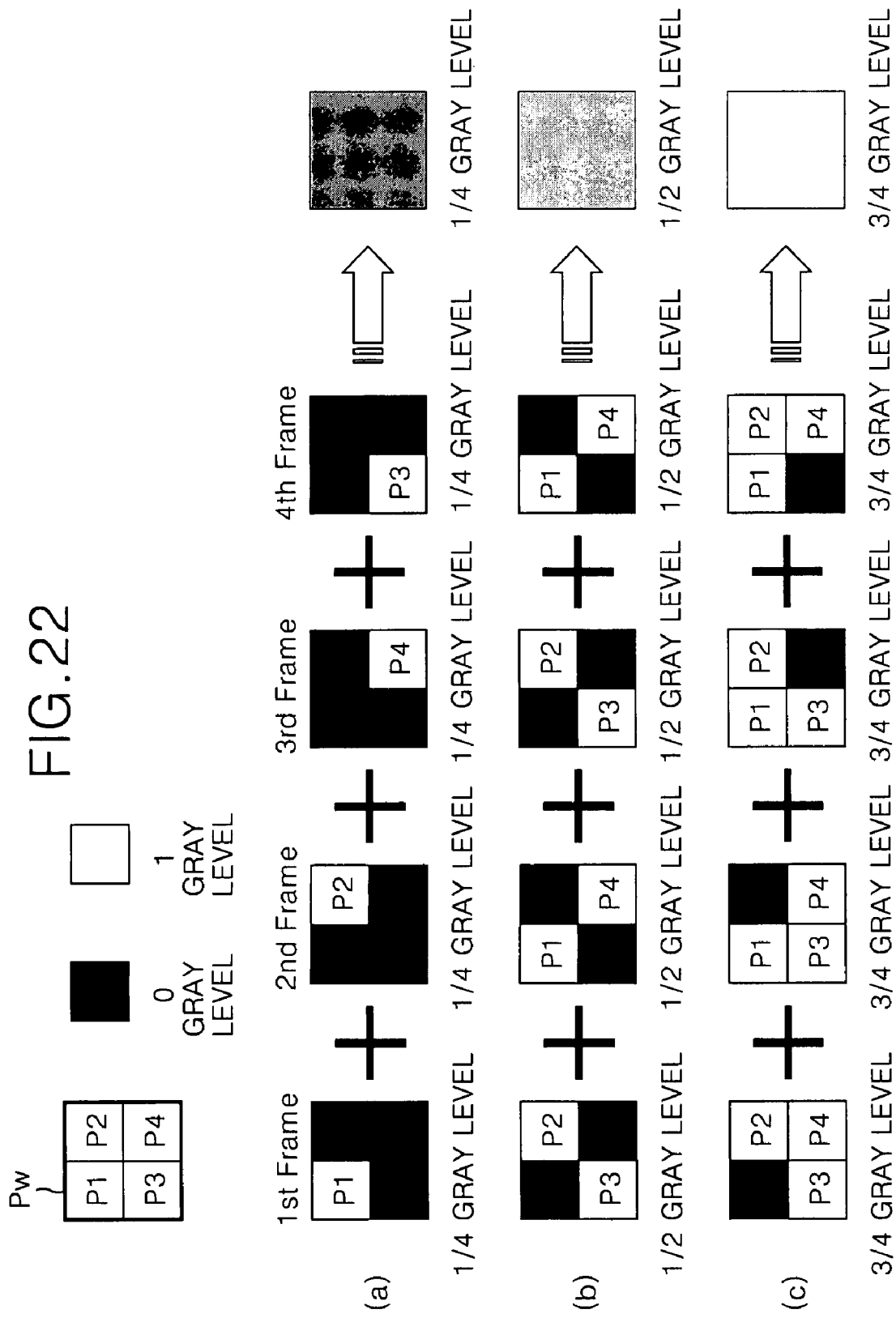
FIG. 22 is a diagram for explaining a picture quality controlling method according to a frame rate control/dithering method of the present invention.

As a method of using the frame rate control method and the dithering method together, FIG. 22 represents that an intermediate gray level is expressed by simultaneously applying a dither pattern which takes a 2×2 pixel structure as one pixel group and a frame rate control which takes four frame periods as a unit for the dither pattern. If the 2×2 dither pattern and the frame rate control taking four frame periods as a unit like this, the gray level expressed by the 2×2 dither pattern for the four frame periods is 1/4 gray level, as shown in (a) of FIG. 22, thus an observer perceives 1/4 gray level from the 2×2 dither pattern for the four frame periods. As shown in (b) of FIG. 22, the gray level expressed by the 2×2 dither pattern for the four frame periods is 1/2 gray level, thus an observer perceives 1/2 gray level from the 2×2 dither pattern for the four frame periods. As shown in (c) of FIG. 22, the gray level expressed by the 2×2 dither pattern for the four frame periods is 3/4 gray level, thus an observer perceives 3/4 gray level from the 2×2 dither pattern for the four frame periods.

The picture quality controlling method which applies the frame rate control and the dithering together like this has an advantage in that it is possible to solve problems of a resolution deterioration which might occur in the dithering and a flicker which might occur in the frame rate control.

Figure 23:
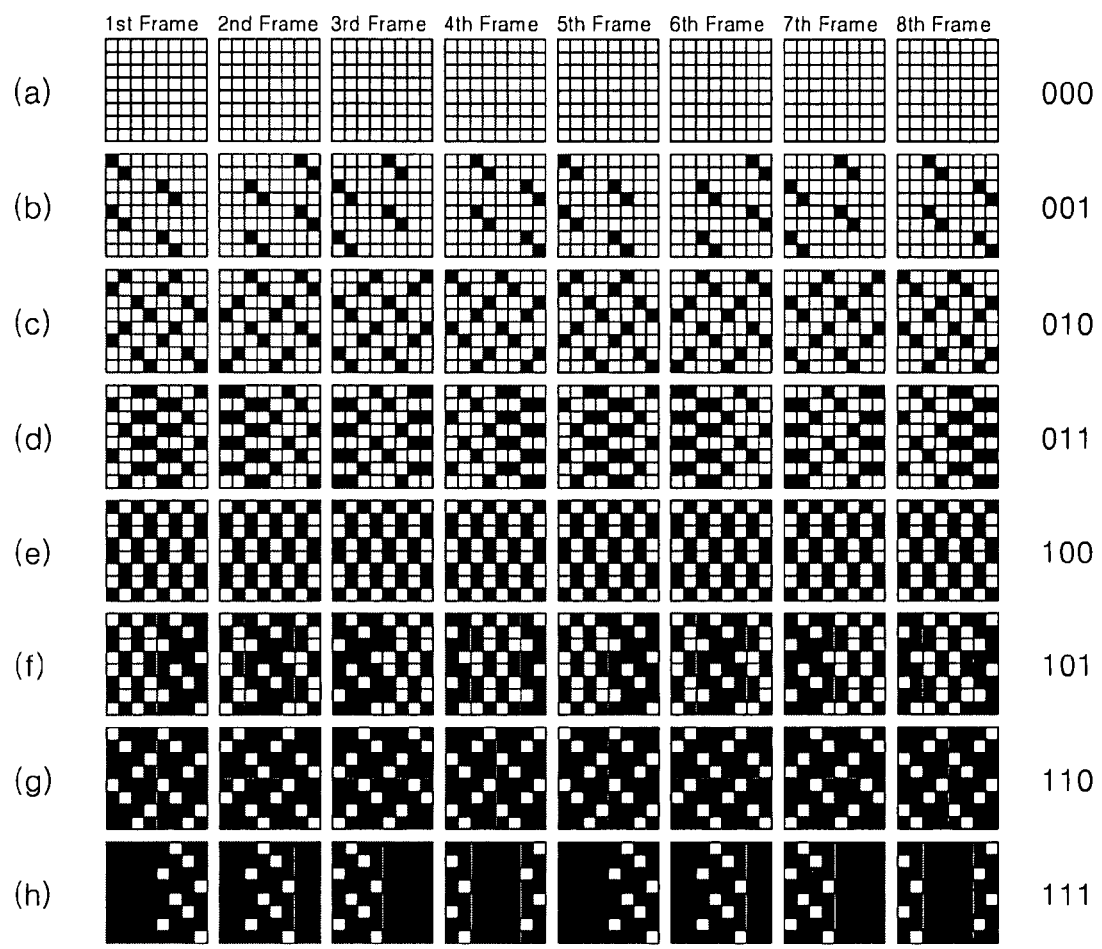
FIG. 23 is a diagram for explaining a picture quality controlling method according to a frame rate control method in use of 8×8 dither patterns of the present invention.

The number of frames which constitute a frame group in the frame rate control or the size of a dither pattern and the number and locations of the compensation pixels within the dither pattern can be adjusted in various ways. FIG. 23 is an exemplary diagram representing a method of performing a frame rate control on a dither pattern of 8 (pixel)×8 (pixel) by taking 8 frames as a unit.

For example, in case that the compensation data for each location and for each gray level for the panel defect area, the boundary part and the link pixel are determined as in TABLE 3 below, the digital video data to be supplied to 'location 1' are modulated by performing the frame rate control and dithering with a pattern shown in (d) of FIG. 23 in use of the compensation data of '011(3)' if the digital video data to be supplied to 'location 1' are '01000000(64)' corresponding to 'gray level section 2'; and the digital video data to be supplied to 'location 4' are modulated by performing the frame rate control and dithering with a pattern shown in (g) of FIG. 23 in use of the compensation data of '110(6)' if the digital video data to be supplied to 'location 4' are '10000000(128)' corresponding to 'gray level section 3'.

Figure 25A:
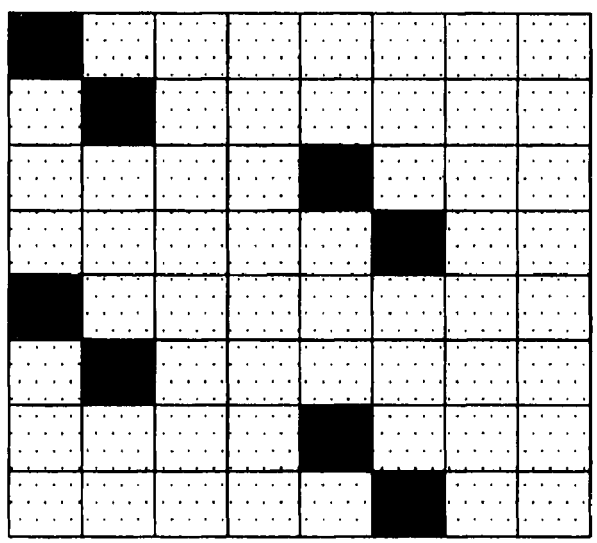
FIGS. 25A to 25D are diagrams representing sub-dither patterns disposed within a ⅛ dither pattern shown in FIG. 24A.
Figure 25B:
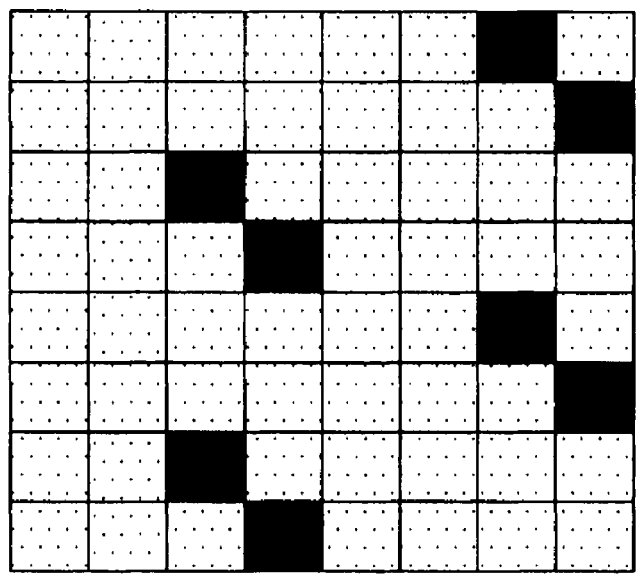
Figure 25C:
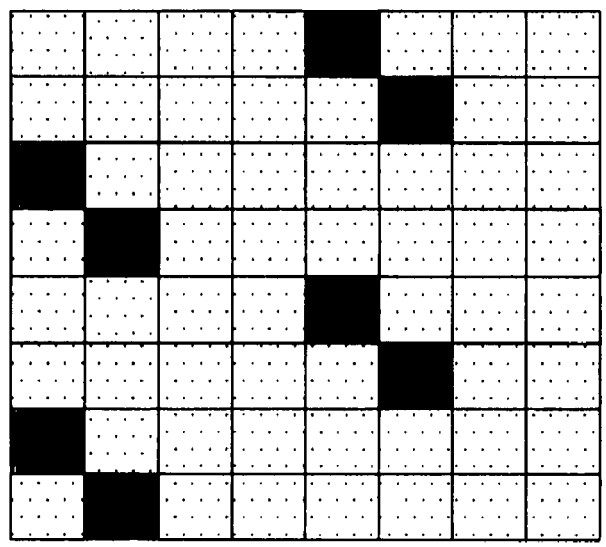
Figure 25D:
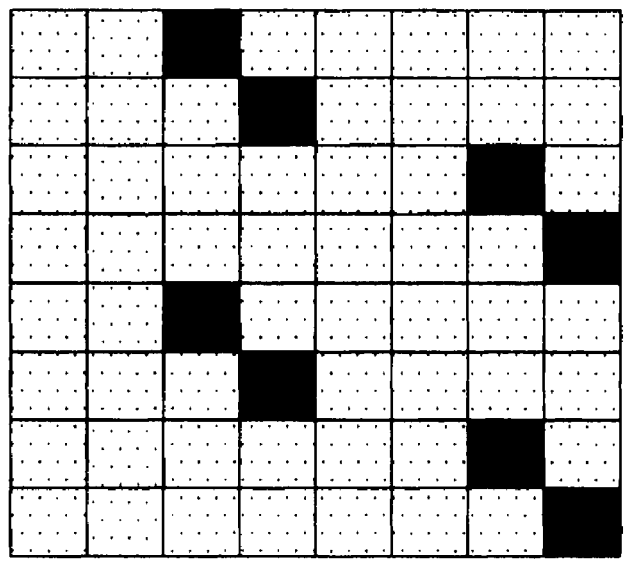
Figure 26A:
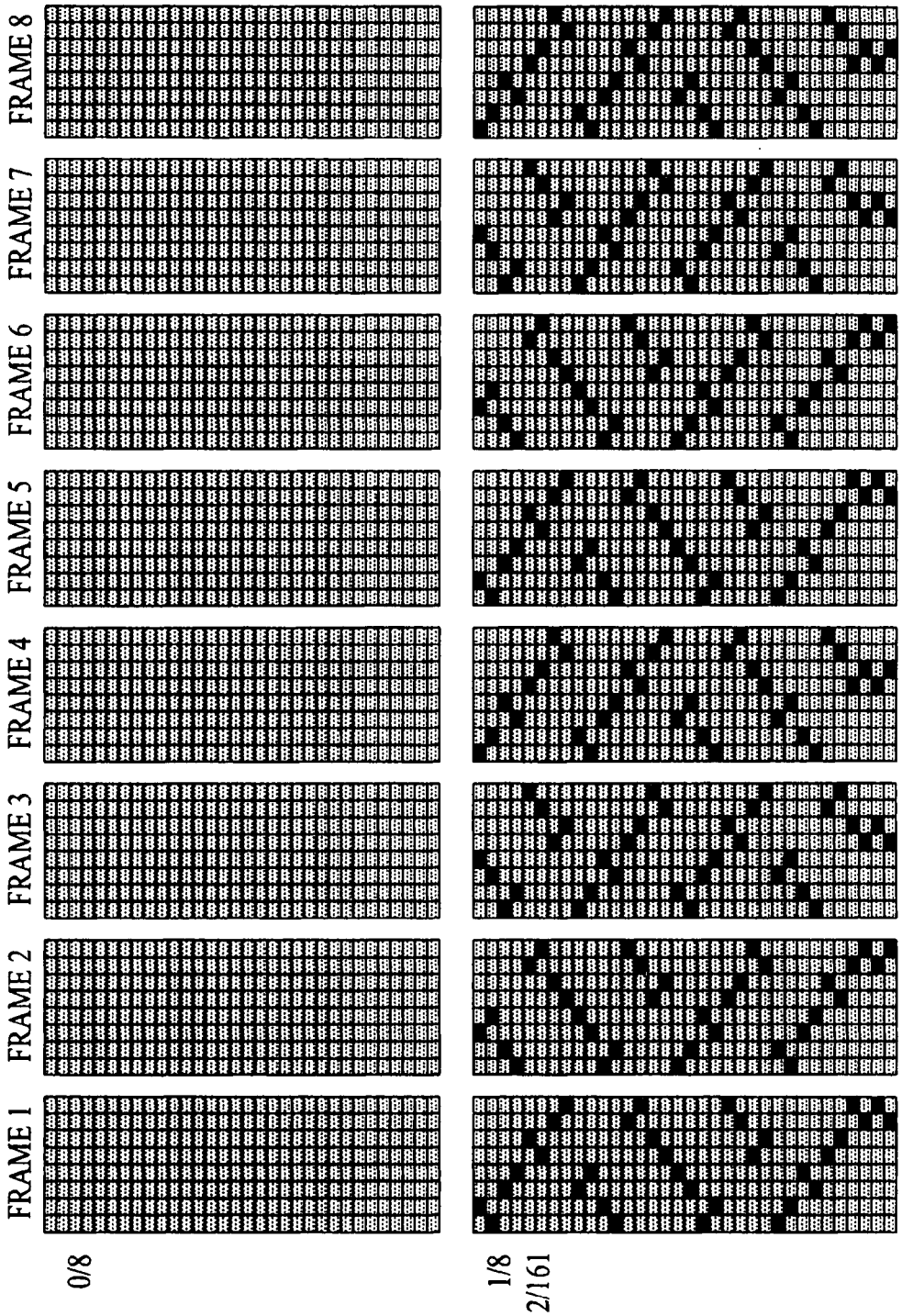
Figure 26C:
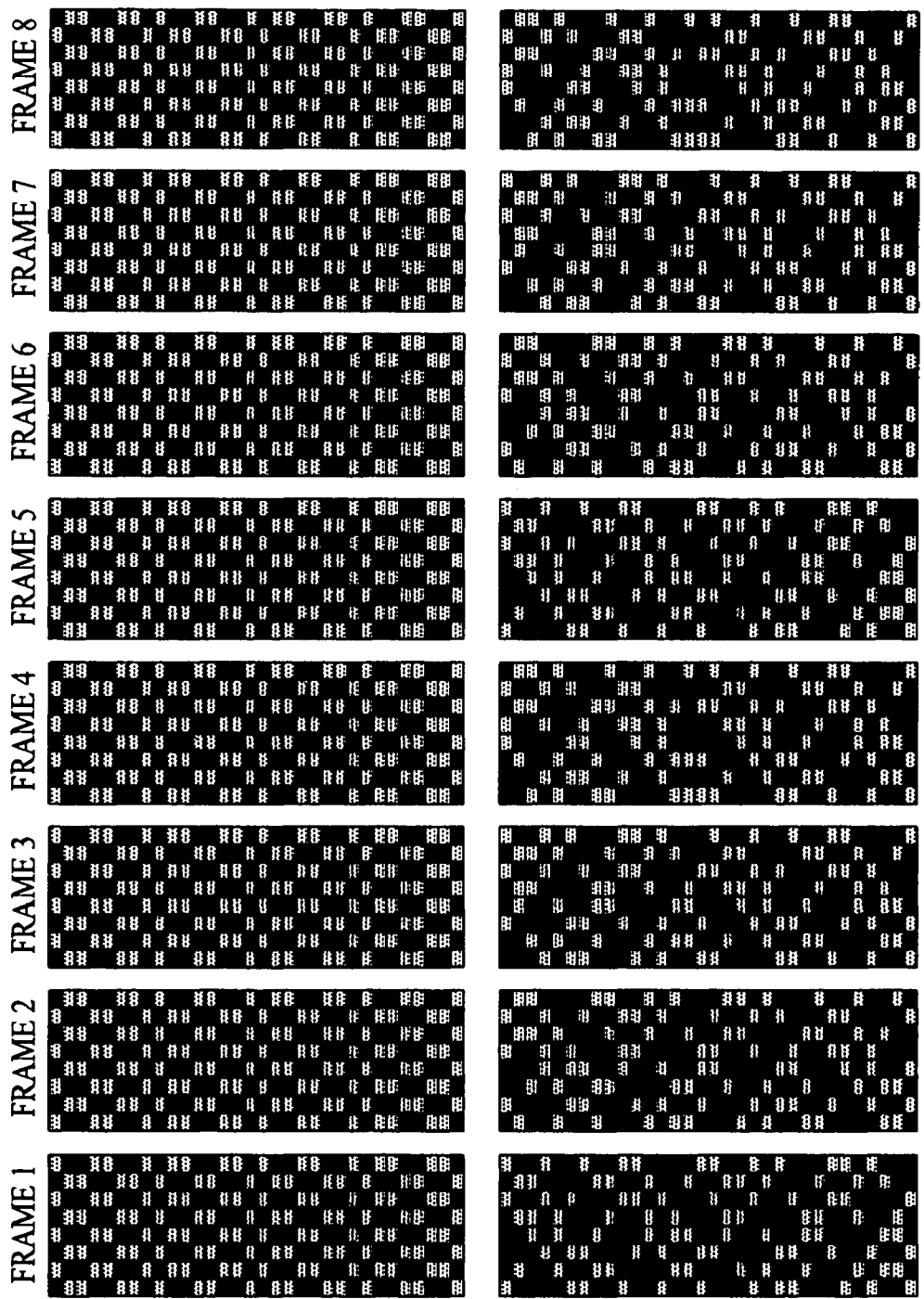

Assuming that 'x' is a horizontal direction increasing by 1 from left to right, 'y' is a vertical direction increasing by 1 from top to bottom, and 'P[x,y]' is a pixel to which a compensation value is applied; the pixels to or from which the compensation value '1' is added or subtracted in the first sub-dither pattern are P[1,1], P[1,5], P[2,2], P[2,6], P[5,3], P[5,7], P[6,4] and P[6,8], as shown in FIG. 25A. The pixels to or from which the compensation value '1' is added or subtracted in the second sub-dither pattern are P[3,3], P[3,7], P[4,4], P[4,8], P[7,1], P[7,5], P[8,2] and P[8,6], as shown in FIG. 25B. The pixels to or from which the compensation value '1' is added or subtracted in the third sub-dither pattern are P[1,3], P[1,7], P[2,4], P[2,8], P[5,1], P[5,5], P[6,2] and P[6,6], as shown in FIG. 25C. And, the pixels to or from which the compensation value '1' is added or subtracted in the fourth sub-dither pattern are P[3,1], P[3,5], P[4,2], P[4,6], P[7,3], P[7,7], P[8,4] and P[8,8], as shown in FIG. 25D.

The dither pattern of the compensation value ⅛ has the first sub-dither pattern, the second sub-dither pattern, the third sub-dither pattern and the fourth sub-dither pattern arranged from top to bottom in the first frame period; and the locations

TABLE 3

| Classification | Gray level area | Location 1 | Location 2 | Location 3 | Location 4 |
|---|---|---|---|---|---|
| Gray level section 1 | 00000000(0)~00110010(50) | 010(2) | 011(3) | 010(2) | 100(4) |
| Gray level section 2 | 00110011(51)~01110000(112) | 011(3) | 100(4) | 010(2) | 101(5) |
| Gray level section 3 | 01110001(113)~10111110(190) | 100(4) | 101(5) | 011(3) | 110(6) |
| Gray level section 4 | 10111111(191)~11111010(250) | 101(5) | 110(6) | 011(3) | 111(7) |

FIGS. 24A to 26D represent other examples of a frame rate control method using a dither pattern.

Figure 24A:
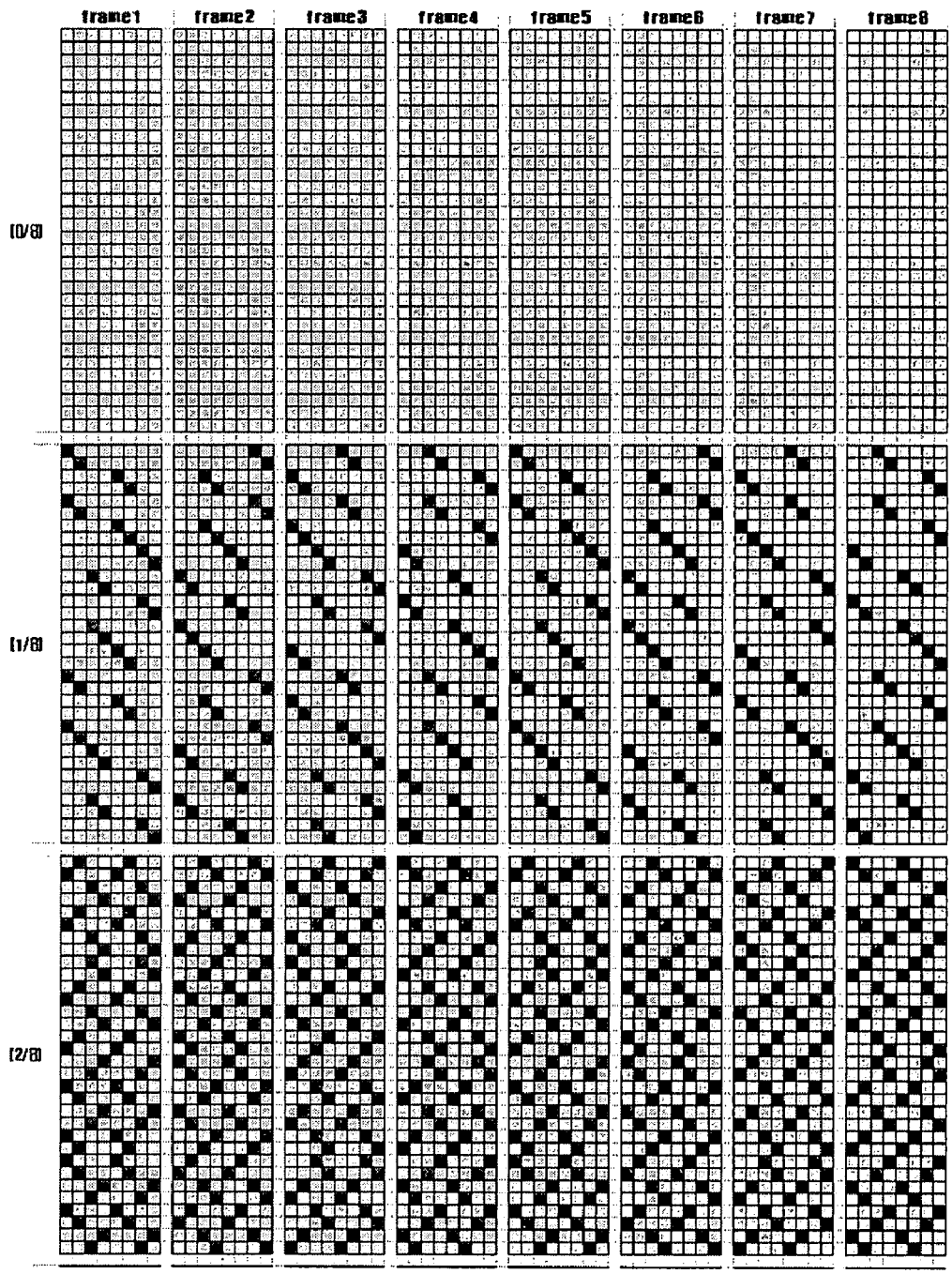
FIGS. 24A to 24C are diagrams for explaining a picture quality controlling method according to a frame rate control method in use of 8×32 dither patterns of the present invention.
Figure 24B:
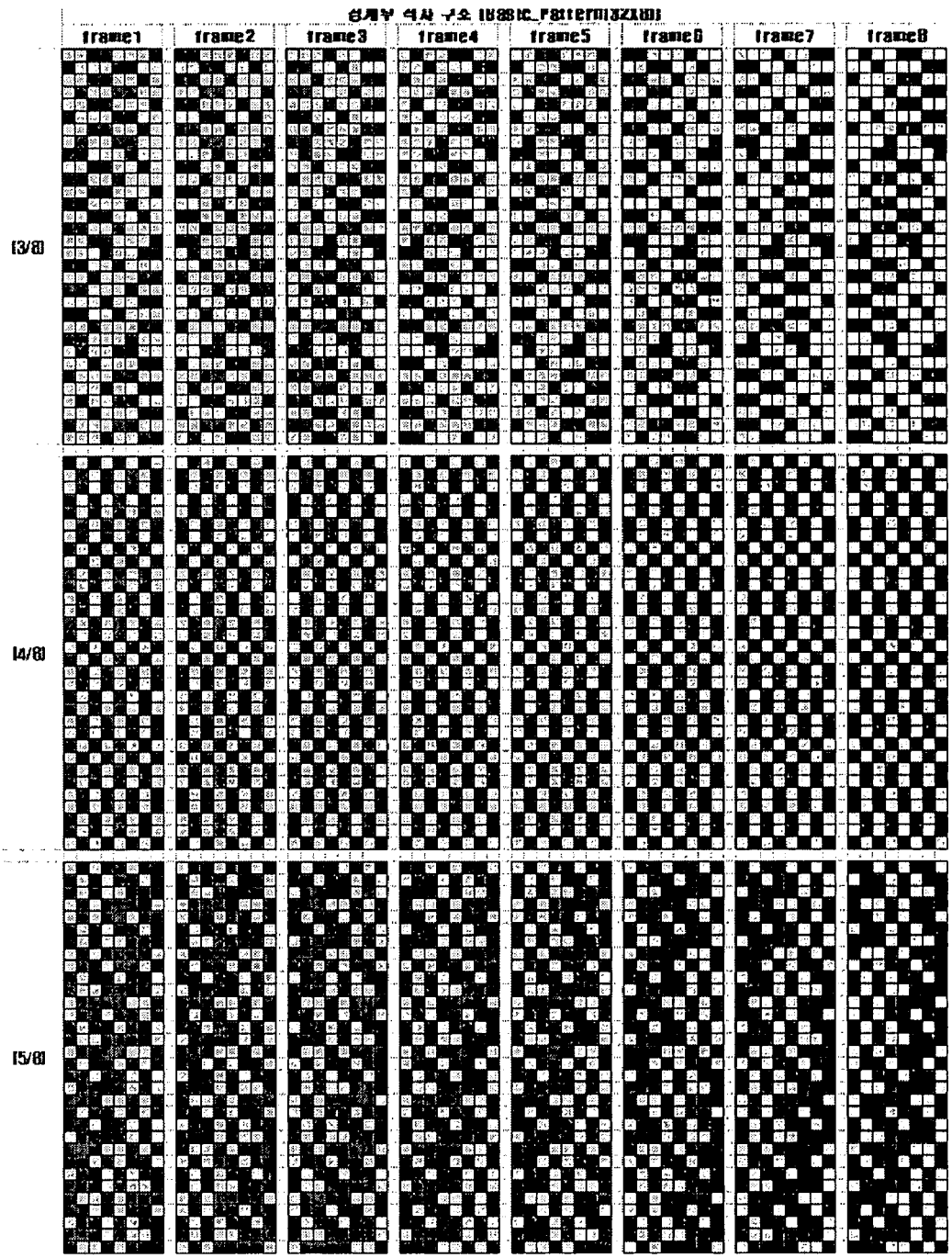
Figure 24C:
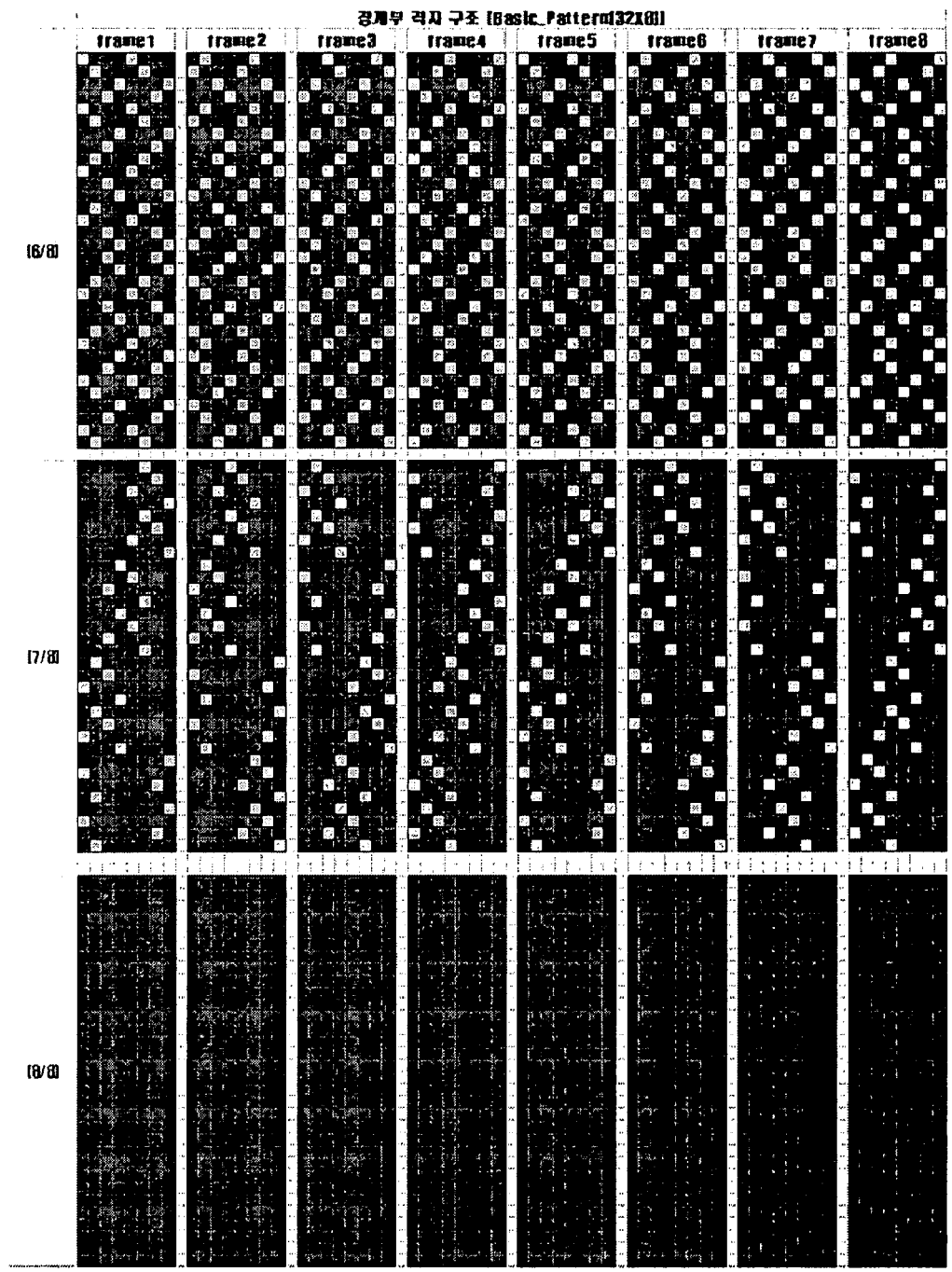

FIGS. 24A to 24C represent a frame rate control method which has the compensation values ⅛, ⅖, ⅜, ⅘, ⅝, ⅚, ⅞ and 1 added to or subtracted from input digital video data in use of a dither pattern of 8(pixels)×32(pixels). The black in each dither pattern represents pixels to or from which '1' is added or subtracted, and the gray represents pixels to or from which '0' is added or subtracted. In this example, the size 8×32 of the dither pattern has been determined by many experiments, and in this size of the dither pattern, an observer almost does not perceive the repetition cycle and no boundary appears between the dither patterns which express different compensation values from each other even though the same pattern is repeated. Accordingly, the dither patterns of the present invention can be applied to the dither pattern which expresses each compensation value and of which the size is larger than 8×32, e.g., the dither patterns of sizes 16×32, 24×32, 32×32, 16×40 and 16×44.

Each of the dither patterns includes 4 sub-dither patterns of which the compensation values are the same as its own compensation value and where the locations of the pixels, in which the compensation values are added to or subtracted from each other, are differently determined. FIGS. 25A to 25D illustrate examples that each dither pattern includes 4 sub-dither patterns. For example, the dither pattern of a compensation value ⅛ includes a first sub-dither pattern of a compensation value ⅛, as shown in FIG. 25A; a second sub-dither pattern of the compensation value ⅛, as shown in FIG. 25B; a third sub-dither pattern of the compensation value ⅛, as shown in FIG. 25C; and a fourth sub-dither pattern of the compensation value ⅛, as shown in FIG. 25D.

of the pixels to or from which the compensation value is added or subtracted in each sub-dither pattern are shifted left and right or up and down such that the pattern of the pixels to or from which the compensation value is added or subtracted is not identically repeated at the left, right, top and bottom. The arrangement of the sub-dither patterns are made different for each frame period, as shown in FIG. 24A and FIGS. 25A to 25D. That is to say, in the second frame period, the dither pattern of the compensation value ⅛ has the second sub-dither pattern, the third sub-dither pattern, the fourth sub-dither pattern and the first sub-dither pattern arranged from top to bottom; and the locations of the pixels to or from which the compensation value is added or subtracted in each sub-dither pattern are shifted left and right or up and down. In the third frame period, the dither pattern of the compensation value ⅛ has the third sub-dither pattern, the fourth sub-dither pattern, the first sub-dither pattern and the second sub-dither pattern arranged from top to bottom; and the locations of the pixels to or from which the compensation value is added or subtracted in each sub-dither pattern are shifted left and right or up and down. In the fourth frame period, the dither pattern of the compensation value ⅛ has the fourth sub-dither pattern, the first sub-dither pattern, the second sub-dither pattern and the third sub-dither pattern arranged from top to bottom; and the locations of the pixels to or from which the compensation value is added or subtracted in each sub-dither pattern are shifted left and right or up and down. For fifth to sixth frame periods, the dither pattern of the compensation value ⅛ is repeated in the same manner as the first to fourth frame periods.

In the same manner as the dither pattern of the compensation value ⅛, as shown in FIGS. 24A to 24C and FIGS. 25A to 25D, the ⅖ dither pattern, the ⅗ dither pattern, the ⅘ dither pattern, the ⅝ dither pattern, the ⅚ dither pattern and the ⅞ dither pattern include J (J is a positive integer) number of sub-dither patterns in which the compensation value is I (I is a positive real number) and the patterns of the pixels to or from the compensation value is added or subtracted are different from each other, when assuming that the compensation value is 'I' and the number of sub-dither patterns is 'J'. The dither patterns have the sub-dither patterns arranged differently in each of the J number of frames, and the dither patterns of the same compensation value appear for each J+1 number of frame periods.

The dither patterns of FIGS. 26A to 26D are other examples of the dither patterns designed in the same condition as FIGS. 24A to 24C.

As described above, the third to fifth embodiments of the compensation step according to the present invention compensates the brightness of the boundary part and the panel defect area by the picture quality controlling method such as the frame rate control and/or dithering which can sub-dividedly express the hue or gray level that the screen of the display device can express in accordance with the data processing capacity of the display device, thus there is an advantage in that a natural and luxurious picture quality can be realized.

Figure 27:
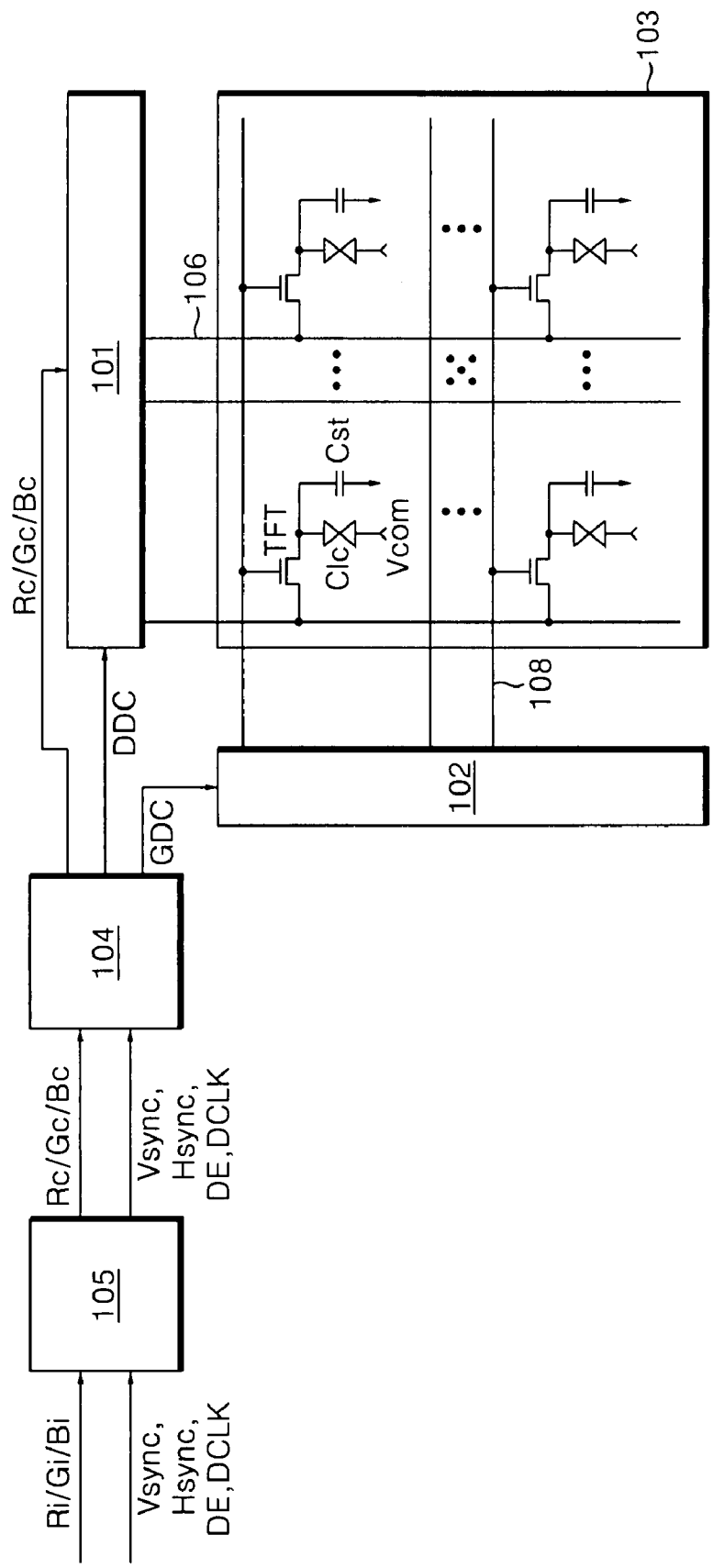
FIG. 27 is a block diagram representing a liquid crystal display device according to an embodiment of the present invention.

Hereinafter, a liquid crystal display device for realizing the picture quality controlling method of the present invention described above will be explained. FIG. 27 is a block diagram illustrating a liquid crystal display device according to the present invention. As shown in FIG. 27, the liquid crystal display device of the present invention includes a compensation circuit 105 which receives data, modulates the data, and supplies the data to a driver that drives a liquid crystal display panel 103.

Referring to FIG. 27, the liquid crystal display device according to an embodiment of the present invention includes a display panel 103 having data lines 106 and gate lines 108 which cross the data line 106 and thin film transistors TFT formed at each crossing part of the data lines and the gate lines to drive liquid crystal cells Clc; a compensation circuit 105 which modulates input data Ri, Gi, Bi to be supplied to a panel defect location of the display panel 103, to generate the corrected data Rc/Gc/Bc; a data drive circuit 101 for supplying the corrected data Rc/Gc/Bc to the data lines 106; a gate drive circuit 102 for supplying scan signals to the gate lines 108; and a timing controller 104 for controlling the drive circuits 101 and 102.

The display panel 103 includes two substrates, i.e., TFT substrate and color filter substrate, and liquid crystal molecules injected between the two substrates. The data lines 106 and the gate lines 108 formed on the TFT substrate are at right angles to each other. The TFT formed at the crossing part of the data line 106 and the gate line 108 supplies the data voltages from the data line 106 to the pixel electrode of the liquid crystal cell Clc in response to the scan signals from the gate line 108. A black matrix, a color filter and a common electrode (not shown) are formed on the color filter substrate. On the other hand, the common electrode formed on the color filter substrate can be formed on the TFT substrate in accordance with an electric field application method. Polarizers having a vertical polarizing axis to each other are respectively adhered to the TFT substrate and the color filter substrate.

The compensation circuit 105 receives the input data Ri/Gi/Bi from a system interface to modulate the input data Ri/Gi/Bi to be supplied to the panel defect location, i.e., the panel defect area, the boundary part and the link pixel, thereby generating the corrected data Rc/Gc/Bc. And, the input data to be supplied to the non-defect area are bypassed to be outputted as it is. The compensation circuit 105 will be explained in detail later.

The timing controller 104 supplies the corrected digital video data Rc/Gc/Bc, which are supplied through the compensation circuit 105, to the data drive circuit 101 in accordance with the dot clock DCLK and generates a gate control signal GDC for controlling the gate drive circuit 102 and a data control signal DDC for controlling the data drive circuit 101 in use of a vertical/horizontal synchronization signal Vsync, Hsync, a data enable signal DE and a dot clock DCLK.

The data drive circuit 101 receives the corrected data Rc/Gc/Bc as digital signals from timing controller 104 and converts the corrected data Rc/Gc/Bc into analog gamma compensation voltages (data voltage) to supply to the data lines 106.

The gate drive circuit 102 sequentially supplies scan signals selecting horizontal lines to which the data voltages are to be supplied, to the gate lines 108. The data voltages from the data lines 106 are supplied to liquid crystal cells Clc of one horizontal line in synchronization with the scan signals.

Hereinafter, in reference to FIGS. 28 to 36, a detail description on the compensation circuit 105 will be made.

Figure 28:
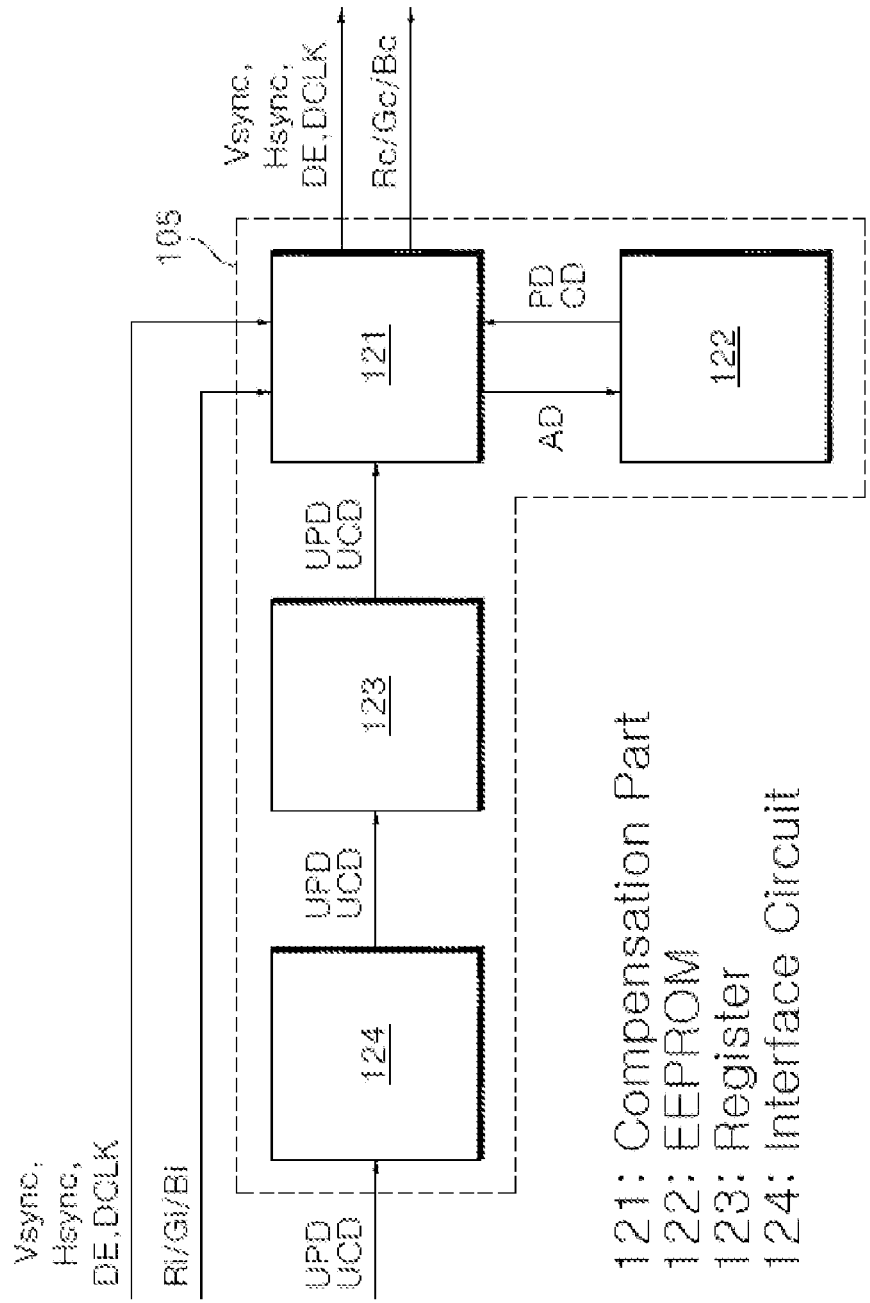
FIG. 28 is a block diagram more specifically illustrating the configuration of a compensation circuit shown in FIG. 27.

FIG. 28 is a block diagram more specifically illustrating the configuration of the compensation circuit shown in FIG. 27. Referring to FIG. 28, the compensation circuit 105 according to the embodiment of the present invention includes an EEPROM 122 which stores location data PD and compensation data CD of the panel defect area, the boundary part and the link pixel on the display panel 103; a compensation part 121 for modulating the input data Ri/Gi/Bi supplied from an external system, in use of the location data PD and the compensation data CD stored on the EEPROM 122, thereby generating the corrected data Rc/Gc/Bc; an interface circuit 124 for communicating between the compensation circuit 105 and the external system; and a register 123 for temporarily storing the data to be stored on the EEPROM 122 through the interface circuit 124.

The EEPROM 122 stores the location data PD which indicates each location of the panel defect area, the boundary part and the link pixel of the liquid crystal display panel 103, and the compensation data CD for each of the panel defect area, the boundary part and the link pixel. The compensation data CD includes the first to fifth compensation data. The EEPROM 122 can renew the location data PD and the compensation data CD by electrical signals applied from the external system.

The interface circuit 124 is a configuration for communicating between the compensation circuit 105 and the external system, and the interface circuit 124 is designed according to a communication standard protocol of IIC (international institute of communication) and the like. The external system might read the data stored on the EEPROM 122 through the interface circuit 124 or might modify the data. That is to say, the location data PD and the compensation data CD stored on the EEPROM 122 are required to be renewed by reasons such as change in process, difference between application models and the like. And, the user might modify the data stored on the EEPROM 122 by supplying the location data UPD and the compensation data UCD, which he wants to renew, from the external system.

Register 123 temporarily stores the location data UPD and the compensation data UCD, which the user wants to renew and which are transmitted through the interface circuit 124, for renewing the location data PD and the compensation data CD stored on the EEPROM 122.

The compensation part 121 modulates the input data Ri/Gi/Bi to be supplied to the panel defect area, the boundary part and the link pixel, in use of the location data PD and the compensation data CD stored on the EEPROM 122, thereby generating the corrected data Rc/Gc/Bc.

FIGS. 29 to 36 repesent various embodiments of the compensation part 121 shown in FIG. 28.

Figure 29:
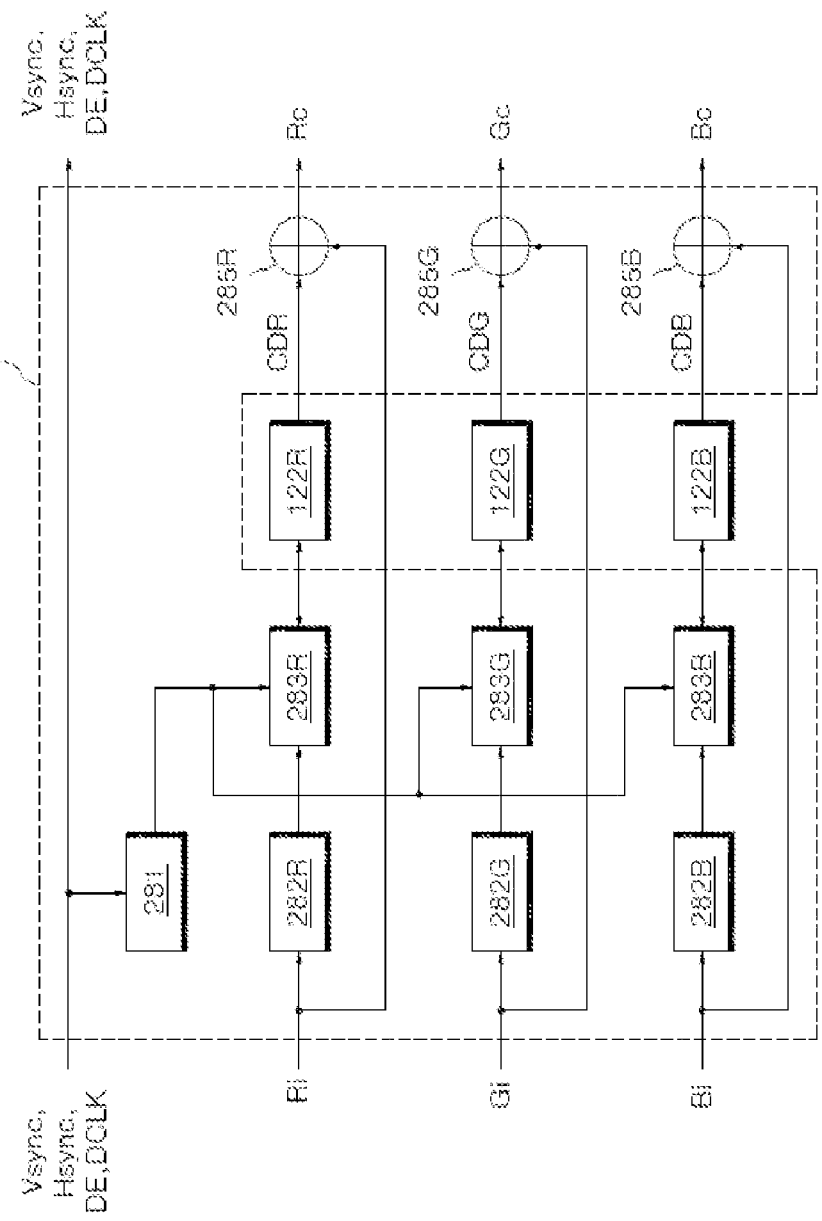
FIG. 29 is a block diagram specifically illustrating a first embodiment of a compensation part shown in FIG. 28.

FIG. 29 is a block diagram specifically illustrating a first embodiment of the compensation part shown in FIG. 28. Referring to FIG. 29, the compensation part 121 according to the first embodiment of the present invention includes a location judging part 281, a gray level judging part 282R, 282G, 282B, an address generating part 283R, 283G, 283B, and an operator 285R, 285G, 285B. On the other hand, R, G and B represent configurations for each of red R, green G and blue B in FIG. 29 to FIG. 36.

The location judging part 281 judges a display location of the input data Ri/Gi/Bi on the liquid crystal display panel 103 in use of the vertical/horizontal synchronization signals Vsync, Hsync, the data enable signal DE and the dot clock DCLK.

The gray level judging part 282R, 282G, 282B analyzes the gray level of the input data Ri/Gi/Bi or a gray level section inclusive of the gray level of the input data Ri/Gi/Bi.

The address generating part 283R, 283G, 283B generates a read address for reading the compensation data CDR, CDG, CDB from the EEPROM 122R, 122G; 122B in use of the location data stored on the EEPROM 122R, 122G; 122B and the display location and gray level information of the input data Ri/Gi/Bi supplied from the location judging part 281 and the gray level judging part 282R, 282G, 282B, and supplies the read address to the EEPROM 122R, 122G, 122B. The compensation data CDR, CDG, CDB outputted from the EEPROM 122R, 122G, 122B in accordance with the read address are supplied to the operator 285R, 285G, 285B.

The operator 285R, 285G, 285B generates the corrected data Rc/Gc/Bc by increasing or decreasing the input data Ri/Gi/Bi with the compensation data CDR, CDG, CDB. On the other hand, the operator 285R, 285G, 285B might include a multiplier or a divider for multiplying or dividing the input data Ri/Gi/Bi by the compensation data CDR, CDG, CDB besides the adder and subtractor.

Figure 30:
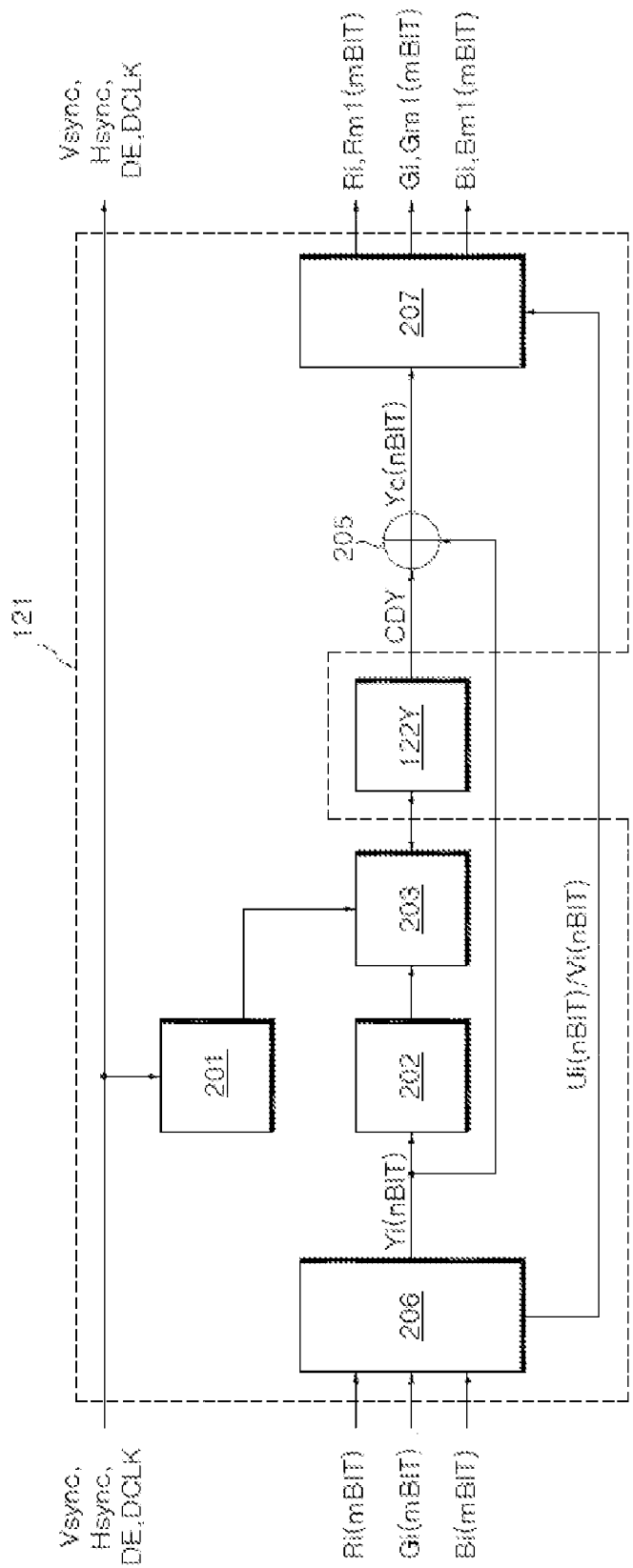
FIG. 30 is a block diagram specifically illustrating a second embodiment of the compensation part shown in FIG. 28.

FIG. 30 is a block diagram specifically illustrating a second embodiment of the compensation part shown in FIG. 28. Referring to FIG. 30, the compensation part 121 according to the second embodiment of the present invention includes an RGB to YUV converter 206, a location judging part 201, a gray level judging part 202, an address generating part 203, an operator 205, and a YUV to RGB converter 207. The compensation part 121 converts the m/m/m bits R/G/B input data Ri, Gi, Bi inclusive of red R, green G and blue B information into the n/n/n (n is an integer larger than m) bit Y/U/V data Yi, Ui, Vi inclusive of brightness (Y) and chromaticity (U, V) information; generates the corrected Y data Yc by increasing or decreasing the n bits Y data Yi with the first compensation data CDY stored on the EEPROM 122Y; and then converts the corrected Y data Yc and the uncorrected U/V data Ui, Vi into the m/m/m bits correction data Rc, Gc, Bc inclusive of red R, green G and blue B information.

The RGB to YUV converter 206 calculates the n/n/n bits brightness information Yi and the chromaticity information Ui/Vi in use of the following equations 1 to 3 which take the input data Ri/Gi/Bi having the m/m/m bits R/G/B data as a variable.

$$Yi = 0.299Ri + 0.587Gi + 0.114Bi \quad \text{[Equation 1]}$$

$$Ui = -0.147Ri - 0.289Gi + 0.436Bi = 0.492(Bi - Y) \quad \text{[Equation 2]}$$

$$Vi = 0.615Ri - 0.515Gi - 0.100Bi = 0.877(Ri - Y) \quad \text{[Equation 3]}$$

The location judging part 201 judges the display location of the input data Ri/Gi/Bi in use of a vertical/horizontal synchronization signal Vsync, Hsync, a data enable signal DE and a dot clock DCLK.

The gray level judging part 202 analyzes the gray level of the input data Ri/Gi/Bi on the basis of the brightness information Yi from the RGB to YUV converter 206.

The address generating part 203 generates a read address for reading the first compensation data CDY from the EEPROM 122Y in use of the display location and gray level information of the input data Ri/Gi/Bi supplied from the location judging part 201 and the gray level judging part 202 and the location data of the panel defect area stored on the EEPROM 122Y; and supplies the read address to the EEPROM 122Y The compensation data CDY outputted from the EEPROM 122Y in accordance with the read address are supplied to the operator 205.

The operator 205 adds or subtracts the compensation data CDY from the EEPROM 122Y to or from the n bits brightness information Yi which is supplied from the RGB to YUV converter 206, thereby modulating the brightness of the input data Ri/Gi/Bi which are to be displayed in the panel defect area. Herein, the operator 205 may include a multiplier or a divider for multiplying or dividing the n bits brightness information Yi by the compensation data besides the adder and subtractor.

The YUV to RGB converter 207 calculates the m/m/m bits corrected data Rc, Gc, Bc in use of the following Equation 4 to 6 which take the brightness information Yc modulated by the operator 205 and the color difference information Ui, Vi from the RGB to YUV converter 206 as a variable.

$$Rm = Yc + 1.140Vi \quad \text{[Equation 4]}$$

$$Gm = Yc - 0.395Ui - 0.581Vi \quad \text{[Equation 5]}$$

$$Bm = Yc + 2.032Ui \quad \text{[Equation 6]}$$

As described above, the compensation part according to the second embodiment of the present increases or decreases the n bits brightness information Yi, which has the number of bits extended to include more detailed gray level information, with the compensation data, thereby minutely adjusting the brightness to be displayed in the panel defect area, the boundary part and the link pixel of the input data Ri, Gi, Bi.

Figure 31:
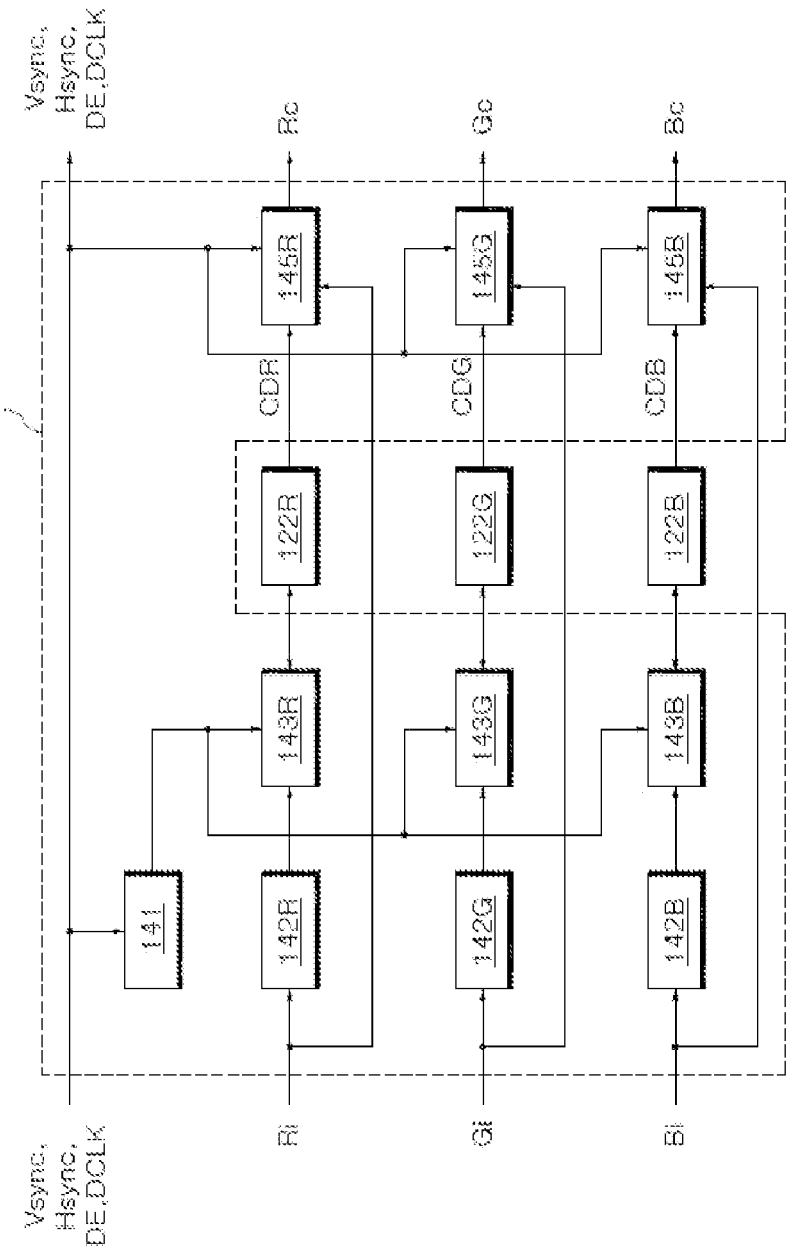
FIG. 31 is a block diagram specifically illustrating a third embodiment of the compensation part shown in FIG. 28.

FIG. 31 is a block diagram specifically illustrating a third embodiment of the compensation part shown in FIG. 28.

Referring to FIG. 31, the compensation part 121 according to the third embodiment of the present invention includes a location judging part 141, a gray level judging part 142R, 142G, 142B, an address generating part 143R, 143G, 143B, and an FRC controller 145R, 145G, 145B. The compensation part 121 modulates the input data Ri/Gi/Bi to be supplied to the panel defect area, the boundary part and the link pixel, by a frame rate control method in use of the compensation data CDR, CDG, CDB stored on the EEPROM 122R, 122G, 122B.

The location judging part 141 judges a display location of the input data Ri/Gi/Bi on the liquid crystal display panel 103 in use of the vertical/horizontal synchronization signals Vsync, Hsync, the data enable signal DE and the dot clock DCLK, and supplies the information for the display location of the input data Ri/Gi/Bi to the address generating part 143R, 143G, 143B.

The gray level judging part 142R, 142G, 142B analyzes the gray level of the input data Ri/Gi/Bi or a gray level section inclusive of the gray level of the input data Ri/Gi/Bi, and supplies the information for this to the address generating part 143R, 143G, 143B.

The address generating part 143R, 143G, 143B generates a read address for reading the compensation data CDR, CDG, CDB from the EEPROM 122R, 122G, 122B on the basis of the gray level judgment result of the gray level judging part 142R, 142G, 142B and the location judgment result of the location judging part 141 and the location data of the panel defect area stored on the EEPROM 122R, 122G, 122B, and supplies the read address to the EEPROM 122R, 122G, 122B. The compensation data CDR, CDG, CDB outputted from the EEPROM 122R, 122G, 122B in accordance with the read address are supplied to the FRC controller 145R, 145G, 145B.

The FRC controller 145R, 145G, 145B disperses the compensation data CDR, CDG, CDB from the EEPROM 122R, 122G, 122B to a plurality of frames, and increases or decreases the input data Ri/Gi/Bi to be displayed in the panel defect area, with the dispersed compensation data CDR, CDG, CDB. The FRC controller 145R, 145G, 145B includes a first FRC controller 145R for correcting red data, a second FRC controller 145G for correcting green data, and a third FRC controller 145B for correcting blue data.

Figure 32:
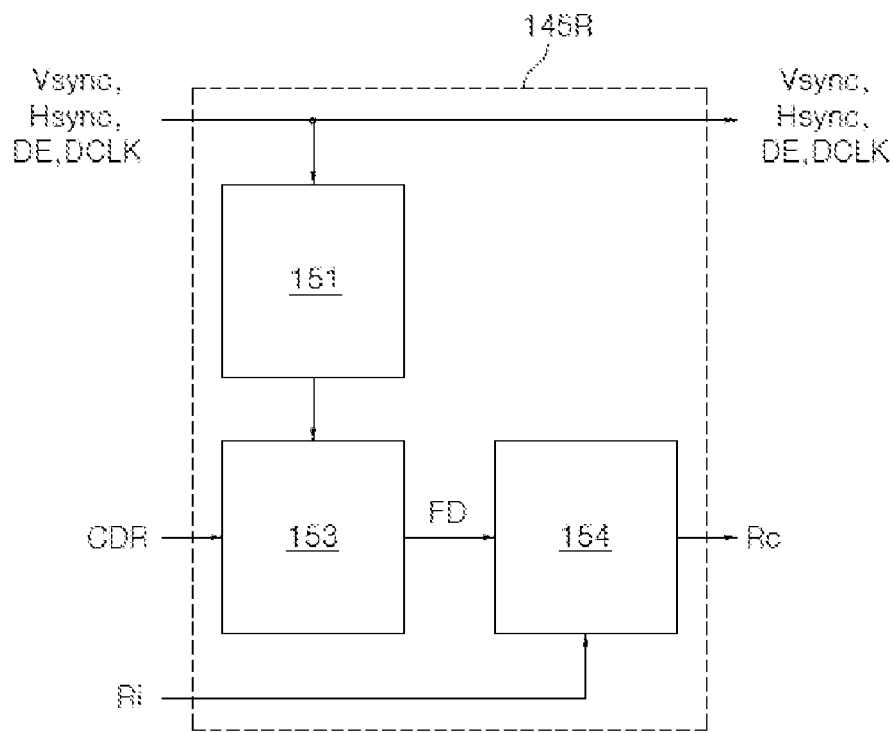
FIG. 32 is a block diagram specifically illustrating a first FRC controller shown in FIG. 31.

FIG. 32 is a block diagram specifically illustrating the first FRC controller 145R of the compensation part shown in FIG. 31. Referring to FIG. 32, the first FRC controller 145R includes a compensation value judging part 153, a frame number sensing part 151 and an operator 154.

The compensation value judging part 153 judges the R compensation value and generates an FRC data FD with a value calculated by dividing the compensation value by the number of frames. The compensation value judging part 153 is programmed to automatically output the FRC data FD in accordance with the R compensation data CDR. For example, the compensation value judging part 153 is pre-programmed to perceive the R compensation data CDR expressed in binary data as the compensation value for a designated gray level, e.g., the compensation value is for 0 gray level if the R compensation data CDR is '00', for ¼ gray level if the R compensation data CDR is '01', for ½ gray level if the R compensation data CDR is '10' and for ¾ gray level if the R compensation data CDR is '11'. As shown in FIG. 20, in case of having four frames as a unit frame for the frame rate control, if the R compensation data CDR of '01' are supplied thereto, the compensation value judging part 153 generates the FRC data FD of '1' for one frame, when 1 gray level is added thereto, among the first to fourth frames and generates the FRC data FD of '0' for the remaining 3 frames, as in (a) of FIG. 20. At the moment, the compensation value judging part 153 can determine a plurality of FRC patterns that differently indicate the frames to which the R compensation data CDR are to be dispersed.

The frame number sensing part 151 senses the number of frames in use of at least any one of a vertical/horizontal synchronization signal Vsync, Hsync, a dot clock DCLK and a data enable signal DE. For example, the frame number sensing part 151 can sense the number of frames by counting the vertical synchronization signal Vsync.

The operator 154 increases or decreases the R input data Ri to be supplied to the panel defect area, in use of the FRC data FD, thereby generating the corrected R data Rc.

On the other hand, the R input data Ri to be corrected and the R compensation data CDR might be respectively supplied through different data transmission lines to the first FRC controller 145R, or the R input data Ri to be corrected and the R compensation data CDR are combined to be supplied through the same line to the first FRC controller 145R. For example, in case that the R input data Ri to be corrected is '01000000' being 8 bits and the R compensation data CDR is '011' being 3 bits, '01000000' and '011' can be supplied to the first FRC controller 145R through different data transmission lines respectively or can be combined to 11 bit data of '01000000011' to be supplied to the first FRC controller 145R. In this way, in case that the R input data Ri to be corrected and the R compensation data CDR are combined to the 11 bit data and are supplied to the first FRC controller 145R, the first FRC controller 145R perceives the upper 8 bits out of the 11 bit data as the R input data Ri to be corrected, and perceives the lower 3 bits as the R compensation data CDR, thereby performing the frame rate control. On the other hand, as an example of the method of generating the data of '01000000011' made by combining '01000000' and '011', a dummy bit '000' is appended to the lowest bit of the '01000000' to be changed into '01000000000', and '011' is added thereto to generate the data of '01000000011'.

The second and third FRC controllers 145G, 145B substantially have the same circuit configuration as the first FRC controller 145R. Accordingly, a detail description for the second and third FRC controllers 145G, 145B will be omitted.

As described above, in the compensation part 121 according to the third embodiment of the present invention, assuming that the R, G, B data are each 8 bits and the compensation value is dispersed temporally by configuring the unit frame of the frame rate control to be 4 frames, the data to be displayed in the panel defect area can be minutely adjusted with the compensation value which are subdivided into 1021 gray levels for each of R, G and B.

Figure 33:
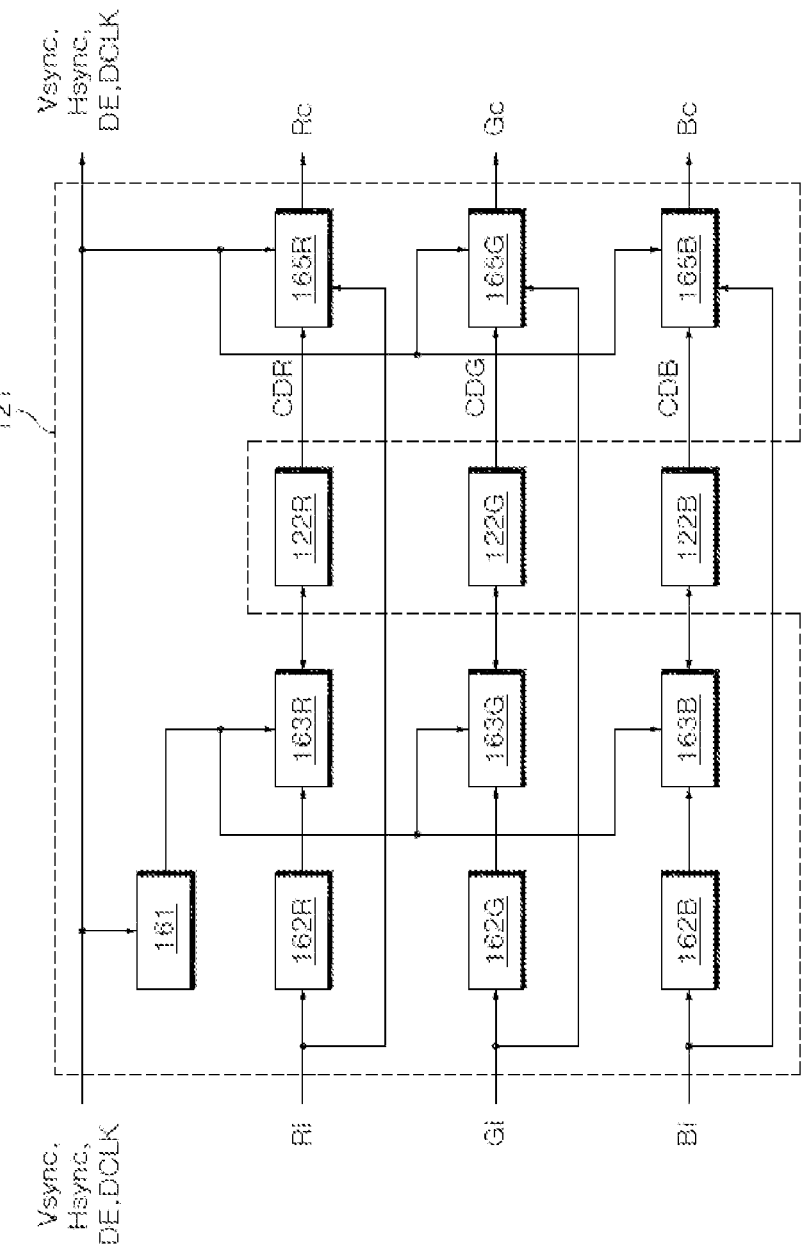
FIG. 33 is a block diagram specifically illustrating a fourth embodiment of the compensation part shown in FIG. 28.

FIG. 33 is a block diagram specifically illustrating a fourth embodiment of compensation part shown in FIG. 28. Referring to FIG. 33, the compensation part according to the fourth embodiment of the present invention includes a location judging part 161, a gray level judging part 162R, 162G, 162B, an address generating part 163R, 163G, 163B, and a dithering controller 165R, 165G, 165B. The compensation part 121 modulates the input data Ri/Gi/Bi to be supplied to the panel defect area, by a dithering method in use of the compensation data CDR, CDG, CDB stored on the EEPROM 122R, 122G, 122B.

The location judging part 161 judges the display location of the input data Ri/Gi/Bi on the liquid crystal display panel in use of a vertical/horizontal synchronization signal Vsync, Hsync, a data enable signal DE and a dot clock DCLK.

The gray level judging part 162R, 162G, 162B analyzes the gray level of the input data Ri/Gi/Bi or a gray level section inclusive of the gray level of the input data Ri/Gi/Bi.

The address generating part 163R, 163G, 163B generates a read address for reading the compensation data CDR, CDG, CDB from the EEPROM 122R, 122G, 122B in use of the display location and gray level information of the input data Ri/Gi/Bi supplied from the gray level judging part 162R, 162G, 162B and the location judging part 161 and the location data of the panel defect area stored on the EEPROM 122R, 122G, 122B, and supplies the read address to the EEPROM 122R, 122G, 122B. The compensation data CDR, CDG, CDB outputted from the EEPROM 122R, 122G, 122B in accordance with the read address are supplied to the dithering controller 165R, 165G, 165B.

The dithering controller 165R, 165G, 165B disperses the compensation data CDR, CDG, CDB from the EEPROM 122R, 122G, 122B to each of the pixels within a unit window inclusive of a plurality of pixels, and increases or decreases the input data Ri/Gi/Bi to be displayed in the panel defect area, in use of the dispersed compensation data CDR, CDG, CDB. The dithering controller 165R, 165G, 165B includes a first dithering controller 165R for correcting red data, a second dithering controller 165G for correcting green data and a third dithering controller 165B for correcting blue data.

Figure 34:
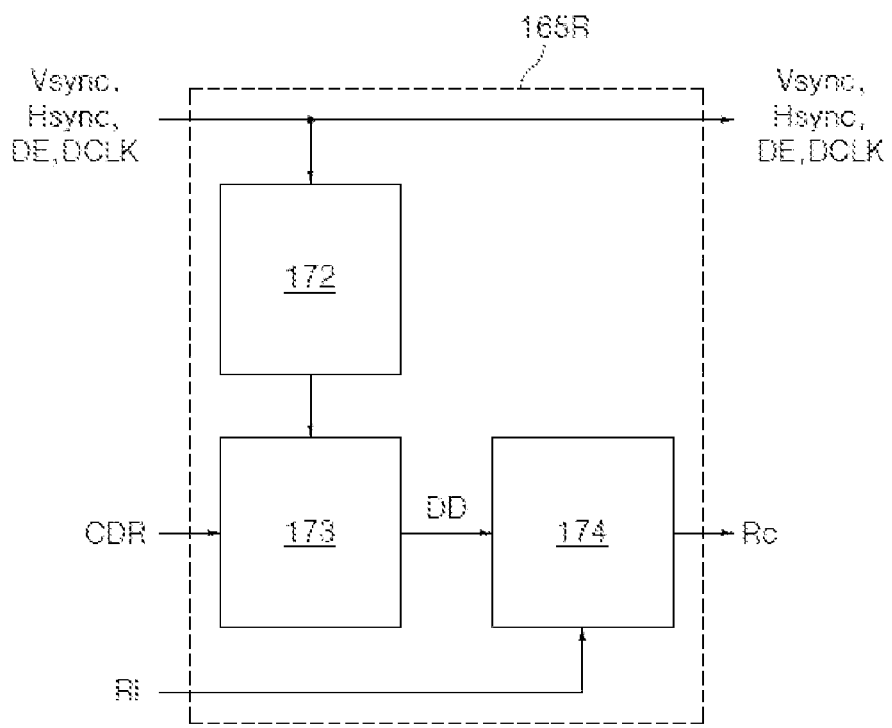
FIG. 34 is a block diagram specifically illustrating a first dithering controller shown in FIG. 33.

FIG. 34 is a block diagram specifically illustrating the first dithering controller 165R shown in FIG. 33. Referring to FIG. 34, the first dithering controller 165R includes a compensation value judging part 173, a pixel location sensing part 172 and an operator 174.

The compensation value judging part 173 judges the R compensation value and generates a dithering data DD by taking the compensation value as a value to be dispersed to the pixels included within the unit window. The compensation value judging part 173 is programmed to automatically output the dithering data DD in accordance with the R compensation data CDR. For example, the compensation value judging part 173 is pre-programmed to perceive the R compensation data CDR expressed in binary data as the compensation value for a designated gray level, e.g., the compensation value is for 0 gray level if the R compensation data CDR is '00', for ¼ gray level if the R compensation data CDR is '01', for ½ gray level if the R compensation data CDR is '10' and for ¾ gray level if the R compensation data CDR is '11'. In case that dithering is performed for the unit window inclusive of 4 pixels, as shown in FIG. 21, the compensation value judging part 173 generates '1' as the dithering data DD at one pixel location within the unit window if the R compensation data CDR of '01' are supplied thereto, but generates '0' as the dithering data DD at the remaining 3 pixel locations, as shown in (a) of FIG. 21. At this moment, the compensation value judging part 173 can determine a plurality of dither patterns of which each differently indicate the pixel location, to which the R compensation data CDR are to be dispersed within the unit window.

The pixel location sensing part 172 senses the pixel location in use of any one or more of a vertical/horizontal synchronization signal Vsync, Hsync, a dot clock DCLK and a data enable signal DE. For example, the pixel location sensing part 172 can sense the pixel location by counting the horizontal synchronization signal Hsync and the dot clock DCLK.

The operator 174 increases or decreases the input data Ri/Gi/Bi with the dithering data, thereby generating the corrected R data Rc.

On the other hand, the R input data Ri to be corrected and the R compensation data CDR might be respectively supplied through different data transmission lines to the first dithering controller 165R, or the R input data Ri to be corrected and the R compensation data CDR are combined to be supplied through the same line to the first dithering controller 165R. For example, in case that the R input data Ri to be corrected is '01000000' being 8 bits and the R compensation data CDR is '011' being 3 bits, '01000000' and '011' can be supplied to the first dithering controller 165R through different data transmission lines respectively or can be combined to 11 bit data of '01000000011' to be supplied to the first dithering controller 165R. In this way, in case that the R input data Ri to be corrected and the R compensation data CDR are combined to the 11 bit data and are supplied to the first dithering controller 165R, the first dithering controller 165R perceives the upper 8 bits out of the 11 bit data as the R input data Ri to be corrected, and perceives the lower 3 bits as the R compensation data CDR, thereby performing the dithering control. On the other hand, as an example of the method of generating the data of '01000000011' made by combining '01000000' and '011', a dummy bit '000' is appended to the lowest bit of the '01000000' to be changed into '01000000000', and '011' is added thereto to generate the data of '01000000011'.

The second and third dithering controllers 165G, 165B substantially have the same circuit configuration as the first dithering controller 165R. Accordingly, a detail explanation for the second and third dithering controllers 165G, 165B will be omitted.

As described above, in the compensation part 121 according to the fourth embodiment of the present invention, assuming that the R, G, B data are each 8 bits, and the unit window for dithering is configured to be 4 pixels to spatially disperse the compensation value, the data to be displayed in the panel defect area can minutely adjusted with the compensation value subdivided into 1021 gray levels for each of R, G, B.

Figure 35:
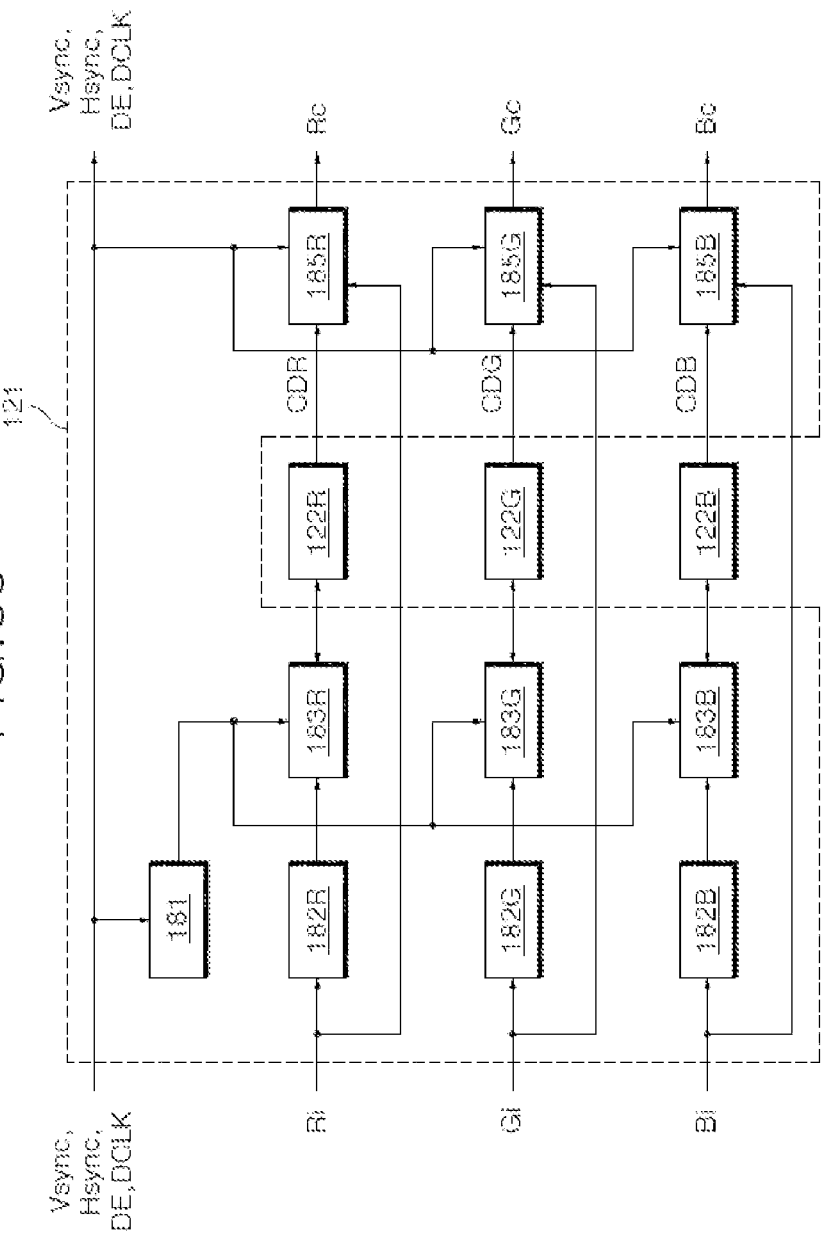
FIG. 35 is a block diagram specifically illustrating a fifth embodiment of the compensation part shown in FIG. 28.

FIG. 35 is a block diagram specifically illustrating a fifth embodiment of the compensation part shown in FIG. 28. Referring to FIG. 35, the compensation part 121 according to the fifth embodiment of the present invention includes a location judging part 181, a gray level judging part 182R, 182G, 182B, an address generating part 183R, 183G, 183B, and an FRC/dithering controller 185R, 185G, 185B. The compensation part 121 modulates the input data Ri/Gi/Bi to be supplied to the panel defect area, by a frame rate control and dithering method in use of the compensation data CDR, CDG, CDB stored on the EEPROM 112R, 112G, 122B.

The location judging part 181 judges the display location of the input data Ri/Gi/Bi on the liquid crystal display panel 103 in use of a vertical/horizontal synchronization signal Vsync, Hsync, a data enable signal DE and a dot clock DCLK.

The gray level judging part 182R, 182G, 182B analyzes the gray level of the input data Ri/Gi/Bi and a gray level section inclusive of the gray level of the input data Ri/Gi/Bi.

The address generating part 183R, 183G, 183B generates a read address for reading the compensation data CDR, CDG, CDB from the EEPROM 122R, 122G, 122B in use of the display location and gray level information of the input data Ri/Gi/Bi supplied from the gray level judging part 182R, 182G, 182B and the location judging part 181 and the location data of the panel defect area stored on the EEPROM 122R, 122G, 122B, and supplies the read address to the EEPROM 122R, 122G, 122B. The compensation data CDR, CDG, CDB outputted from the EEPROM 122R, 122G, 122B in accordance with the read address are supplied to the FRC/dithering controller 185R, 185G, 185B.

The FRC/dithering controller 185R, 185G, 185B disperses the compensation data CDR, CDG, CDB from the EEPROM 122R, 122G, 122B to the pixels within the dither pattern in use of the dither patterns of FIGS. 23 to 26 and disperses the compensation data CDR, CDG, CDB to a plurality of frame periods. Also, the FRC/dithering controller 185R, 185G, 185B increases or decreases the input data Ri/Gi/Bi to be displayed in the panel defect area, in use of the dispersed compensation data CDR, CDG, CDB. The FRC/dithering controller 185R, 185G, 185B includes a first FRC/dithering controller 185R for correcting red data, a second FRC/dithering controller 185G for correcting green data and a third FRC/dithering controller 185B for correcting blue data.

Figure 36:
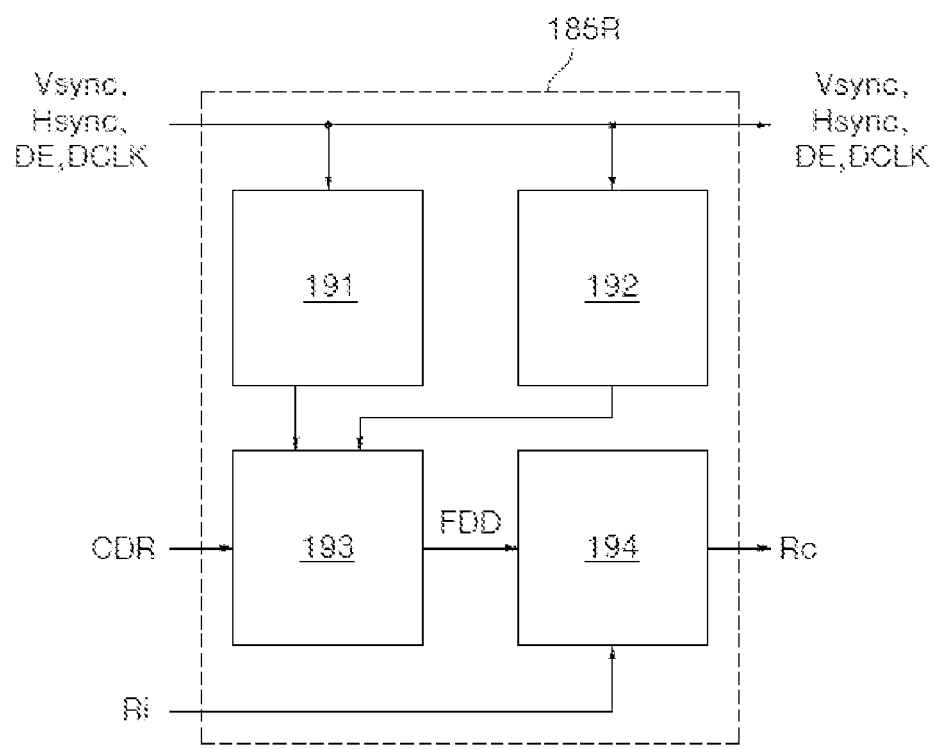
FIG. 36 is a block diagram specifically illustrating a first FRC/dithering controller shown in FIG. 35.

FIG. 36 is a block diagram specifically illustrating the first FRC/dithering controller 185R shown in FIG. 35. Referring to FIG. 36, the first FRC/dithering controller 185R includes a compensation value judging part 193, a frame number sensing part 191, a pixel location sensing part 192, and an operator 194.

The compensation value judging part 193 judges the R compensation value and generates an FRC/dithering data FDD by taking the compensation value as a value to be dispersed to the pixels included within the unit window and to be dispersed for a plurality of frame periods. The compensation value judging part 193 is programmed to automatically output the FRC/dithering data FDD in accordance with the R compensation data CDR. For example, the compensation value judging part 193 is pre-programmed to perceive the R compensation data CDR expressed in binary data as the compensation value for a designated gray level, e.g., the compensation value is for 0 gray level if the R compensation data CDR is '00', for ¼ gray level if the R compensation data CDR is '01', for ½ gray level if the R compensation data CDR is '10' and for ¾ gray level if the R compensation data CDR is '11'. Further, in case of performing the frame rate control and dithering by taking a unit frame inclusive of 4 frames as a frame rate control unit and by taking a unit window inclusive of 4 pixels as a dithering unit, if the R compensation data CDR of '01' are supplied thereto, the compensation value judging part 193 generates '1' as the FRC/dithering data FDD at one pixel location within the unit window for 4 frame periods and generates '0' as the FRC/dithering data FDD at the remaining 3 pixel locations, but changes the location of the pixel, where '1' is generated, for each frame, as in (a) of FIG. 22. At this moment, the compensation value judging part 193 can determine a plurality of dither patterns which each differently indicate the pixel location, to which the R compensation data CDR are to be dispersed within the unit window, and a plurality of FRC patterns of which each differently indicate the frame, to which the R compensation data CDR are to be dispersed.

The frame number sensing part 191 senses the number of frames in use of any one of a vertical/horizontal synchronization signal Vsync, Hsync, a dot clock DCLK and a data enable signal DE. For example, the frame number sensing part 191 can sense the number of frames by counting the vertical synchronization signal Vsync.

The pixel location sensing part 192 senses the pixel location in use of at least one of a vertical/horizontal synchronization signal Vsync, Hsync, a dot clock DCLK and a data enable signal DE. For example, the pixel location sensing part 192 can sense the pixel location by counting the horizontal synchronization signal Hsync and the dot clock DCLK.

The operator 194 increases or decreases the R input data Ri with the FRC/dithering data FDD, thereby generating the corrected R data Rc.

On the other hand, the R input data Ri to be corrected and the R compensation data CDR might be respectively supplied through different data transmission lines to the first FRC/dithering controller 185R, or the R input data Ri to be corrected and the R compensation data CDR are combined to be supplied through the same line to the first FRC/dithering controller 185R. For example, in case that the R input data Ri to be corrected is '01000000' being 8 bits and the R compensation data CDR is '011' being 3 bits, '01000000' and '011' can be supplied to the first FRC/dithering controller 185R through different data transmission lines respectively or can be combined to 11 bit data of '01000000011' to be supplied to the first FRC/dithering controller 185R. In this way, in case that the R input data Ri to be corrected and the R compensation data CDR are combined to the 11 bit data and are supplied to the first FRC/dithering controller 185R, the first FRC/dithering controller 185R perceives the upper 8 bits out of the 11 bit data as the R input data Ri to be corrected, and perceives the lower 3 bits as the R compensation data CDR, thereby performing the FRC and dithering control. On the other hand, as an example of the method of generating the data of '01000000011' made by combining '01000000' and '011', a dummy bit '000' is appended to the lowest bit of the '01000000' to be changed into '01000000000', and '011' is added thereto to generate the data of '01000000011'.

The second and third FRC/dithering controllers 185G, 185B substantially have the same circuit configuration as the first FRC/dithering controller 185R. Accordingly, a detail explanation for the second and third FRC/dithering controllers 185G, 185B will be omitted.

As described above, in the compensation part 121 according to the fifth embodiment of the present invention, assuming that the R, G, B data are each 8 bits, and 4 frames are configured to be a unit frame of the frame rate control and 4 pixels are configured to be a unit window for dithering to temporally and spatially disperse the compensation value, the data to be displayed in the panel defect area can minutely adjusted with the compensation value which is subdivided into 1021 gray levels for each of R, G, B without flickers or resolution deterioration.

The data Rc/Gc/Bc corrected by the foregoing compensation part 121 are supplied to the liquid crystal display panel 103 through the timing controller 104 and the data drive circuit 101, thereby displaying a picture of which the picture quality is corrected.

On the other hand, the flat panel display device and the picture quality controlling method according to the foregoing embodiments of the present invention has been explained centering on the liquid crystal display device, but can also be applied to other flat panel display devices such as an active matrix organic light emitting diode OLED in the similar way.

As described above, the flat panel display device and the picture quality controlling method according to the present invention makes a natural-like picture quality compensation possible by performing an electrical compensation for the panel defect area of the display panel and the electrical compensation for the boundary part of the panel defect area and the non-defect area, and can clearly reduce the extent of perceiving the defect pixel by performing the electrical compensation for the link pixel formed by the repair process that links the defect pixel and the normal pixel, thus there is an advantage in that the panel defect can be perfectly compensated.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A flat panel display device, comprising:
a display panel which has a non-defect area and a panel defect area and has at least one link pixel where adjacent pixels are interlinked;
a memory which stores a first compensation data for compensating data to be displayed on odd-numbered lines in the panel defect area, a second compensation data for compensating data to be displayed on even-numbered lines in the panel defect area, a third compensation data for compensating data to be displayed on odd-numbered lines included in a boundary part between the panel defect area and the non-defect area, a fourth compensation data for compensating data to be displayed on even-numbered lines of the boundary part, and a fifth compensation data for compensating data that are to be displayed in the link pixel;

a compensation part that modulates the data to be displayed in the panel defect area, a fixed area inclusive of the boundary part and the link pixel, with the compensation data; and a driver for driving the display panel in use of the data modulated by the compensation part.

2. The flat panel display device according to claim 1, wherein the third compensation data are determined to be different compensation values from each other between adjacent pixels, the fourth compensation data are determined to be different compensation values from each other between adjacent pixels, and the third and fourth compensation data are determined to be different from each other between the adjacent pixels in a direction perpendicular to the odd-numbered and even-numbered lines.

3. The flat panel display device according to claim 2, wherein the boundary part includes a first boundary part formed at the end of one side of the panel defect area and a second boundary part formed at the end of the other side of the panel defect area; and the third and fourth compensation data are applied to pixels which include pixels arranged along the boundary part and which are arranged within ½ of a distance from the first boundary part to the second boundary part.

4. The flat panel display device according to claim 2, wherein the third and fourth compensation data are determined to be compensation values which decrease the edge brightness of the panel defect area included in the boundary part and increase the edge brightness of the non-defect area included in the boundary part.

5. The flat panel display device according to claim 2, wherein the third and fourth compensation data are determined to be compensation values which increase the edge brightness of the panel defect area included in the boundary part and decrease the edge brightness of the non-defect area included in the boundary part.

6. The flat panel display device according to claim 2, wherein the compensation values of the third and fourth compensation data become smaller as it goes away from the boundary part.

7. The flat panel display device according to claim 1, wherein the compensation values of the first to fifth compensation data are summed up at a location where the panel defect area, the boundary part and the link pixel are overlapped.

8. The flat panel display device according to claim 1, wherein the compensation values of the third and fourth compensation data are smaller than the compensation values of the first and second compensation data in a location where the panel defect area and the boundary part are overlapped.

9. The flat panel display device according to claim 1, wherein the compensation values of the first to fourth compensation data are smaller than the compensation value of the fifth compensation data in a location where the panel defect area, the boundary part and the link pixel are overlapped.

10. The flat panel display device according to claim 1, wherein the first and second compensation data are different in accordance with a gray level value of the data which are to be displayed in the panel defect area and the location of the panel defect area.

11. The flat panel display device according to claim 1, wherein the third and fourth compensation data are different in accordance with a gray level value of the data to be displayed in the boundary part area and the pixel location within the boundary part.

12. The flat panel display device according to claim 1, wherein the fifth compensation data are different in accordance with a gray level of the data to be displayed in the link pixel and the location of the link pixel.

13. The flat panel display device according to claim 1, wherein the compensation part increases or decreases the data to be displayed in the panel defect area, the boundary part and the link pixel, with the compensation data.

14. The flat panel display device according to claim 1, wherein the compensation part extracts n (n is an integer greater than m) bits brightness information and chromaticity information in m (m is a positive integer) bits red data, green data and blue data to be displayed in the panel defect area, the boundary part and the link pixel; generates the n bits modulated brightness information by increasing or decreasing the n bits brightness information with the compensation data; and generates the m bits modulated red data, green data and blue data in use of the n bits modulated brightness information and the unmodulated chromaticity information.

15. The flat panel display device according to claim 1, wherein the compensation part disperses the compensation data by the unit of frame periods; and increases or decreases the data to be supplied to the panel defect area, the fixed area inclusive of the boundary part, and the link pixel, with the dispersed compensation data.

16. The flat panel display device according to claim 1, wherein the compensation part disperses the compensation data to pixels within a dither pattern; and increases or decreases the data to be supplied to the panel defect area, the fixed area inclusive of the boundary part, and the link pixel, with the dispersed compensation data.

17. The flat panel display device according to claim 1, wherein the compensation part disperses dither patterns to a plurality of frame periods as well as disperse the compensation data to pixels within the dither pattern; and increases or decreases the data to be supplied to the panel defect area, a boundary area inclusive of the boundary, and the link pixel, with the dispersed compensation data.

18. The flat panel display device according to claim 17, wherein compensation values of the dither patterns are different from each other; and each of the dither patterns has a plurality of sub-dither patterns of which the compensation values are identical and where the locations of compensation pixels are different from each other.

19. The flat panel display device according to claim 17, wherein assuming that the compensation value is 'I' (I is a positive real number) and the number of sub-dither patterns is 'J' (J is a positive integer), the dither pattern of which the compensation value is 'I' has 'J' number of sub-dither patterns of which the compensation value is 'I' and where the locations of the compensation pixels are different from each other, and the arrangement of the sub-dither patterns is different in each of 'J' number of frames.

20. The flat panel display device according to claim 19, wherein the arrangement of the sub-dither patterns of the dither pattern is identical by the unit of J+1 number of frame periods.

21. The flat panel display device according to claim 17, wherein each of the dither pattern has a size of 8(pixels)×32 (pixels) or more.

22. A picture quality controlling method of a flat panel display device, comprising:

a step of determining a first compensation data for compensating data to be displayed on odd-numbered lines in the panel defect area, a second compensation data for compensating data to be displayed on even-numbered lines in the panel defect area, a third compensation data for compensating data that are to be displayed on odd-numbered lines included in a boundary part between the panel defect area and a non-defect area of a display panel, a fourth compensation data for compensating data to be displayed on even-numbered lines included in the boundary part, and a fifth compensation data for compensating data that are to be displayed in a link pixel where adjacent pixels are interlinked in the display panel, by an inspection process and a repair process of the display panel;

a step of storing the compensation data at a memory;

a compensation step of modulating the data to be displayed in the panel defect area, a fixed area inclusive of the boundary and the link pixel, with the compensation data stored on the memory; and a step of driving the display panel in use of the data modulated by the compensation step.

23. The picture quality controlling method according to claim 22, wherein the third compensation data are determined to be compensation values different from each other between adjacent pixels in the odd-numbered lines, the fourth compensation data are determined to be different compensation values from each other between adjacent pixels in the even-numbered lines, and the third and fourth compensation data are determined to be different from each other between the adjacent pixels in a direction perpendicular to the odd-numbered and even-numbered lines.

24. The picture quality controlling method according to claim 23, wherein the boundary part includes a first boundary part formed at the end of one side of the panel defect area and a second boundary part formed at the end of the other side of the panel defect area; and the third and fourth compensation data are applied to pixels which are arranged in the first and second boundary parts and within ½ of a distance from the first boundary part to the second boundary part.

25. The picture quality controlling method according to claim 24, wherein the third and fourth compensation data are determined to be compensation values which decrease the edge brightness of the panel defect area included in the boundary part and increase the edge brightness of the non-defect area included in the boundary part.

26. The picture quality controlling method according to claim 24, wherein the third and fourth compensation data are determined to be compensation values which increases the edge brightness of the panel defect area included in the boundary part and decrease the edge brightness of the non-defect area included in the boundary part.

27. The picture quality controlling method according to claim 24, wherein the third and fourth compensation data are determined to be compensation values which decrease as it goes away from the boundary.

28. The picture quality controlling method according to claim 27, wherein the compensation step includes the steps of:

calculating n (n is an integer greater than m) bits brightness information and chromaticity information in m (m is a positive integer) bits red data, green data and blue data to be displayed in the panel defect area, the boundary part and the link pixel;

generating the n bits modulated brightness information by adjusting the n bits brightness information with the compensation data; and generating the m bits modulated red data, green data and blue data in use of the n bits modulated brightness information and the unmodulated chromaticity information.

29. The picture quality controlling method according to claim 22, wherein the first to fifth compensation data are summed up at a location where any one of the panel defect area, the boundary part and the link pixel are overlapped.

30. The picture quality controlling method according to claim 22, wherein the third and fourth compensation data are determined to be compensation values which are smaller in a brightness compensation extent than the first and second compensation data in a location where the panel defect area and the boundary part are overlapped.

31. The picture quality controlling method according to claim 22, wherein the first to fourth compensation data are determined to be compensation values which are smaller in a brightness compensation extent than the fifth compensation data in a location where the panel defect area, the boundary part and the link pixel are overlapped.

32. The picture quality controlling method according to claim 22, wherein the first and second compensation data are different in accordance with a gray level of the data which are to be displayed in the panel defect area and a display location of the panel defect area.

33. The picture quality controlling method according to claim 22, wherein the third and fourth compensation data are different in accordance with a gray level of the data which are to be displayed in the boundary part and a display location of the boundary part.

34. The picture quality controlling method according to claim 22, wherein the fifth compensation data are determined to be different in accordance with a gray level of the data which are to be displayed in the link pixel and the location of the link pixel.

35. The picture quality controlling method according to claim 22, wherein the compensation step modulates the data to be displayed in the panel defect area, the boundary part and the link pixel, with the compensation data.

36. The picture quality controlling method according to claim 22, wherein the compensation step includes the steps of:

dispersing the compensation data by the unit of frame periods; and increasing or decreasing the data to be displayed in the panel defect area, the boundary part and the link pixel, with the dispersed compensation data.

37. The picture quality controlling method according to claim 22, wherein the compensation step includes the steps of:

dispersing the compensation data to pixels within a dither pattern; and increasing or decreasing the data to be displayed in the panel defect area, the boundary part and the link pixel, with the dispersed compensation data.

38. The picture quality controlling method according to claim 22, wherein the compensation step includes the steps of:

dispersing dither patterns to a plurality of frame periods as well as dispersing the compensation data to pixels within the dither pattern; and increasing or decreasing the data to be supplied to the panel defect area, the boundary part and the link pixel, with the compensation data.

39. The picture quality controlling method according to claim 38, wherein compensation values of the dither patterns are different from each other; and each of the dither patterns has a plurality of sub-dither patterns of which the compensation values are identical and where the locations of compensation pixels are different from each other.

40. The picture quality controlling method according to claim 39, wherein assuming that the compensation value is 'I' (I is a positive real number) and the number of sub-dither patterns is 'J' (J is a positive integer), the dither pattern of which the compensation value is 'I' has 'J' number of sub-dither patterns of which the compensation value is 'I' and where the locations of the compensation pixels are different from each other, and the arrangement of the sub-dither patterns is different in each of 'J' number of frames.

41. The picture quality controlling method according to claim 40, wherein the arrangement of the sub-dither patterns of the dither pattern is identical by the unit of J+1 number of frame periods.

42. The picture quality controlling method according to claim 39, wherein each of the dither pattern has a size of 8(pixels)×32(pixels) or more.

* * * * *